(12) United States Patent
Hikime et al.

(10) Patent No.: US 9,960,356 B2
(45) Date of Patent: May 1, 2018

(54) ORGANIC ELECTROLUMINESCENCE DEVICE, LIGHTING EQUIPMENT AND DISPLAY DEVICE

(71) Applicant: Konica Minolta, Inc., Tokyo (JP)

(72) Inventors: Mayuka Hikime, Hino (JP); Osamu Ishige, Kawasaki (JP); Tomohiro Oshiyama, Hachioji (JP); Rie Katakura, Hino (JP)

(73) Assignee: KONICA MINOLTA, INC., Tokyo (JP)

( * ) Notice: Subject to any disclaimer, the term of this patent is extended or adjusted under 35 U.S.C. 154(b) by 502 days.

(21) Appl. No.: 13/899,029

(22) Filed: May 21, 2013

(65) Prior Publication Data
US 2013/0341602 A1  Dec. 26, 2013

(30) Foreign Application Priority Data

May 21, 2012 (JP) .................................. 2012-115971

(51) Int. Cl.
*H01L 51/50* (2006.01)
*H01L 51/00* (2006.01)
(Continued)

(52) U.S. Cl.
CPC ............ *H01L 51/005* (2013.01); *C09K 11/06* (2013.01); *H01L 51/0072* (2013.01);
(Continued)

(58) Field of Classification Search
None
See application file for complete search history.

(56) References Cited

U.S. PATENT DOCUMENTS 6,097,147 A  8/2000  Baldo et al.
2006/0251923 A1* 11/2006 Lin .................... C07F 15/0046
428/690
(Continued)

FOREIGN PATENT DOCUMENTS

JP  2005-112765 A  4/2005
JP  2009114369 A  5/2009
(Continued)

OTHER PUBLICATIONS

Baldo et al., "High-efficiency fluorescent organic light-emitting devices using a phosphorescent sensitizer" Letter to Nature vol. 403, Feb. 17, 2000; 3 pages.
(Continued)

*Primary Examiner* — Gregory D Clark
(74) *Attorney, Agent, or Firm* — Cantor Colburn LLP

(57) ABSTRACT

Provided are an organic electroluminescence device which has a high luminous efficiency, a low operating voltage and a long life and which is low in a voltage rise in operation and excellent in an ageing stability and has an aptitude in production by the wet process, and a lighting equipment and a display device which are prepared by using the same.
The above organic electroluminescence device is constituted from organic layers including at least a light-emitting layer which are interposed between an anode and a cathode, wherein at least one layer of the above organic layers contains a blue phosphorescent organic metal complex having a structure represented by the following Formula (1) and a compound represented by the following Formula (H1):
(Continued)

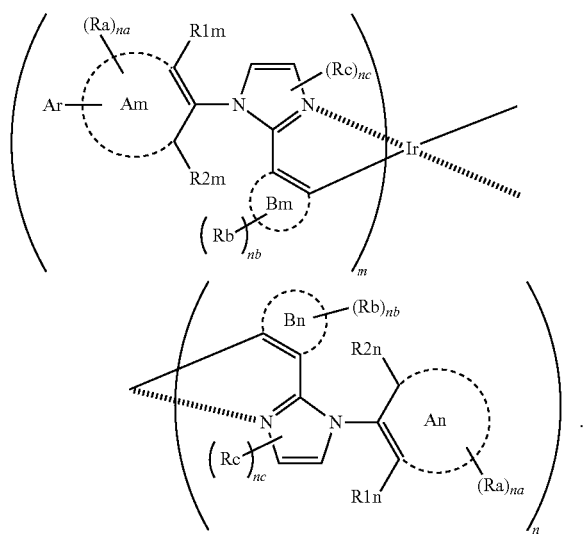

Formula (1)

(2013.01); *C09K 2211/185* (2013.01); *H01L 51/006* (2013.01); *H01L 51/007* (2013.01); *H01L 51/008* (2013.01); *H01L 51/0035* (2013.01); *H01L 51/0037* (2013.01); *H01L 51/0039* (2013.01); *H01L 51/0043* (2013.01); *H01L 51/0059* (2013.01); *H01L 51/0069* (2013.01); *H01L 51/0081* (2013.01); *H01L 51/0091* (2013.01); *H01L 51/0094* (2013.01)

(56) References Cited

U.S. PATENT DOCUMENTS

| 2007/0088167 | A1* | 4/2007 | Lin et al. ............ 548/103 |
| 2010/0045172 | A1 | 2/2010 | Hiyama et al. |
| 2011/0057559 | A1 | 3/2011 | Xia et al. |
| 2011/0272687 | A1 | 11/2011 | Katakura et al. |
| 2012/0086329 | A1 | 4/2012 | Dyatkin |
| 2013/0011951 | A1 | 1/2013 | Ishidai et al. |
| 2013/0099216 | A1 | 4/2013 | Ikemizu et al. |
| 2014/0339529 | A1* | 11/2014 | Tani ............ H01L 51/0072 257/40 |

FOREIGN PATENT DOCUMENTS

| JP | 2011060878 A | 3/2011 | |
| WO | WO 2009/060757 | * 5/2009 | ............ H01L 51/50 |
| WO | 2011114870 A1 | 9/2011 | |
| WO | 2011158544 A1 | 12/2011 | |

OTHER PUBLICATIONS

Lamansky et al., "Highly Phosphorescent Bis-Cyclometalated Iridium Complexes: Synthesis, Photophysical Characterization, and Use in Organic Light Emitting Diodes" J. Am. Chem. Soc. 2001, 123, 4304-4312; 9 pages.

Baldo et al., "Highly efficient phosphorescent emission from organic electroluminescent devices", Letters to Nature vol. 395, Sep. 10, 1998; 4 pages.

Extended European Search Report corresponding to Application No. 13168185.0-1355; dated Nov. 11, 2013, with English translation.

Japanese Notice of Reasons for Rejection corresponding to Application No. 2012-115971; dated Sep. 1, 2015, with English translation.

\* cited by examiner

26 Claims, 5 Drawing Sheets

(51) Int. Cl.
*C09K 11/06* (2006.01)
*H05B 33/18* (2006.01)
*H05B 33/20* (2006.01)

(52) U.S. Cl.
CPC ...... *H01L 51/0073* (2013.01); *H01L 51/0074* (2013.01); *H01L 51/0085* (2013.01); *H01L 51/5016* (2013.01); *H05B 33/18* (2013.01); *H05B 33/20* (2013.01); *C09K 2211/1029* (2013.01); *C09K 2211/1033* (2013.01); *C09K 2211/1037* (2013.01); *C09K 2211/1044* (2013.01); *C09K 2211/1088* (2013.01); *C09K 2211/1092* (2013.01); *C09K 2211/1096*

LIGHT

LIGHT

ORGANIC ELECTROLUMINESCENCE DEVICE, LIGHTING EQUIPMENT AND DISPLAY DEVICE

CROSS REFERENCE TO RELATED APPLICATIONS

The present invention claims priority under 35 U.S.C. § 119 to Japanese Application No. 2012-115971 filed May 21, 2012, the entire content of which is incorporated herein by reference.

BACKGROUND OF THE INVENTION

1. Field of the Invention

The present invention relates to an organic electroluminescence device (hereinafter referred to as an organic EL device) and a lighting equipment and a display device which are prepared by using the same.

2. Description of the Related Art

An organic electroluminescence device (hereinafter referred to as an organic EL device) is a light-emitting device having a constitution in which a light-emitting layer containing a luminescent compound is interposed between a cathode and an anode, wherein a hole injected from an anode and an electron injected from a cathode are recombined in the light-emitting layer by applying an electric field, whereby an exciton is formed, and light (fluorescence and phosphorescence) discharged when the above exciton is deactivated is used. Also, an organic EL device is a solid state device in which a space between electrodes is constituted by a film of an organic material having a thickness of only submicron and can emit light at a voltage of several voltages to several ten voltages, and therefore it is expected to be used for flat display and illumination of a next generation.

An organic EL device making use of phosphorescence emitted in an excited triplet state is reported from Princeton University as the development of an organic EL device toward practical application (refer to, for example, M. A. Baldo et al., Nature, vol. 395, p. 151 to 154 (1998)), and since then, material emitting phosphorescence at room temperature have come to be actively researched (refer to, for example, U.S. Pat. No. 6,097,147 and M. A. Baldo et al., Nature, vol. 403, No. 17, p. 750 to 753 (2000)).

Further, organic EL devices operated by making use of phosphorescence emission make it possible to achieve a luminous efficiency which is larger in principle by about four times than those of conventional organic EL devices operated by making use of fluorescence emission, and therefore a layer structure of a light emitting device and electrodes including the development of the materials for the above organic EL devices have been researched and developed all over the world. For example, many compounds including principally heavy metal complexes such as iridium complexes and the like have been synthesized and investigated (refer to, for example, S. Lamansky et al., J. Am. Chem. Soc., vol. 123, p. 4304 (2001)).

As described above, a phosphorescence emitting system has a very high potential, but a method for controlling a position of an emission center, especially recombining a hole and an electron in an inside of a light-emitting layer to stabilize emission is an important technical problem in terms of enhancing an efficiency and a life of the device.

In recent years, known well are devices of a multilayer lamination type comprising a hole-transporting layer positioned at an anode side of a light-emitting layer so that it is adjacent to the light-emitting layer and an electron-transporting layer positioned at a cathode side of the light-emitting layer (refer to, for example, JP-A 2005-112765). Also, a mixed layer formed by using a host compound and a phosphorescent compound as a dopant is used in a light-emitting layer in many cases.

On the other hand, materials which have a high carrier-transporting property and are thermally and electrically stable are desired from the viewpoint of the suited materials. Particularly in making use of blue phosphorescence emission, a blue phosphorescent compound itself has a high triplet excitation energy (T1), and therefore it is strongly desired to develop applicable peripheral materials and precisely control an emission center.

FIrpi is known as a typical blue phosphorescent compound, and it is shortened in a wavelength by substituting phenylpyridine of a principal ligand with fluorine and using picolinic acid as a subsidiary ligand. The above dopants provide highly efficient devices by combining carbazole derivatives and triarylsilanes as host compounds, but an emission life of the devices is deteriorated to a large extent, and therefore a trade-off thereof is required to be improved.

In recent years, metal complexes having specific ligands are disclosed as blue phosphorescent compounds having a high potentiality in U.S. Patent Publication No. 2011/0057559. Further, dibenzofuran and dibenzothiophene derivatives are proposed as host compounds used together with blue phosphorescent compounds in U.S. Patent Publication No. 2011/0057559. Organic EL devices obtained by using the host compounds described in U.S. Patent Publication No. 2011/0057559 are improved in a luminous efficiency and an emission life, but they are not yet satisfactory in terms of an operating voltage (reducing an operating voltage or decreasing a rise in a voltage in operation). Also, the luminous efficiency and the emission life have to be further improved.

An ageing stability is required to organic EL devices from the viewpoint of application to display and illumination.

For example, it is described in U.S. Patent Publication No. 2011/0057559 that anions or anion radicals are improved in a stability by using specific dibenzofuran and dibenzothiophene in combination with blue phosphorescent compounds and that the devices are improved in a life and a stability. In a light-emitting layer of an organic electroluminescence device comprising a dopant and a host compound, the luminous dopant is uniformly dispersed preferably in the host compound due to the problems of a transporting property of the carrier, concentration quenching caused by aggregation of the luminous dopant and quenching brought about by an interaction between the excitons. However, the states of the dopant and the host compound are changed in the light-emitting layer, for example, when the devices are caused to emit light for a long time or left standing under high temperature and high humidity, and as a result thereof, the device is likely to bring about such a degradation in performances as a rise in an operating voltage and a reduction in a luminous brightness. The viewpoint of the stability against such a change with the passage of time as described above is not described in U.S. Patent Publication No. 2011/0057559, and it has come to be apparent that the devices are insufficiently researched and have to be improved further more.

On the other hand, a wet method (called as well a wet process) is expected to a large extent due to requirements to the large area, the low production cost and the high productivity. Since a film can be formed at a lower temperature in the wet process than in forming a film by a vacuum process, the organic layer of a lower layer can be reduced in damage, and the wet process is expected to a large extent from the viewpoint of improving the luminous efficiency and the device life.

However, in organic EL devices operated by making use of blue phosphorescence, particularly a film-forming property of a host material contained in a light-emitting layer and an electron-transporting material laminated on a light-emitting layer, a solubility thereof in a solvent used for coating them, and the like are problems for preparing the devices by the wet process. Accordingly, host materials and electron-transporting materials which are known at present are still unsatisfactory in terms of a solubility in a solvent, a solution stability, an operating voltage and the like from the viewpoint of practical use, and it has come to become clear that further improved technologies are indispensable.

As described above, various compounds have so far been disclosed for organic EL device materials, and organic EL devices which provide a low operating voltage and a high luminous efficiency and which are excellent in a durability (life) and can be reduced in a voltage rise in operation are tried to be developed. However, organic EL devices in which the above performances are further more improved than ever are desired to be developed. Further, organic EL devices which are excellent as well in an ageing stability are desired to be developed. Also, organic EL device materials having an aptitude in production by the wet process are desired to be developed, and organic EL devices prepared by the above organic EL device materials are desired to be developed.

SUMMARY OF THE INVENTION

The present invention has been made in light of the situations described above, and an object thereof is to provide an organic electroluminescence device which has a high luminous efficiency, a low operating voltage and a long life and which is low in a voltage rise in operation and excellent in an ageing stability, and a lighting equipment and a display device which are prepared by using the same.

Also, an object thereof is to provide an organic electroluminescence device prepared by using an organic EL device material having an aptitude in production by the wet process, and a lighting equipment and a display device which are prepared by using the same.

To achieve at least one of the above-mentioned objects, an organic electroluminescence device reflecting one aspect of the present invention comprises:

1. An organic electroluminescence device in which organic layers including at least a light-emitting layer are interposed between an anode and a cathode, wherein at least one layer of the above organic layers contains a blue phosphorescent organic metal complex having a structure represented by the following Formula (1) and a compound represented by the following Formula (H1):

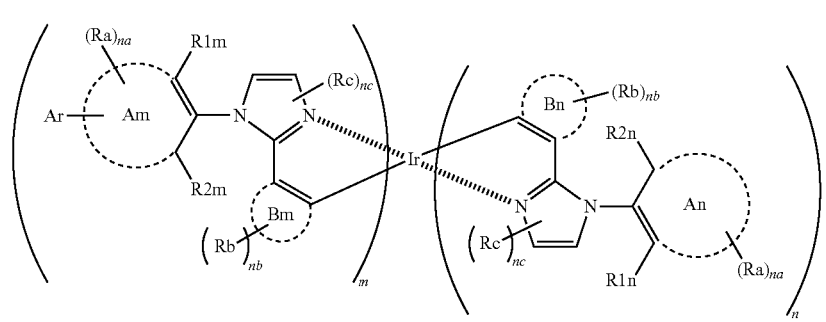

Formula (1)

[wherein a ring Am, a ring An, a ring Bm and a ring Bn represent a five-membered or six-membered aromatic hydrocarbon ring or aromatic heterocycle; Ar represents an aromatic hydrocarbon ring, an aromatic heterocycle, a non-aromatic hydrocarbon ring or a non-aromatic heterocycle; R1m, R2m, R1n and R2n each represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4; m represents an integer of 1 to 3, and n represents an integer of 0 to 2; and m+n is 3];

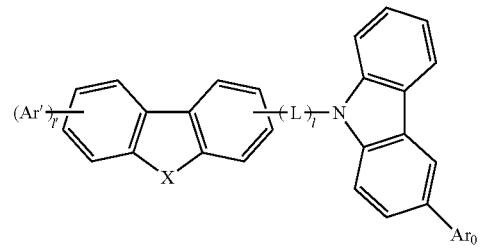

Formula (H1)

[wherein X represents an oxygen atom or a sulfur atom; L represents a single bond or a linkage group derived from an aromatic hydrocarbon ring or an aromatic heterocycle; Aro and Ar' each represent independently an aromatic hydrocarbon ring or an aromatic heterocycle; l represents an integer of 0 to 3, and l' represents an integer of 0 to 4].

2. The organic electroluminescence device as described in the above aspect 1, wherein in Formula (H1), l is 0.

3. The organic electroluminescence device as described in the above aspect 2, wherein Formula (H1) is represented by the following Formula (H2):

Formula (H2)

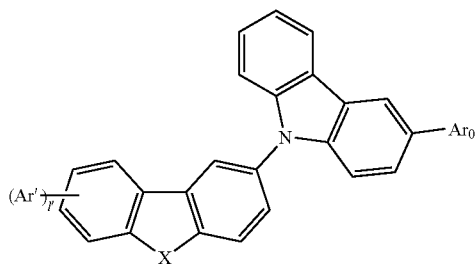

[wherein X represents an oxygen atom or a sulfur atom; Aro and Ar' each represent independently an aromatic hydrocarbon ring or an aromatic heterocycle; and l' represents an integer of 0 to 4].

4. The organic electroluminescence device as described in the above aspect 3, wherein in Formula (H2), l' is 1.

5. The organic electroluminescence device as described in the above aspect 4, wherein Formula (H2) is represented by the following Formula (H3):

Formula (H3)

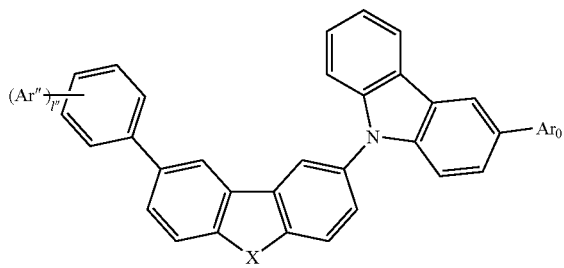

[wherein X represents an oxygen atom or a sulfur atom; Aro and Ar" each represent independently an aromatic hydrocarbon ring or an aromatic heterocycle; and l" represents an integer of 0 to 5].

6. The organic electroluminescence device as described in the above aspect 4, wherein Formula (H2) is represented by the following Formula (H4):

Formula (H4)

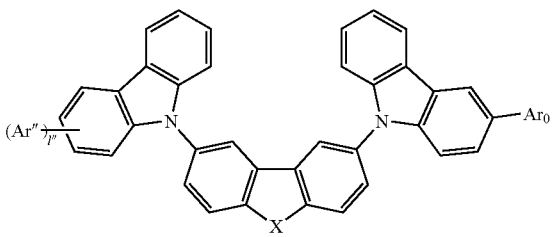

[wherein X represents an oxygen atom or a sulfur atom; Aro and Ar" each represent independently an aromatic hydrocarbon ring or an aromatic heterocycle; and l" represents an integer of 0 to 4].

7. The organic electroluminescence device as described in the above aspect 1, wherein all of R1m, R2m, R1n and 2n are an alkyl group or a cycloalkyl group having 2 or more carbon atoms.

8. The organic electroluminescence device as described in the above aspect 1, wherein all of R1m, R2m, R1n and 2n are a branched alkyl group having 3 or more carbon atoms.

9. The organic electroluminescence device as described in the above aspect 1, wherein in Formula (1), m is 2, and n is 1.

10. The organic electroluminescence device as described in the above aspect 1, wherein in Formula (1), m is 1, and n is 2.

11. The organic electroluminescence device as described in the above aspect 1, wherein the ring Bm and the ring Bn in Formula (1) are a benzene ring.

12. The organic electroluminescence device as described in the above aspect 1, wherein Ar in Formula (1) is a benzene ring.

13. The organic electroluminescence device as described in the above aspect 1, wherein Formula (1) is represented by the following Formula (2):

Formula (2)

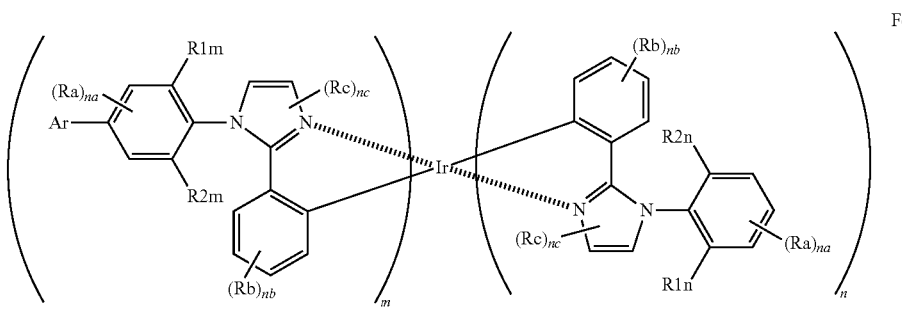

[wherein Ar represents an aromatic hydrocarbon ring, an aromatic heterocycle, a non-aromatic hydrocarbon ring or a non-aromatic heterocycle; R1m, R2m, R1n and R2n each represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4; m represents an integer of 1 to 3, and n represents an integer of 0 to 2; and m+n is 3].

14. The organic electroluminescence device as described in the above aspect 1, wherein a luminescent color is white.

15. A lighting equipment comprising the organic electroluminescence device as described in the above aspect 1.

16. A display device comprising the organic electroluminescence device as described in the above aspect 1.

BRIEF DESCRIPTION OF THE DRAWINGS

FIGS. 4A-4C are schematic drawings of a full color display device of a passive matrix system, wherein FIG. 4A shows canning lines; FIG. 4B shows pixels; and FIG. 4c shows image data lines.

EXPLANATIONS OF THE CODES

Figure 1:
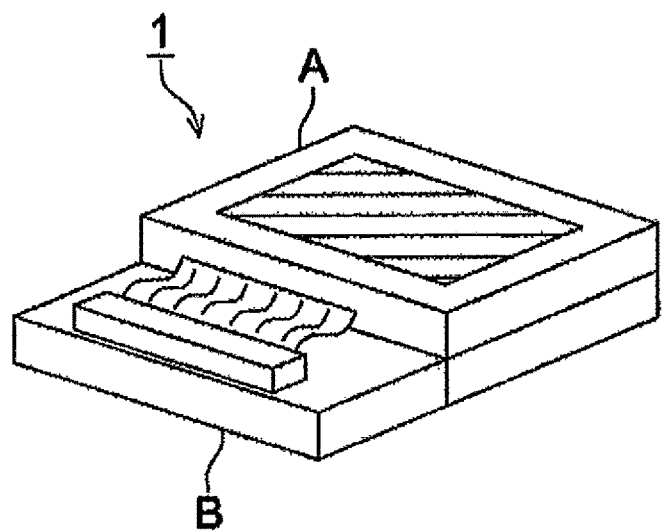
FIG. 1 is a schematic drawing showing one example of a display device constituted from an organic EL device.

1 Display
3 Pixel
5 Scanning line
6 Data line
7 Power source line
10 Organic EL device
11 Switching transistor
12 Operating transistor
13 Capacitor
101 Organic EL device
102 Glass cover
105 Cathode
106 Organic EL layer
107 Glass substrate equipped with transparent electrode
108 Nitrogen gas
109 Moisture scavenger
201 Glass substrate
202 ITO transparent electrode
203 Partition
204 Hole-injecting layer
205B, 205G, 205R Light-emitting layers
206 Cathode
A Display part
B Controlling part

DETAILED DESCRIPTION OF THE INVENTION

Embodiments for carrying out the present invention shall be explained below in detail, but the present invention shall not be restricted to them.
«Organic EL Device (Organic Electroluminescence Device)»

The organic EL device of the present invention shall be explained.

The organic EL device of the present invention is characterized by an organic electroluminescence device in which organic layers including at least a light-emitting layer are interposed between an anode and a cathode, wherein at least one layer of the above organic layers contains a blue phosphorescent organic metal complex having a structure represented by Formula (1) and a compound represented by Formula (H1). Formula (1) and Formula (H1) are described later.

First, a background and a history through which the above organic EL device has come to be invented and a characteristic thereof shall be explained, and then the organic EL device of the present invention shall be explained in detail.

Intense researches repeated by the present inventors in order to achieve the purposes described above have resulted in finding that combined use of the metal complex dopant represented by Formula (1) and the host compound having the specific structure represented by Formula (H1) makes it possible to achieve a high luminous brightness, a low operating voltage, an inhibition of a voltage rise in operation and an elongation of an emission life at the same time. Thus, they have come to achieve the present invention. Further, it has been found that the organic EL device improved as well in an ageing stability is obtained by using the dopant and the host compound in combination according to the present invention.

As described in U.S. Patent Publication No. 2011/0057559, it has already been known that a metal complex having a ligand having an imidazole skeleton having a specific substituent is useful as a luminescent dopant in an organic EL device. In the present invention, it has been found that a blue phosphorescent organic EL device showing a high luminous brightness can be obtained by introducing further an aromatic ring having a specific substituent (including an aromatic hydrocarbon ring and an aromatic heterocycle) into an imidazole ring.

However, the performances thereof are unsatisfactory for solving the problems described above.

Investigations on a host compound suited to the organic metal complex provided with a ligand having the structure represented by Formula (1) have been further repeated to find that the performances of the organic EL device are improved by using a compound having a specific structure in a molecule as the host. That is, providing the host compound with the structure represented by Formula (H1) has made it possible to provide the group of compounds which have a high Tg and can provide such a satisfactory excited triplet state that a luminous efficiency of the blue phosphorescent organic metal complex is not damaged. Also, it has been found that the structure represented by Formula (H1) is readily interacted with a specific substituent on an imidazole ring of the dopant described above and that use of the above host compound allows a carrier to be transported efficiently in the light-emitting layer and makes it possible to cause a high luminous brightness and a low operating voltage of the device to be consistent with an inhibition of a voltage rise thereof in operation. Further, it has been found that the environment in the periphery of the imidazole ring of the dopant is shielded by the interaction of the host compound with the specific substituent on the imidazole ring and that the emission life is enhanced as well by an inhibition in degradation of the dopant. Further, it has been found that an influence is less liable to be exerted on the device by the factors of the environment such as a temperature and a humidity and that the device is improved as well in an ageing stability. As shown above, it has become possible to provide a host compound suited to the organic metal complex represented by Formula (1).

The compounds used in the present invention shall be explained below.

«Phosphorescent Organic Metal Complex Represented by Formula (1)»

The phosphorescent organic metal complex contained as an organic EL device material in the organic EL device of the present invention, that is, an iridium complex compound shall be explained. The phosphorescent organic metal complex (hereinafter referred to as the iridium complex compound) used in the present invention is represented by the following Formula (1)

thienothiophene ring, a carbazole ring, an azacarbazole ring (represents a ring obtained by substituting at least one of optional carbon atoms constituting a carbazole ring with a nitrogen atom), a dibenzosilole ring, a dibenzofuran ring, a dibenzothiophene ring, rings obtained by substituting at least one of optional carbon atoms constituting a benzothiophene ring and a benzofuran ring with a nitrogen atom, a benzodifuran ring, a benzodithiophene ring, an acridine ring, a benzoquinoline ring, a phenazine ring, a phenanzhridine ring, a phenanthroline ring, a cyclazine ring, a quindoline ring, a tepenidine ring, a quinindoline ring, a triphenodithiazine ring, a triphenodioxazine ring, a phenanthrazine ring, an anthrazine ring, a perimidine ring, a naphthofuran ring, a

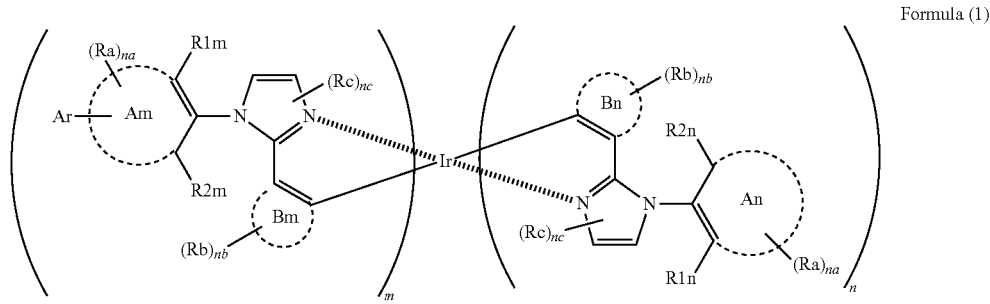

Formula (1)

In Formula (1), a ring Am, a ring An, a ring Bm and a ring Bn represent a five-membered or six-membered aromatic hydrocarbon ring or aromatic heterocycle.

In Formula (1), the five-membered or six-membered aromatic hydrocarbon ring represented by the ring Am, the ring An, the ring Bm and the ring Bn includes, for example, a benzene ring.

In Formula (1), the five-membered or six-membered aromatic heterocycle represented by the ring Am, the ring An, the ring Bm and the ring Bn includes, for example, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring and the like. At least one of the rings Bn and Bm is preferably a benzene ring, and at least one of the rings An and Am is more preferably a benzene ring.

In Formula (1), Ar represents an aromatic hydrocarbon ring, an aromatic heterocycle, a non-aromatic hydrocarbon ring or a non-aromatic heterocycle.

In Formula (1), the aromatic hydrocarbon ring represented by Ar includes, for example, a benzene ring, a biphenyl ring, a naphthalene ring, an azulene ring, an anthracene ring, a phenanthrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an athranthrene ring and the like.

In Formula (1), the aromatic heterocycle represented by Ar includes, for example, a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzthiazole ring, a benzoxazole ring, a quinoxaline ring, a quinazoline ring, a phthalazine ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxatiin ring, a dibenzocarbazole ring, an indolocarbazole ring, a dithienobenzene ring, an indoloindole ring and the like.

In Formula (1), the non-aromatic hydrocarbon ring represented by Ar includes, for example, cycloalalkanes (for example, a cyclopentane ring, a cyclohexane ring and the like), cycloalkoxy groups (for example, a cyclopentyloxy ring, a cyclohexyloxy ring and the like), cycloalkylthio groups (for example, a cyclopentylthio ring, a cyclohexylthio ring and the like), a cyclohexylaminosulfonyl group, a tetrahydronaphthalene ring, a 9,10-dihydroanthracene ring, a biphenyl ring and the like.

In Formula (1), the non-aromatic heterocycle represented by Ar includes, for example, an epoxy ring, an aziridine ring, a thiirane ring, an oxetane ring, an azetidine ring, a thietane ring, a tetrahydrofuran ring, a dioxolane ring, a pyrrolidine ring, a pyrazolidine ring, an imidazolidine ring, an oxazolidine ring, a tetrahydrothiophene ring, a sulfolane ring, a thiazolidine ring, a s-caprolactone ring, a s-caprolactam ring, a piperidine ring, a hexahydropyridazine ring, a hexahydropyrimidine ring, a piperazine ring, a morpholine ring, a tetrahydropyran ring, a 1,3-dioxane ring, a 1,4-dioxane ring, a trioxane ring, a tetrahydrothiopyran ring, a thiomorpholine ring, a thiomorpholine-1,1-dioxide ring, a pyranose ring, a diazabicyclo[2,2,2]-octane ring, a phenoxazine ring, a phenothiazine ring, an oxanthrene ring, a thioxanthene ring, a phenoxathiine ring and the like.

In Formula (1), the above rings represented by Ar may have substituents, and the above substituents themselves may be combined with each other to form rings. In Formula (1), Ar is preferably an aromatic hydrocarbon ring or an aromatic heterocycle, more preferably an aromatic hydrocarbon ring and further preferably a benzene ring.

In Formula (1), R1m and R2m each represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents.

In Formula (1), the alkyl group represented by R1m and R2m includes, for example, methyl, ethyl, trifluoromethyl, isopropyl, n-butyl, t-butyl, n-hexyl, 2-methylhexyl, pentyl, adamantyl, n-decyl, n-dodecyl and the like.

In Formula (1), the aromatic hydrocarbon ring group, the aromatic heterocyclic group, the non-aromatic hydrocarbon ring group or the non-aromatic heterocyclic group each represented by R1m and R2m include monovalent groups derived from the aromatic hydrocarbon rings, the aromatic heterocycles, the non-aromatic hydrocarbon rings or the non-aromatic heterocycles each represented by Ar in Formula (1) described above.

In Formula (1), substituents which may be further present on the alkyl groups having 2 or more carbon atoms, the aromatic hydrocarbon ring groups, the aromatic heterocyclic groups, the non-aromatic hydrocarbon ring groups or the non-aromatic heterocyclic groups each represented by R1m and R2m include, for example, halogen atoms, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group and a non-aromatic heterocyclic group and the like.

In Formula (1), both of R1m and R2m are preferably an alkyl group having 2 or more carbon atoms or a cycloalkyl group, and either of R1m and R2m is preferably as well a branched alkyl group having 3 or more carbon atoms. Also, both of R1m and R2m are further preferably a branched alkyl group having 3 or more carbon atom.

In Formula (1), R1n and R2n have the same definitions as those shown in R1m and R2m in Formula (1) described above.

In Formula (1), Ra, Rb and Rc each represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents. Ra may form a ring with Ar.

In Formula (1), the aryl group and the heteroaryl group represented by Ra, Rb and Rc include monovalent groups derived from the aromatic hydrocarbon ring and the aromatic heterocycle each represented by Ar in Formula (1) described above.

In Formula (1), the non-aromatic hydrocarbon ring group and the non-aromatic heterocyclic group each represented by Ra, Rb and Rc include monovalent groups derived from the non-aromatic hydrocarbon ring and the non-aromatic heterocycle each represented by Ar in Formula (1) described above.

In Formula (1), na and nc represent 1 or 2, and nb represents an integer of 1 to 4.

In Formula (1), m represents an integer of 1 to 3, and n represents an integer of 0 to 2; and m+n is 3.

In Formula (1), m is preferably 1 or 2, more preferably 1. Also, in Formula (1), n is preferably 1 or 2, more preferably 2.

That is, in Formula (1), preferably, m is 2, and n is 1. More preferably, m is 1, and n is 2.

«Phosphorescent Organic Metal Complex Represented by Formula (2)»

The phosphorescent organic metal complex (iridium complex compound) represented by Formula (1) described above is preferably represented by the following Formula (2):

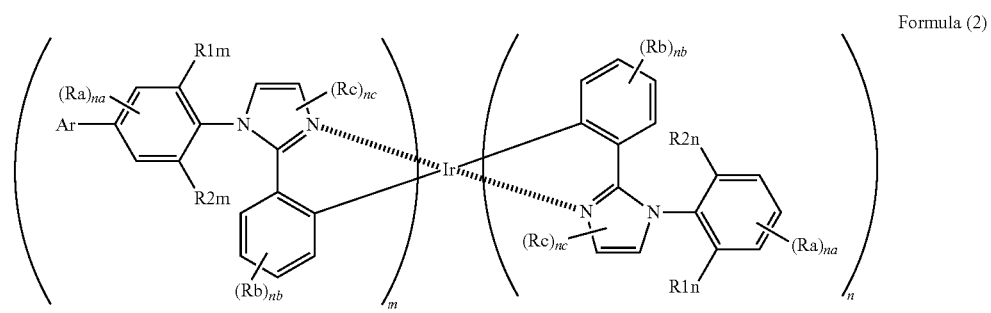

Formula (2)

In Formula (2), Ar, R1m, R2m, R1n, R2n, Ra, Rb, Rc, na, nb, nc, m and n have the same definitions as those shown in Ar, R1m, R2m, R1n, R2n, Ra, Rb, Rc, na, nb, nc, m and n in Formula (1).

Also, the iridium complex compounds represented by Formulas (1) and (2) respectively according to the present invention can be synthesized by referring to publicly known methods described in International Publication No. 2006/121811 and the like.

Specific Examples

The specific examples of the iridium complex compound represented by Formula (1) or (2) are listed below, but the present invention shall not be restricted to them.

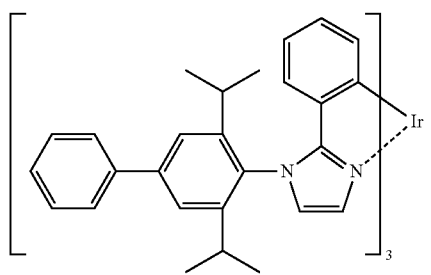
DP-1
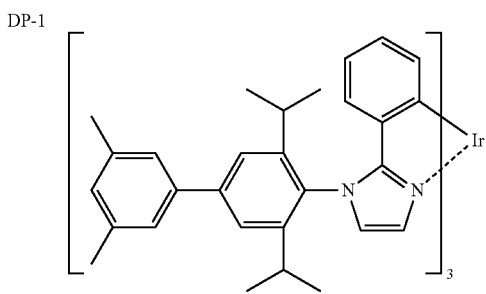
DP-2
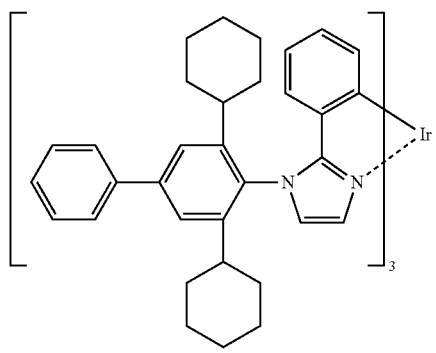
DP-3
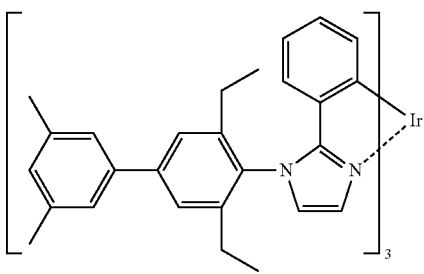
DP-4
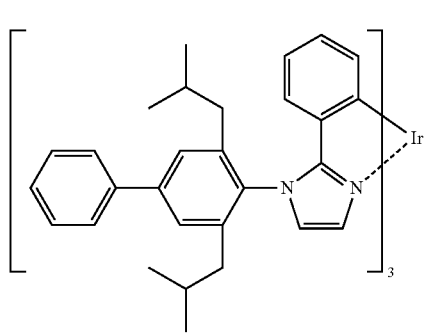
DP-5
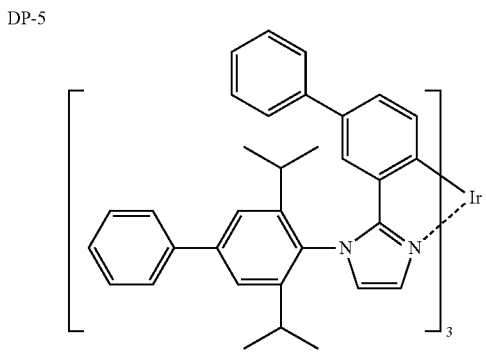
DP-6
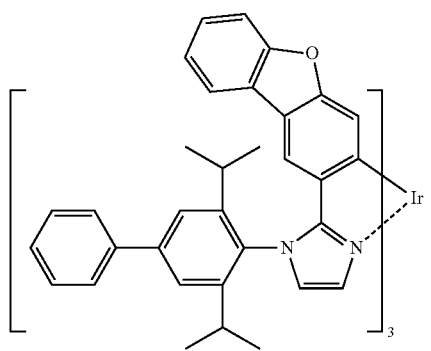
DP-7
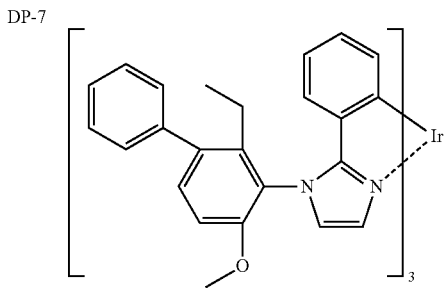
DP-8

-continued
DP-9
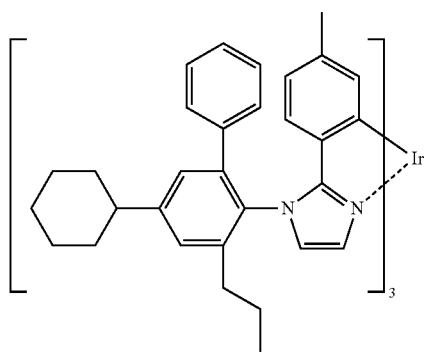
DP-10
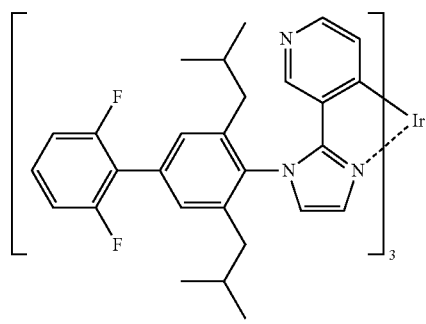
DP-11
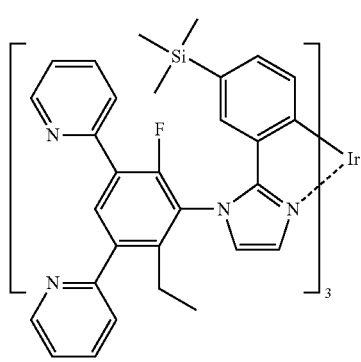
DP-12
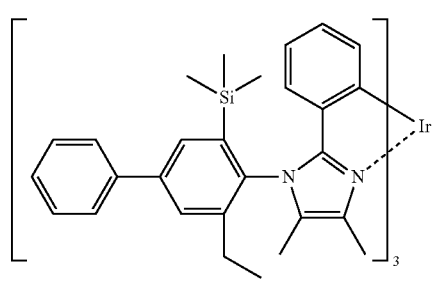
DP-13
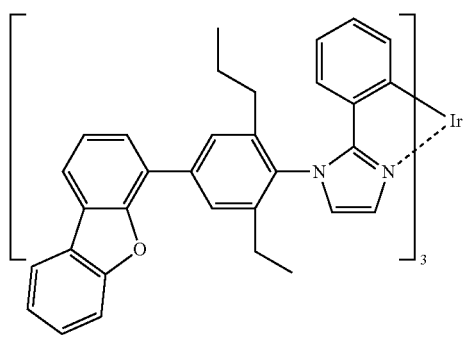
DP-14
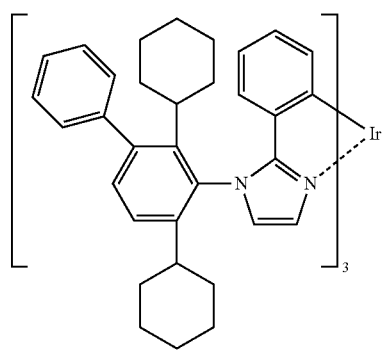
DP-15
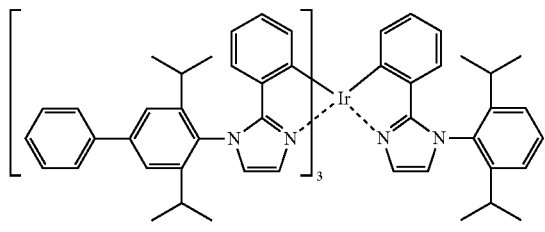
DP-16
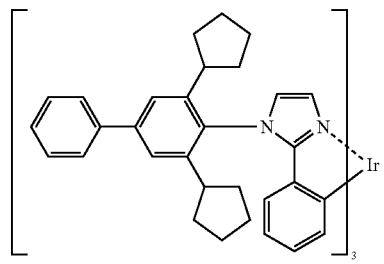

-continued
DP-17
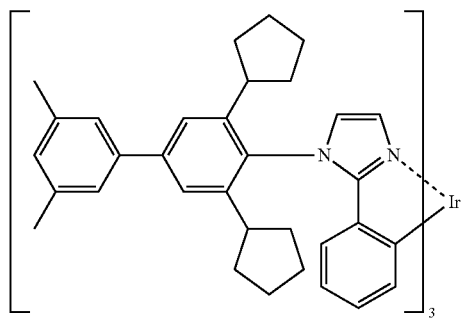
DP-18
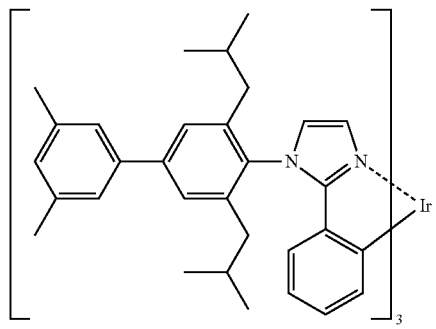
DP-19
DP-20
DP-21
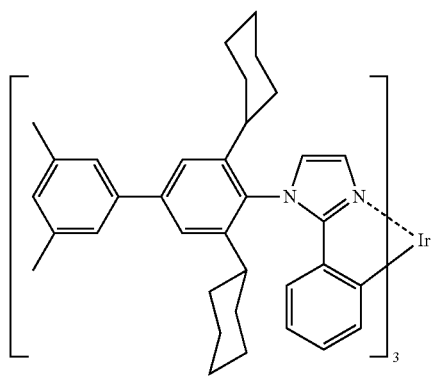
DP-22
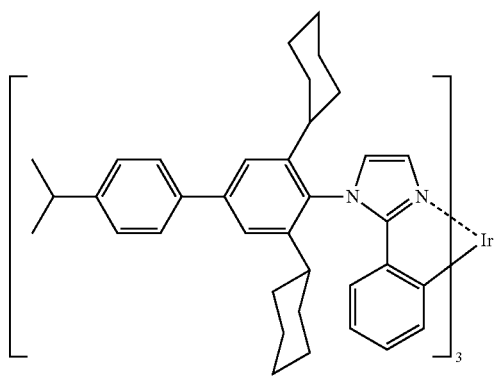
DP-23
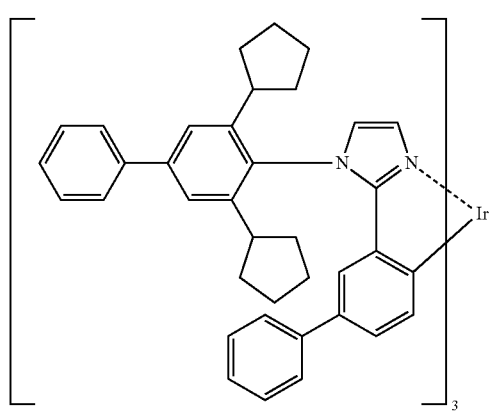
DP-24
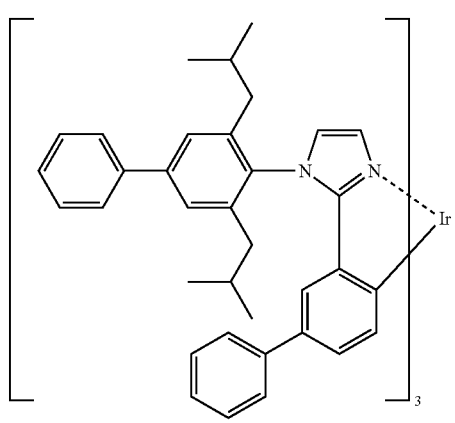

-continued
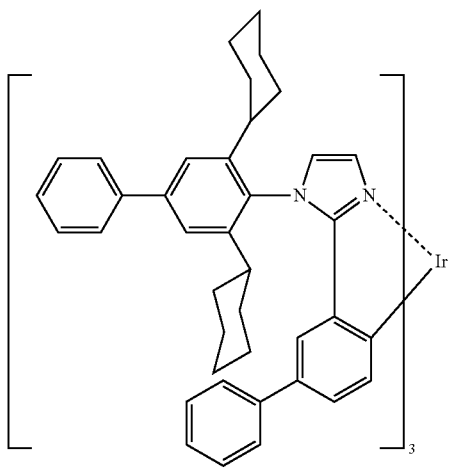
DP-25
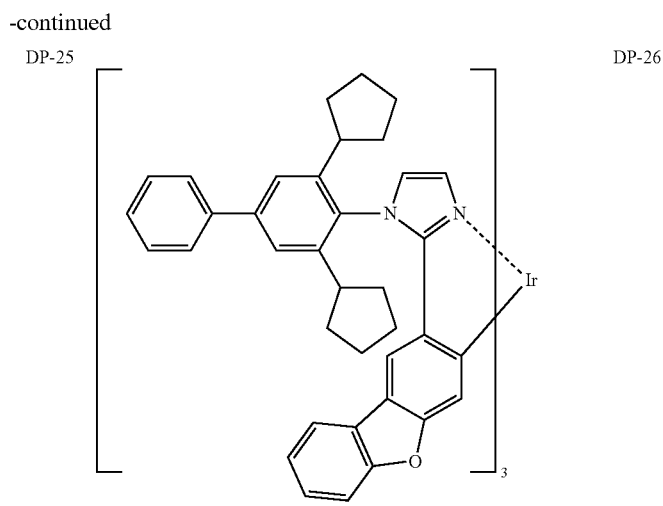
DP-26
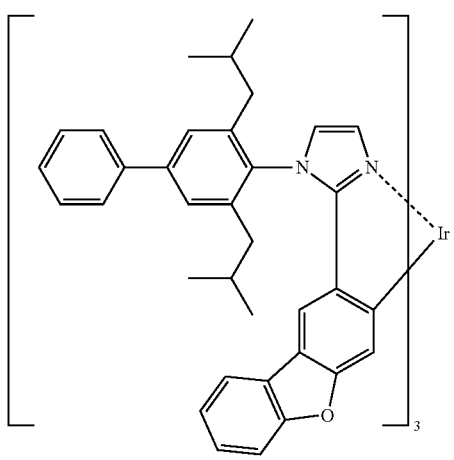
DP-27
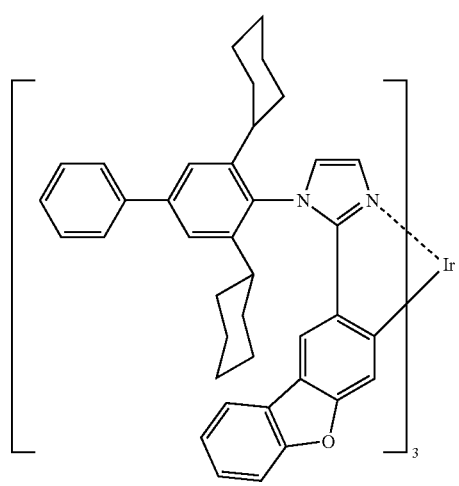
DP-28
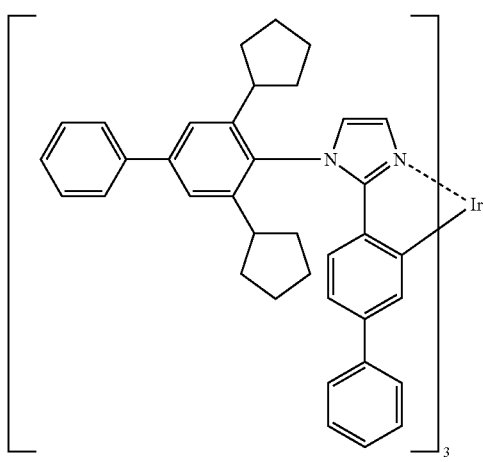
DP-29
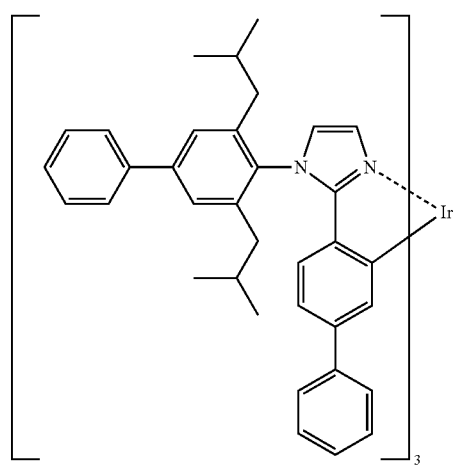
DP-30

-continued
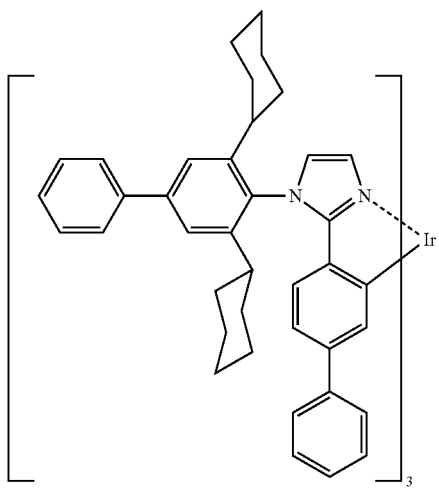
DP-31
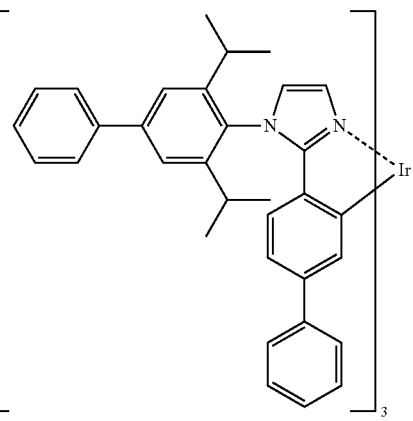
DP-32
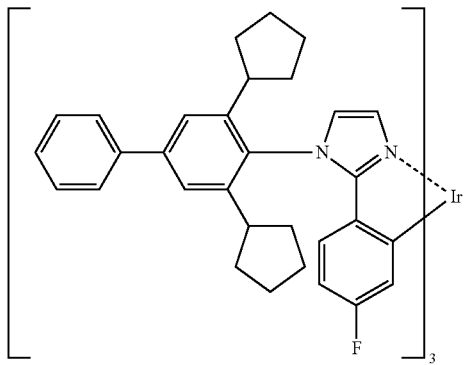
DP-33
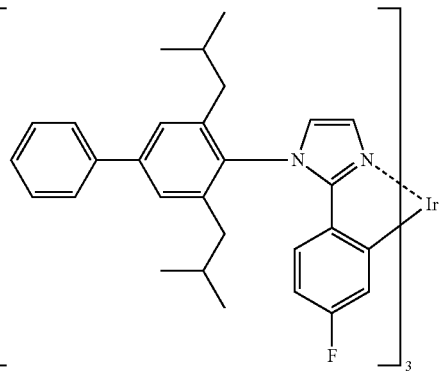
DP-34
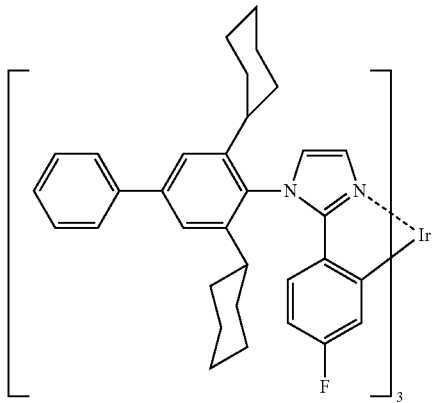
DP-35
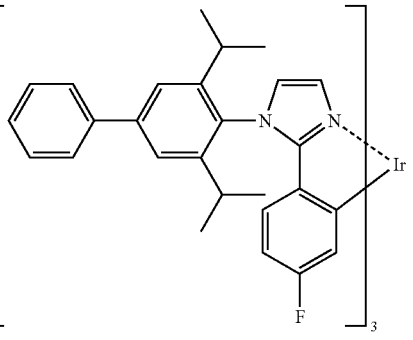
DP-36
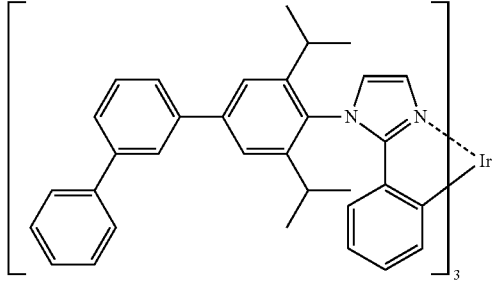
DP-37
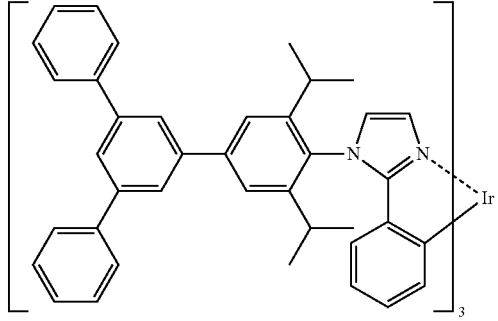
DP-38

-continued
DP-39
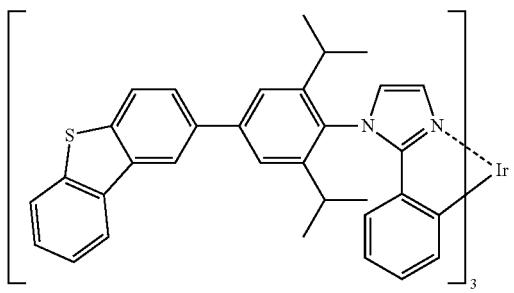
DP-40
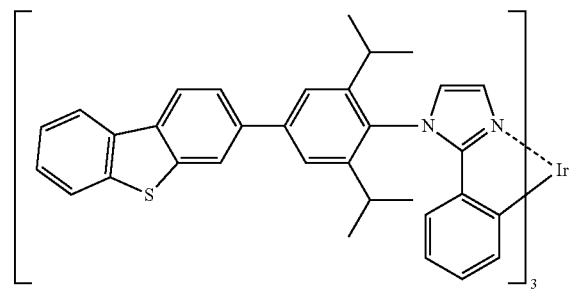
DP-41
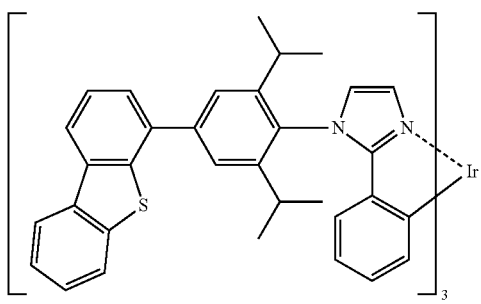
DP-42
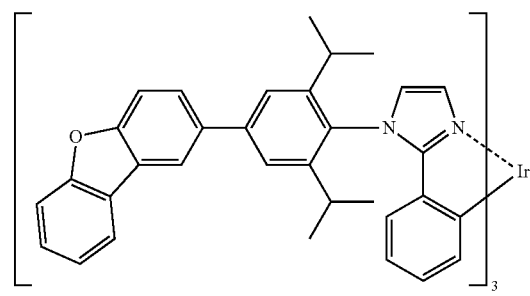
DP-43
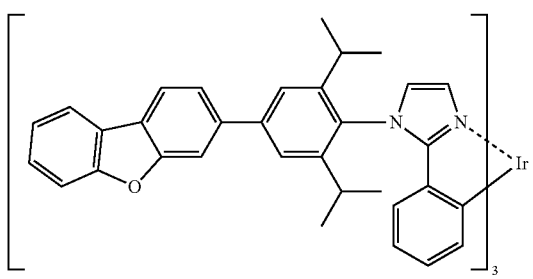
DP-44
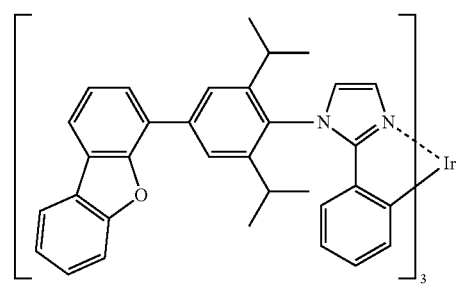
DP-45
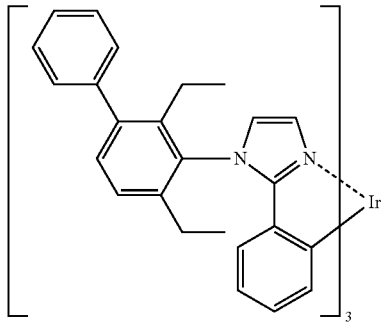
DP-46
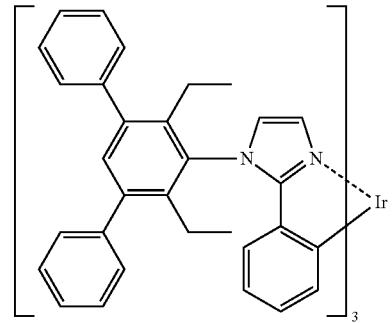
DP-47
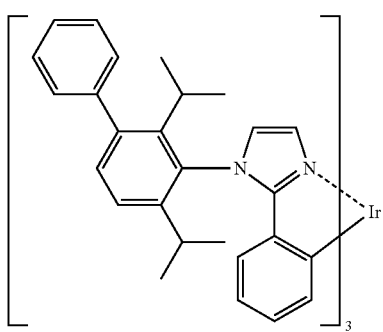
DP-48
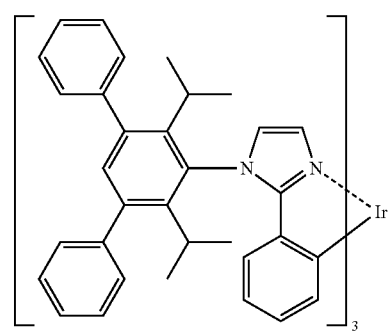

-continued
DP-49
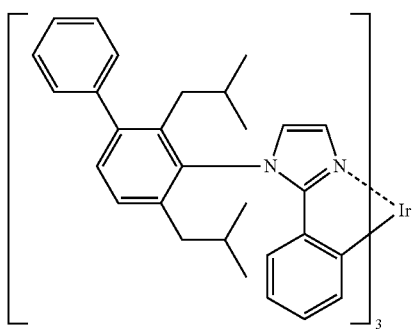
DP-50
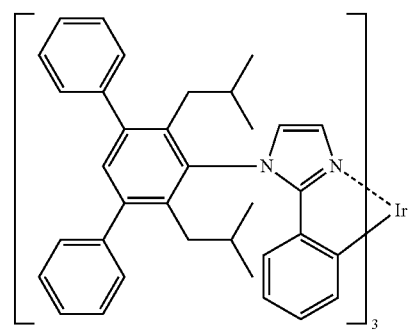
DP-51
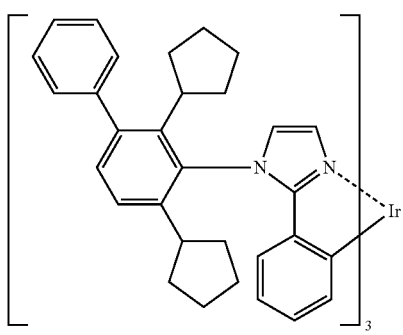
DP-52
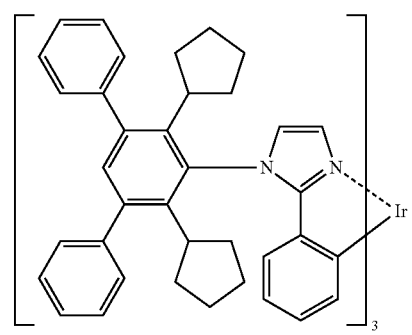
DP-53
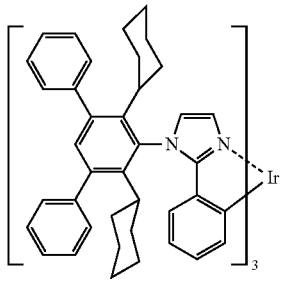
DP-54
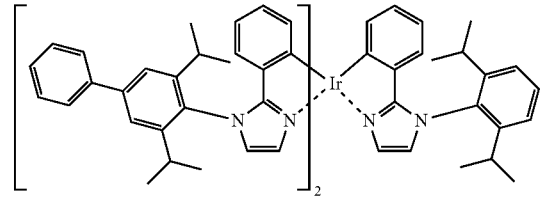
DP-55
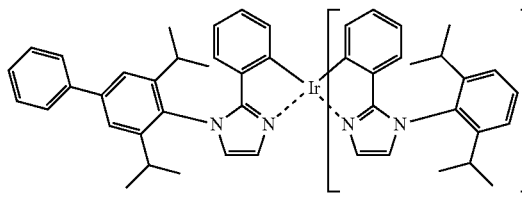
DP-56
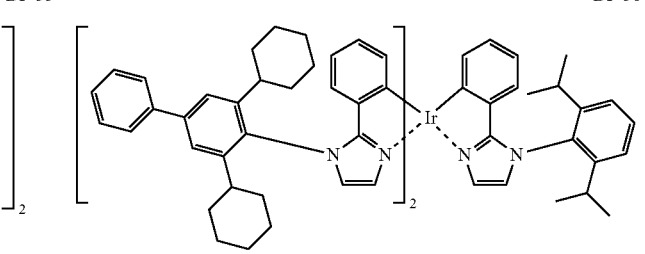
DP-57
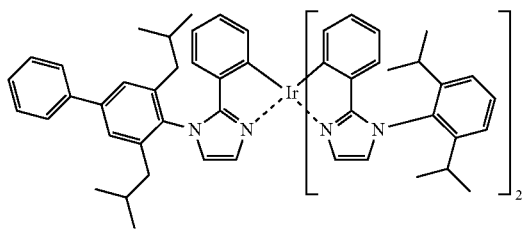
DP-58
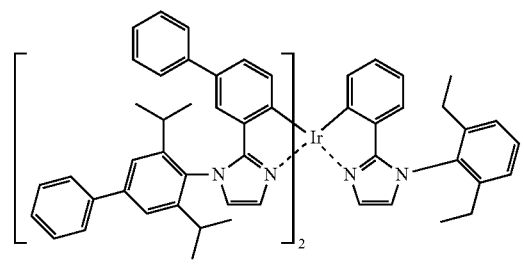

-continued
DP-59
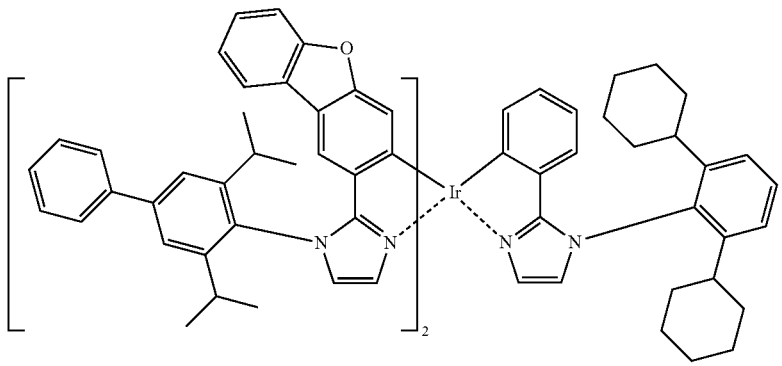
DP-60
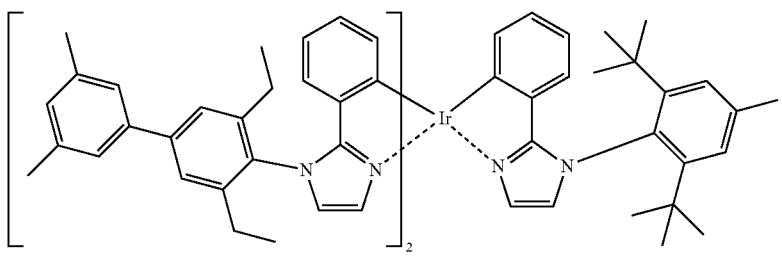
DP-61
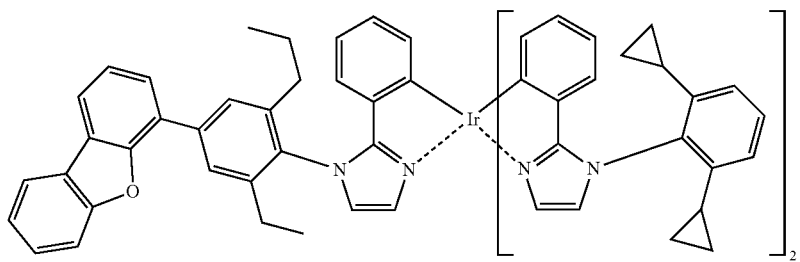
DP-62                                      DP-63
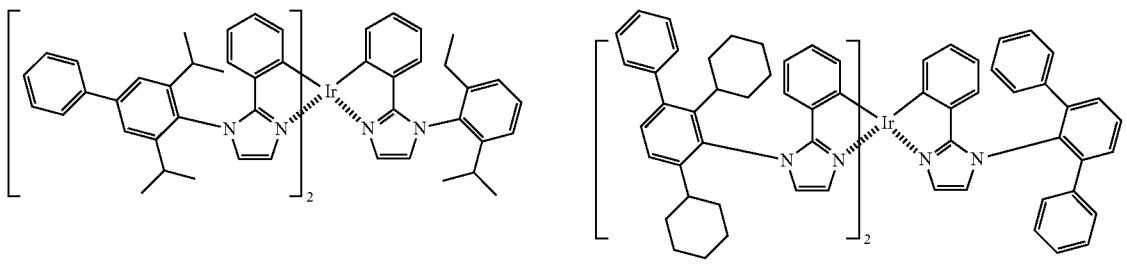
DP-64
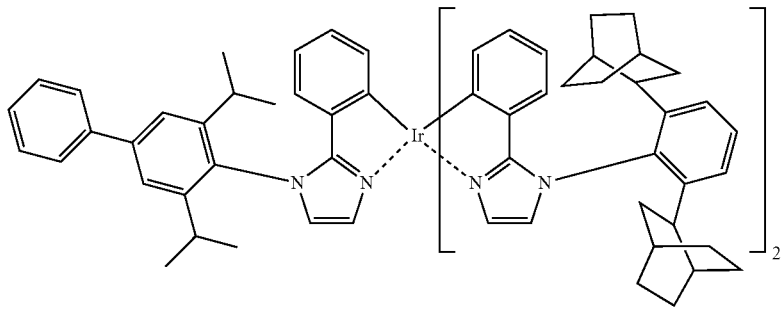

-continued
DP-65
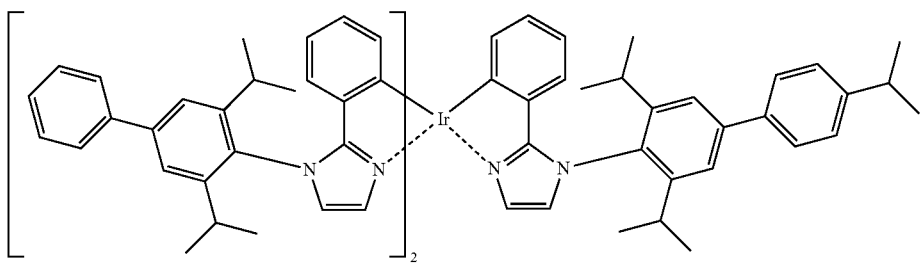
DP-66
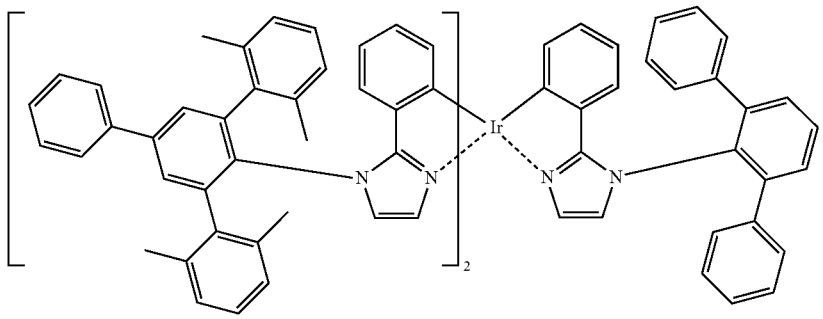
DP-67
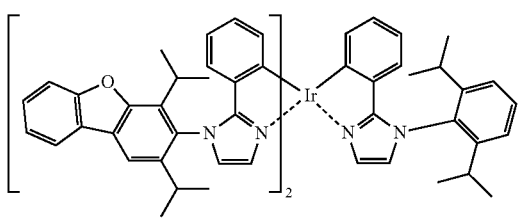
DP-68
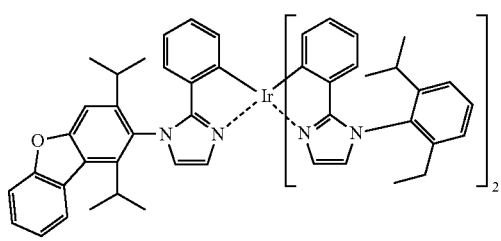
DP-69
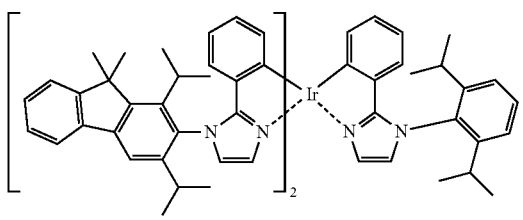
DP-70
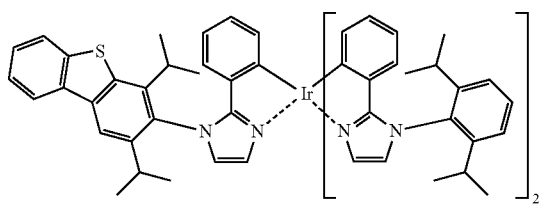
DP-71
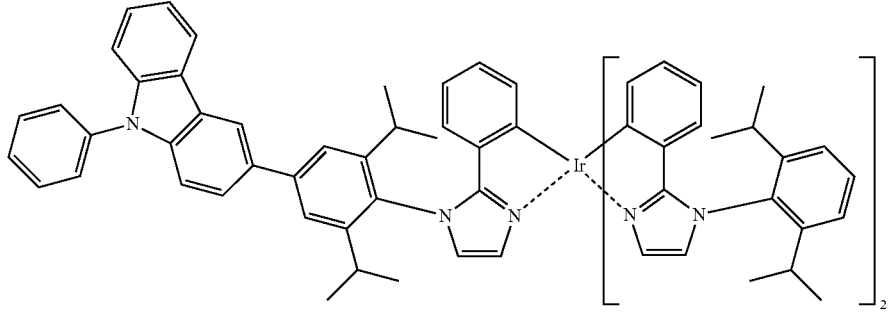
DP-72
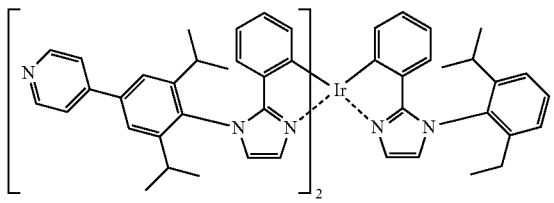
DP-73
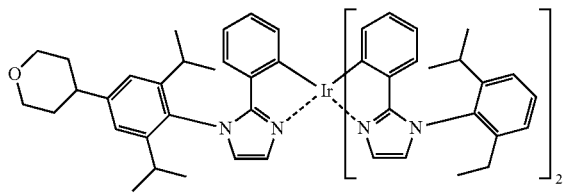

-continued
DP-74
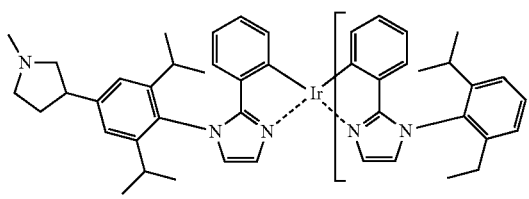
DP-75
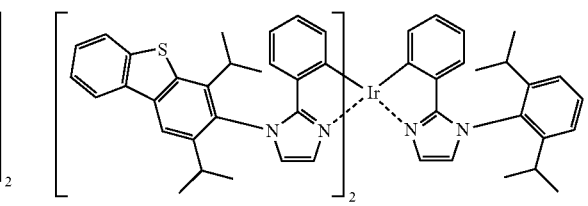
DP-76
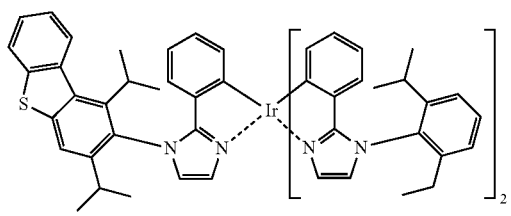
DP-77
DP-78
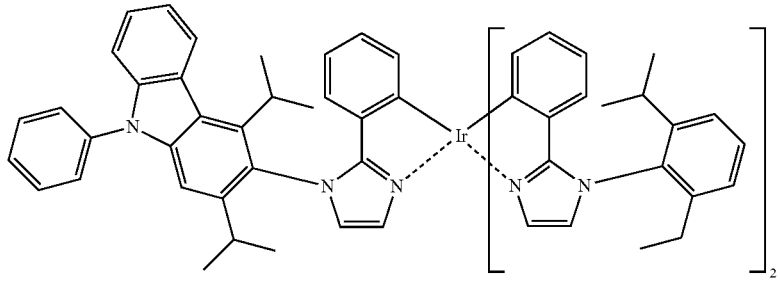
DP-79
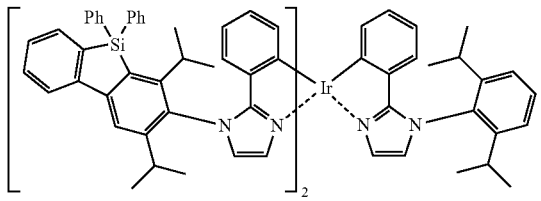
DP-80
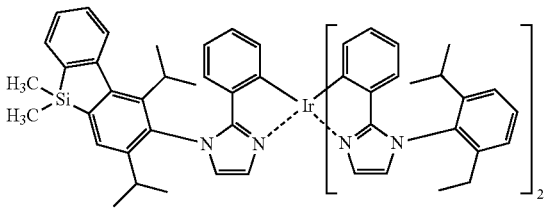
DP-81
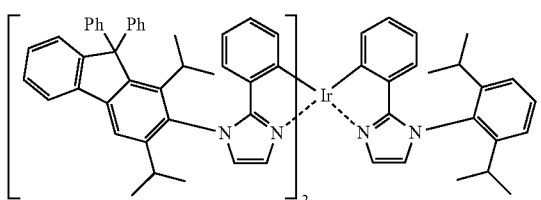
DP-82
DP-83
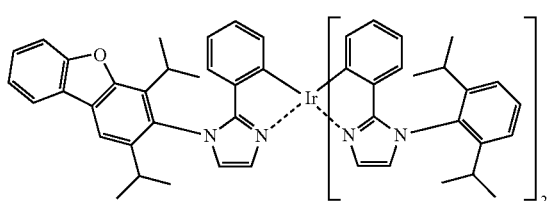
DP-84
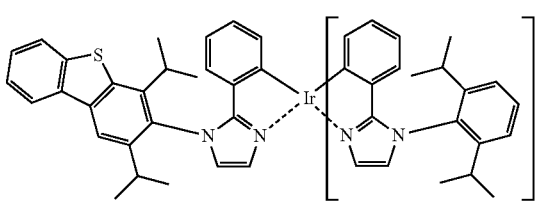

-continued
DP-85
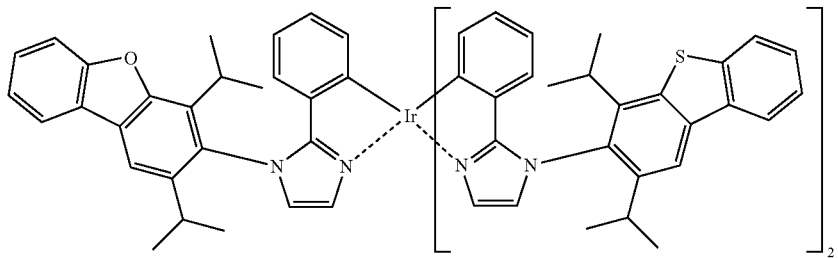
DP-86
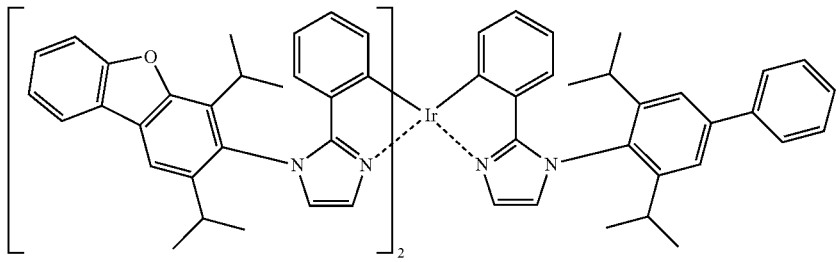
DP-87 DP-88
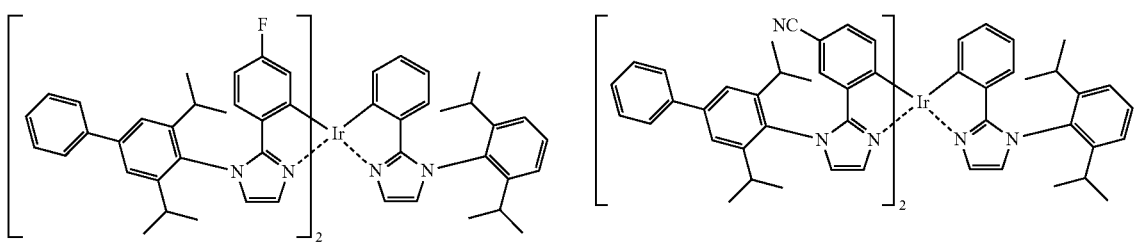
DP-89
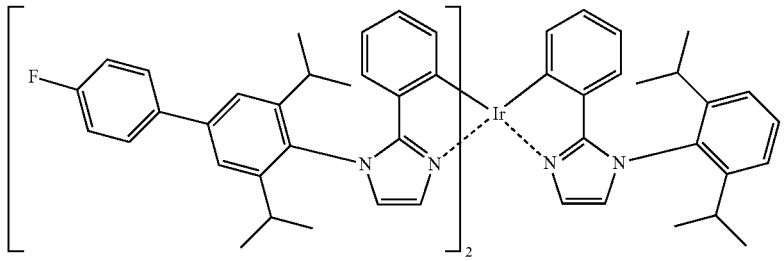
DP-90
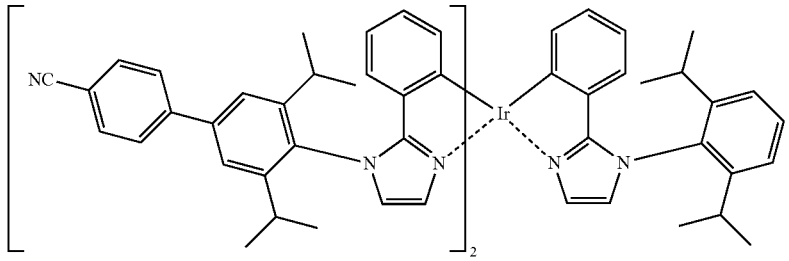
DP-91 DP-92
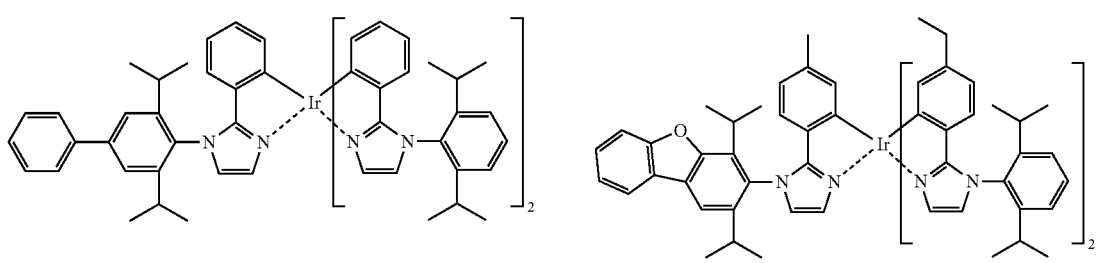

-continued
DP-93
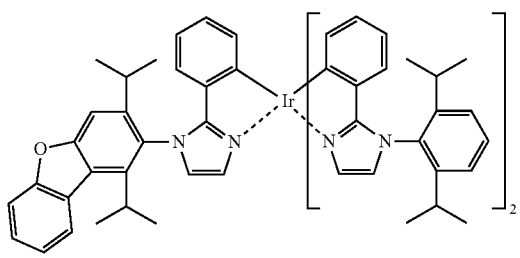
DP-94
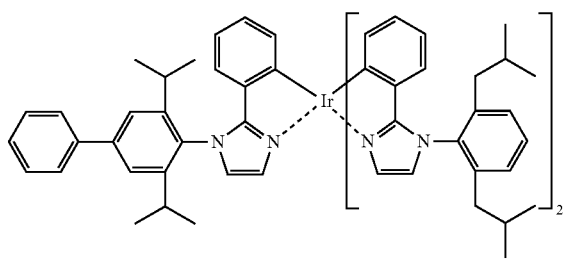
DP-95
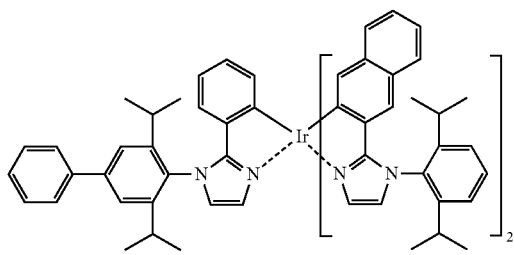
DP-96
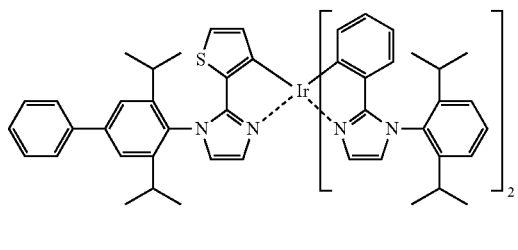
DP-97
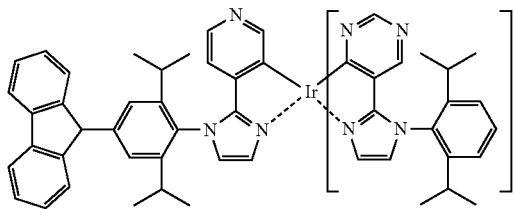
DP-98
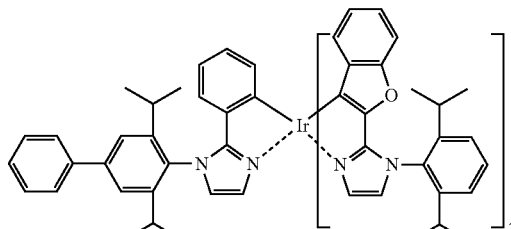
DP-99
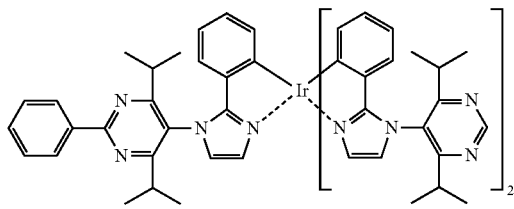
DP-100
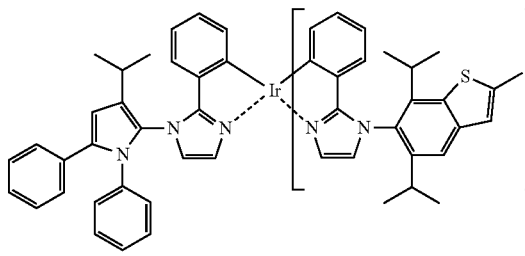
DP-101
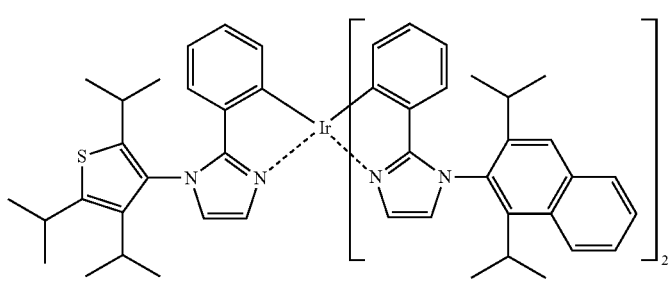

-continued
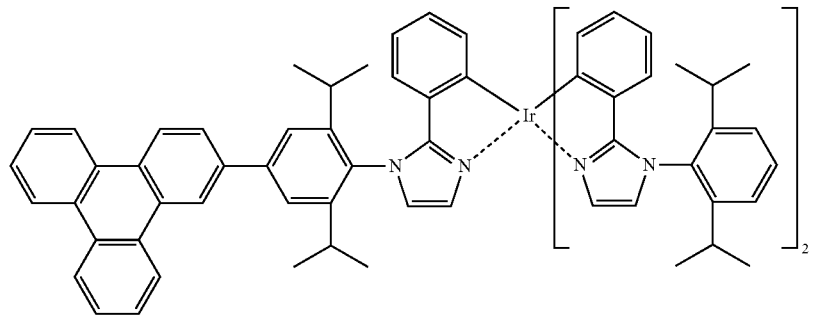
DP-102
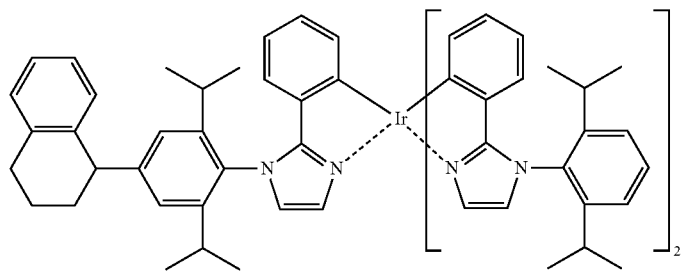
DP-103
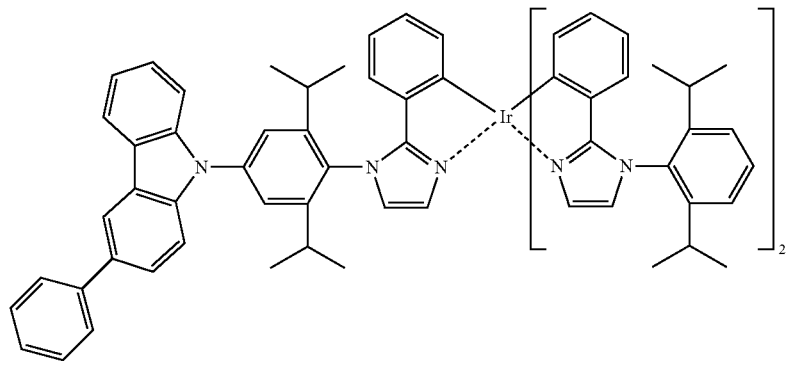
DP-104
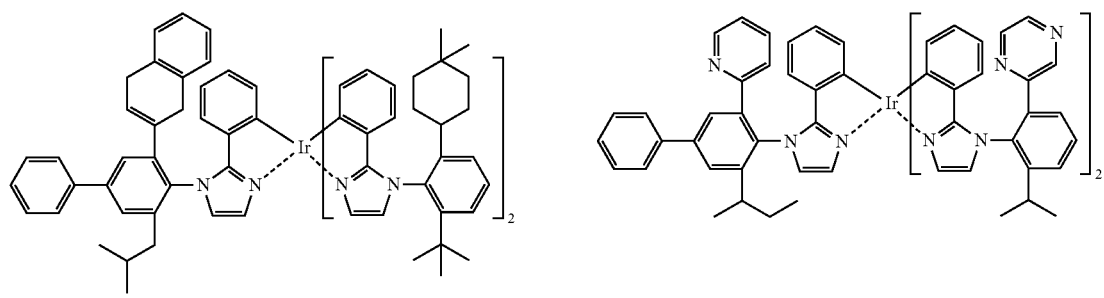
DP-105    DP-106
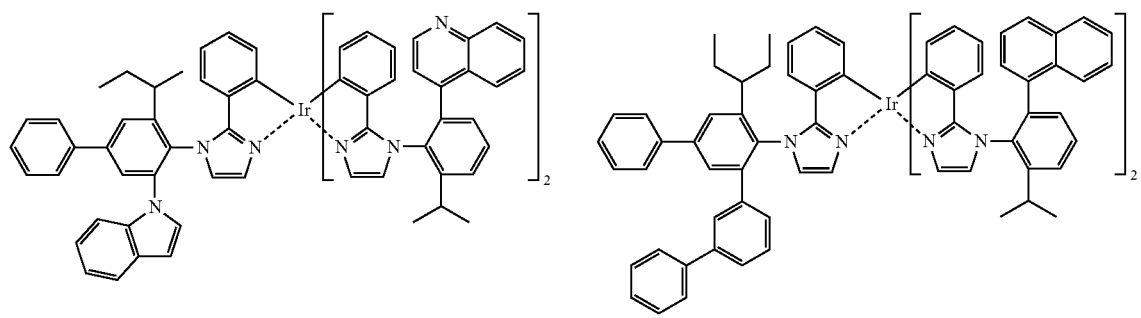
DP-107    DP-108

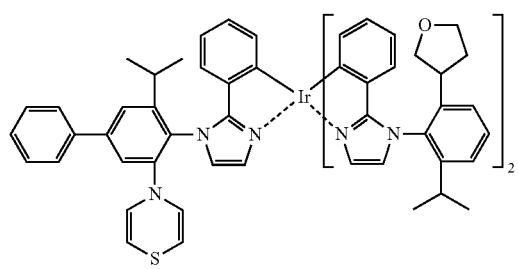

DP-109

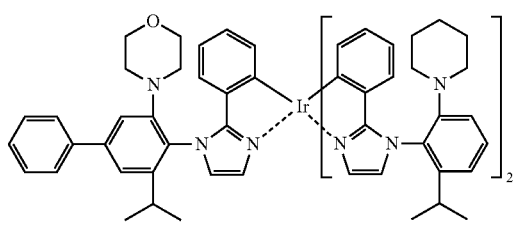

DP-110

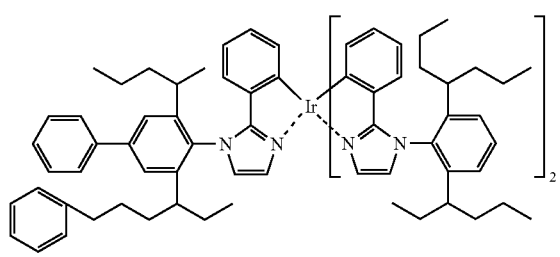

DP-111

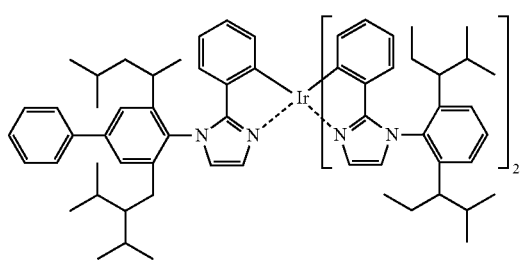

DP-112

Synthetic Examples

The synthetic examples of the compound represented by Formula (1) or (2) are explained below, but the present invention shall not be restricted to them. Among the compounds shown by the specific examples described above, a synthetic method of DP-54 shall be explained below as an example thereof.

DP-54 can be synthesized according to the following scheme.

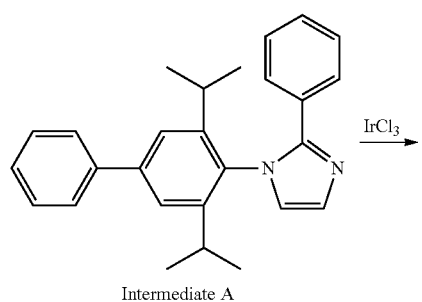

Intermediate A

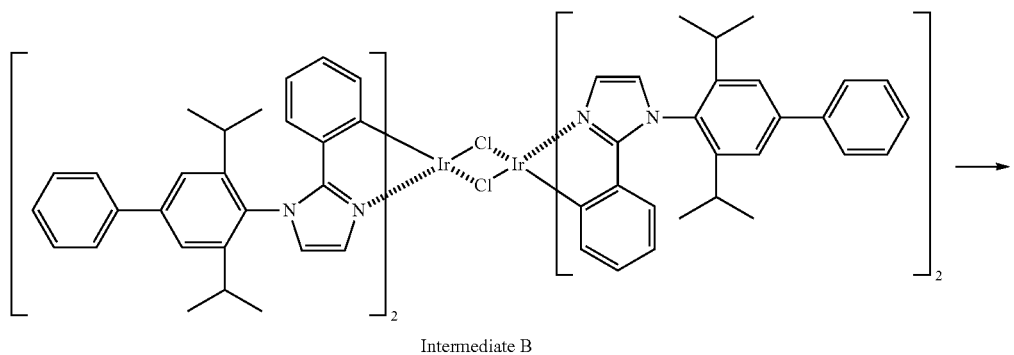

Intermediate B

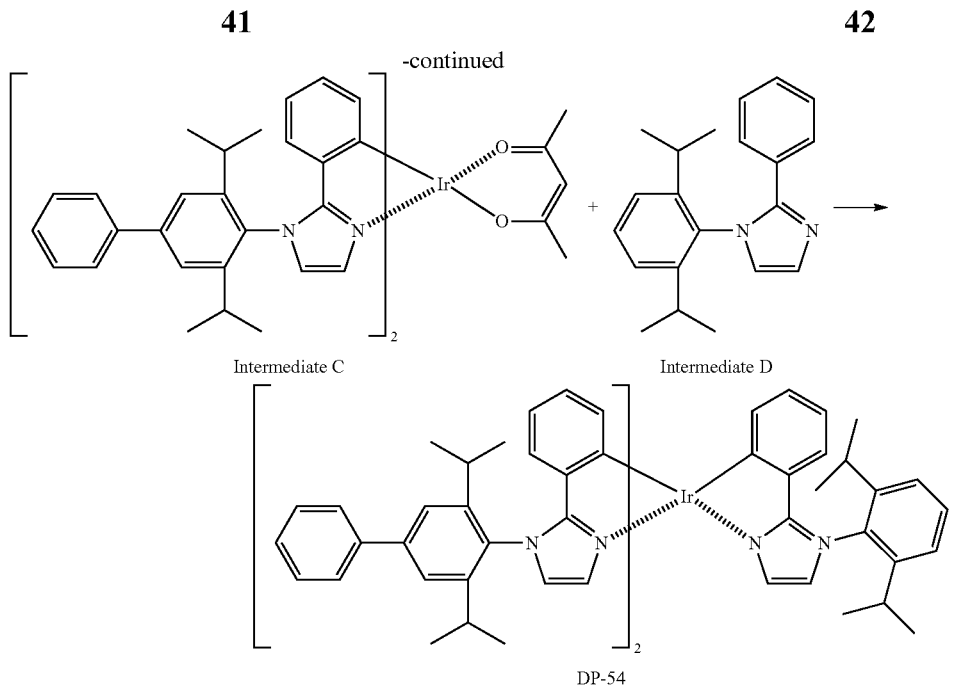

Intermediate C          Intermediate D

DP-54

Step 1:

A three neck flask was charged with 5 g of an intermediate A, 1.9 g of iridium chloride, 100 ml of ethoxyethanol and 30 ml of water, and the mixture was heated and stirred at 100° C. for 4 hours under nitrogen atmosphere. A deposited crystal was obtained by filtering, and the crystal thus obtained was washed with methanol to obtain 4.5 g of an intermediate B.

Step 2:

A three neck flask was charged with 4.0 g of the intermediate B obtained in the step 1, 2.5 g of acetylacetone, 7 g of potassium carbonate and 100 ml of ethoxyethanol, and the mixture was heated and stirred at 80° C. for 5 hours under nitrogen atmosphere. A deposited crystal was obtained by filtering, and the crystal thus obtained was washed with methanol and then with water to obtain 2.8 g of an intermediate C.

Step 3:

A three neck flask was charged with 2.8 g of the intermediate C obtained in the step 2, 1.6 g of an intermediate D and 50 ml of ethylene glycol, and the mixture was heated and stirred at 150° C. for 7 hours under nitrogen atmosphere. A deposited crystal was obtained by filtering, and the crystal thus obtained was washed with methanol and then refined and separated by silica gel chromatography to obtain 0.7 g of DP-54.

The structure of the compound example DP-54 was confirmed by a mass spectrum and $^1$H-NMR.

Mass spectrum (ESI): m/z=1179 [M+]

$^1$H-NMR (CD2C12, 400 MHz) δ: 7.71 (2H, d, J=28.3 Hz), 7.42 (1H, t, J=28.3 Hz), 7.33 to 7.57 (6H, m), 7.34 (4H, t, J=33.2 Hz), 6.96 (2H, S), 6.81 to 6.86 (6H, m), 6.69 (2H, d, J=33.2 Hz), 6.56 to 6.60 (2H, m), 6.44 (1H, t, J=23.4 Hz), 6.38 (2H, d, J=17.6 Hz), 6.32 (1H, d, J=23.4 Hz), 6.16 (2H, d, J=44.9 Hz), 2.65 to 2.80 (3H, m, CH of iso-Pr), 2.29 to 2.41 (3H, m, CH of iso-Pr), 1.26 (3H, d, J=26.3 Hz, CH3 of iso-Pr), 1.21 (6H, d, J=20.5 Hz, CH3 of iso-Pr), 0.92 to 1.08 (m, 27H, CH3 of iso-Pr)

«Compound Represented by Formula (H1)»

Next, the compound represented by Formula (H1) which is contained as the organic EL device material in the organic EL device of the present invention shall be explained.

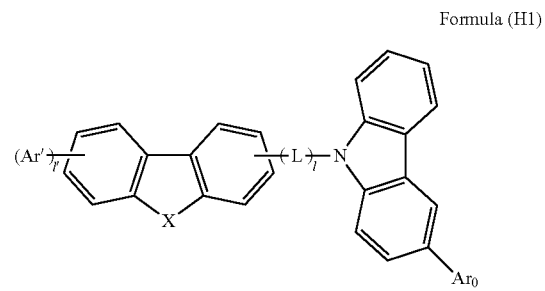

Formula (H1)

In Formula (H1), X represents an oxygen atom or a sulfur atom.

L represents a single bond or a linkage group derived from an aromatic hydrocarbon ring or an aromatic heterocycle. L derived from the aromatic hydrocarbon ring or the aromatic heterocycle includes divalent or higher groups derived from the aromatic hydrocarbon ring and the aromatic heterocycle represented by Ar in Formula (1) described above. In Formula (H1), the above rings represented by L may have substituents, and the above substituents may be combined with each other to form rings.

The aromatic hydrocarbon ring or the aromatic heterocycle represented by L in Formula (H1) is preferably a benzene ring, a carbazole ring, a dibenzofuran ring, a dibenzothiophene ring, a pyridine ring, a pyrazine ring or a triazine ring, more preferably a benzene ring, a carbazole ring, a dibenzofuran ring or a dibenzothiophene ring.

In Formula (H1), Ar0 and Ar' each represent independently an aromatic hydrocarbon ring or an aromatic heterocycle. The aromatic hydrocarbon ring or the aromatic heterocycle represented by Aro and Ar' includes monovalent groups derived from the aromatic hydrocarbon ring and the aromatic heterocycle represented by Ar in Formula (1) described above. In Formula (H1), the above rings represented by Aro and Ar' may have substituents, and the above substituents themselves may be combined with each other to form rings.

The aromatic hydrocarbon ring or the aromatic heterocycle represented by Aro in Formula (H1) is preferably a benzene ring, a carbazole ring, a dibenzofuran ring, a dibenzothiophene ring, a pyridine ring, a pyrazine ring or a triazine ring, more preferably a benzene ring, a carbazole ring, a dibenzofuran ring or a dibenzothiophene ring and further preferably a benzene ring.

The aromatic hydrocarbon ring or the aromatic heterocycle represented by Ar' in Formula (H1) is preferably a benzene ring, a carbazole ring, a dibenzofuran ring, a dibenzothiophene ring, a pyridine ring, a pyrazine ring or a triazine ring, more preferably a benzene ring, a carbazole ring, a dibenzofuran ring or a dibenzothiophene ring.

The term l represents an integer of 0 to 3, and l' represents an integer of 0 to 4. The term l is preferably 0 or 1, above all, preferably 0. The term l' is preferably 1 or more, above all, preferably 1 or 2 and more. preferably 1.

From the viewpoints of an ageing stability and a production aptitude in producing the device, the host compound has preferably a higher Tg (glass transition temperature), and the compound represented by Formula (H1) has a Tg of 100° C. or higher, more preferably 120° C. or higher and further preferably 130° C. or higher.

The compound represented by Formula (H1) has preferably a higher minimum excited triplet energy (T1) than that of the blue phosphorescent organic metal complex used at the same time, and the compound has T1 of more preferably 2.7 eV or more, further preferably 2.75 eV or more and more preferably 2.8 eV or more.

In this connection, a value of T1 of the compound represented by Formula (H1) is a value obtained by calculating using Gaussian 98 (Gaussian 98, Revision A. 11. 4, M. J. Frisch, et al, Gaussian, Inc., Pittsburgh Pa., 2002) which is a software for calculating a molecular orbital, manufactured by Gaussian, Inc., and it is defined as a value (eV unit-reduced value) calculated by carrying out structural optimization using B3LYP/6-31G* as a key word. A high correlation between the calculated value determined by the above method and the experimental value is involved in the background that the above calculated value is effective.

Also, the compound represented by Formula (H1) has a molecular weight of preferably 500 or more and 2000 or less, more preferably 700 or more and 1500 or less.

The structure represented by Formula (H1) is represented preferably by the following Formula (H2).

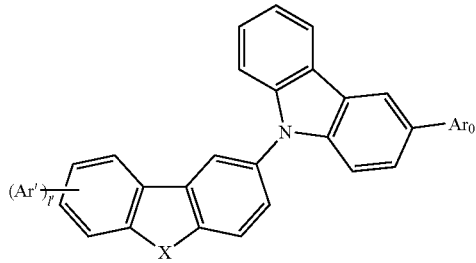

Formula (H2)

In Formula (H2), X, Aro, Ar' and l' have the same definitions as those shown in X, Aro, Ar' and l' in Formula (H1) described above. In Formula (H2), l' is preferably 1.

The structure represented by Formula (H2) is represented preferably by the following Formula (H3) or (H4).

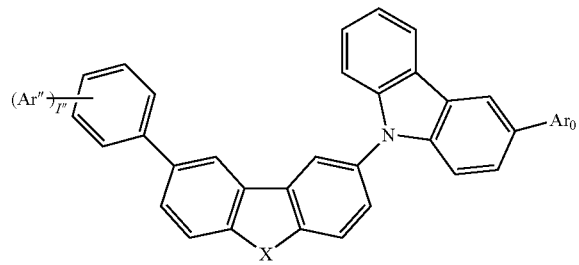

Formula (H3)

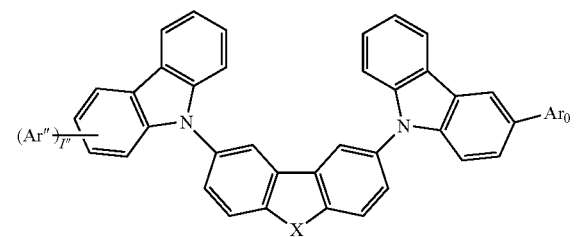

Formula (H4)

In Formula (H3), X and Aro have the same definitions as those shown in Formula (H1) described above.

In Formula (H3), plural Ar" each represent independently an aromatic hydrocarbon ring or an aromatic heterocycle. The aromatic hydrocarbon ring or the aromatic heterocycle represented by Ar" includes monovalent groups derived from the aromatic hydrocarbon ring and the aromatic heterocycle represented by Aro in Formula (H1) described above. In Formula (H3), the above rings represented by Ar" may have substituents, and the above substituents themselves may be combined with each other to form rings. Further, Ar" may be combined with a benzene ring to which Ar" is bonded to form a ring.

The aromatic hydrocarbon ring or the aromatic heterocycle represented by Ar" in Formula (H3) is preferably a benzene ring, a carbazole ring, a dibenzofuran ring, a dibenzothiophene ring, a pyridine ring, a pyrazine ring or a triazine ring, more preferably a benzene ring, a carbazole ring, a dibenzofuran ring or a dibenzothiophene ring and further preferably a benzene ring.

In Formula (H3), l" represents an integer of 0 to 5.

In Formula (H4), X and Aro have the same definitions as those of X and Aro in Formula (H1) described above. Plural Ar" each represent independently an aromatic hydrocarbon ring or an aromatic heterocycle. The aromatic hydrocarbon ring or the aromatic heterocycle represented by Ar" includes monovalent groups derived from the aromatic hydrocarbon ring or the aromatic heterocycle represented by Aro in Formula (H1) described above. In Formula (H4), the above rings represented by Ar" may have substituents, and the above substituents themselves may be combined with each other to form rings. Further, Ar" may be combined with a carbazole ring to which Ar" is bonded to form a ring.

The aromatic hydrocarbon ring or the aromatic heterocycle represented by Ar" in Formula (H4) is preferably a benzene ring, a carbazole ring, a dibenzofuran ring, a dibenzothiophene ring, a pyridine ring, a pyrazine ring or a triazine ring, more preferably a benzene ring, a carbazole ring, a dibenzofuran ring or a dibenzothiophene ring and further preferably a benzene ring.

In Formula (H4), l″ represents an integer of 0 to 4.

The specific examples of the compounds represented by Formulas (H1) to (H4) according to the present invention are shown below, but the present invention shall not be restricted to them.

H-1
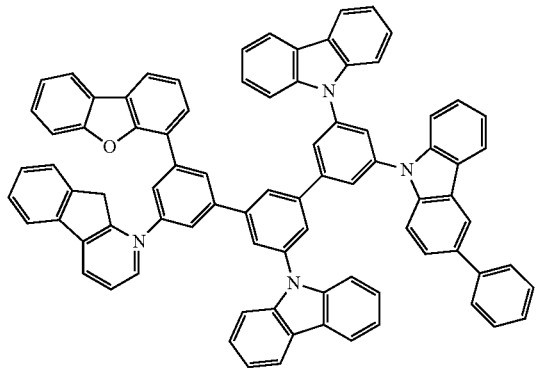

H-2
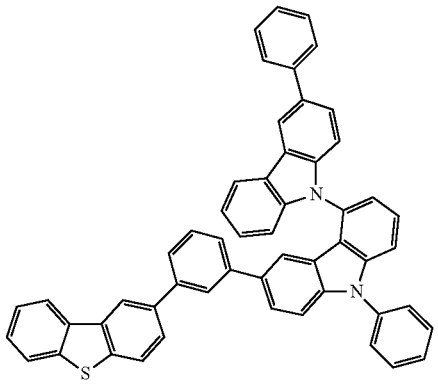

H-3
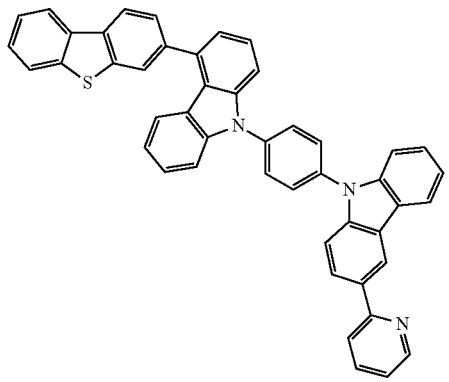

H-4
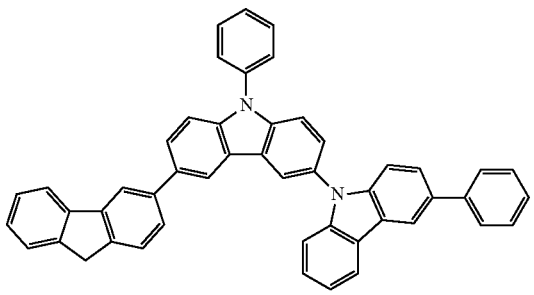

H-5
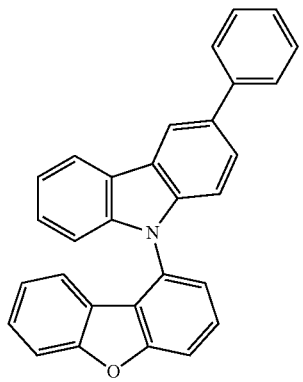

-continued
H-6
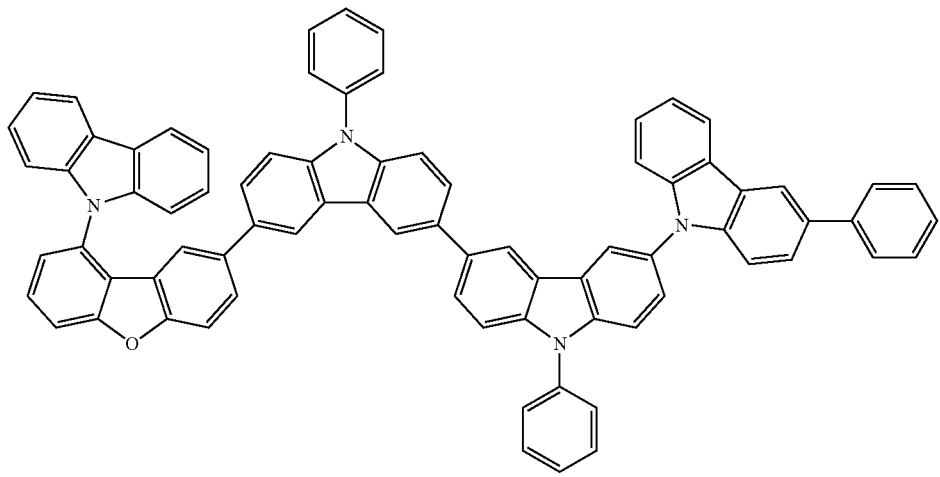
H-7
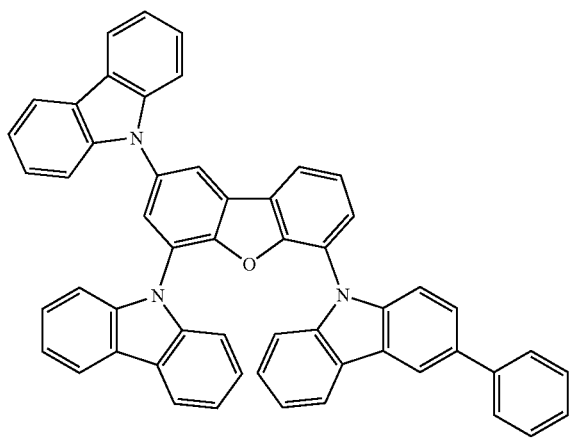
H-8
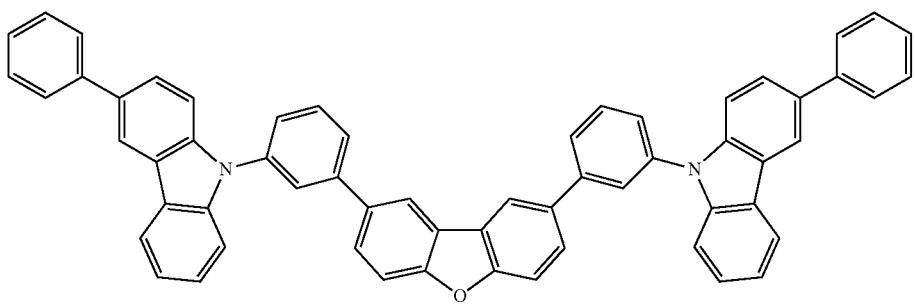
H-9
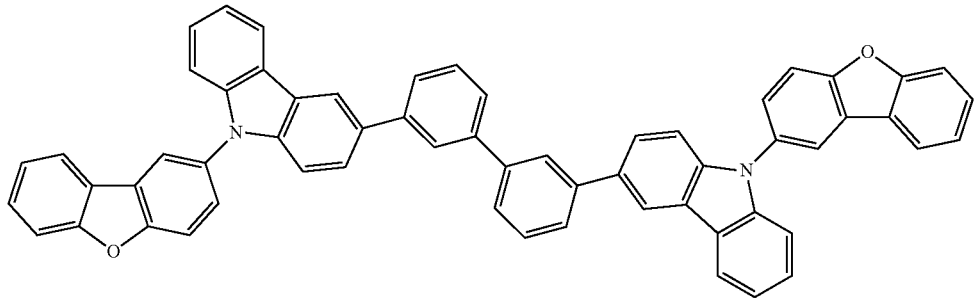

-continued
H-10
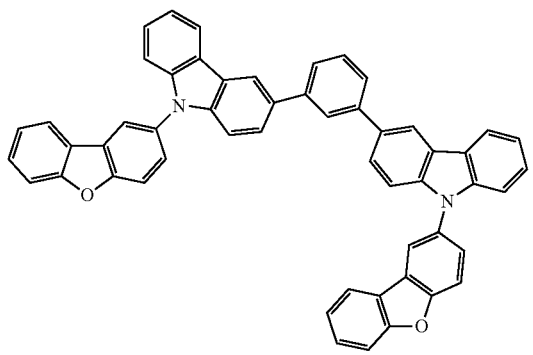
H-11
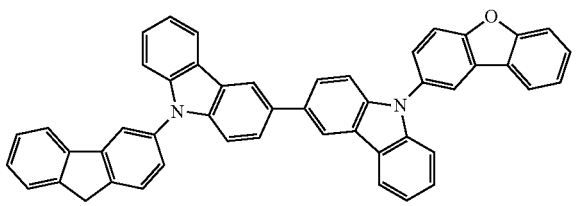
H-12
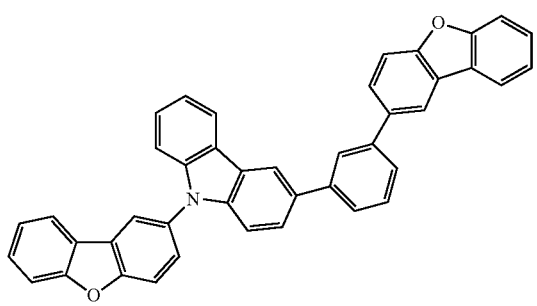
H-13
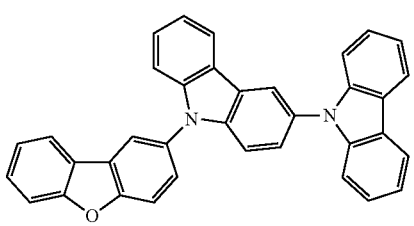
H-14
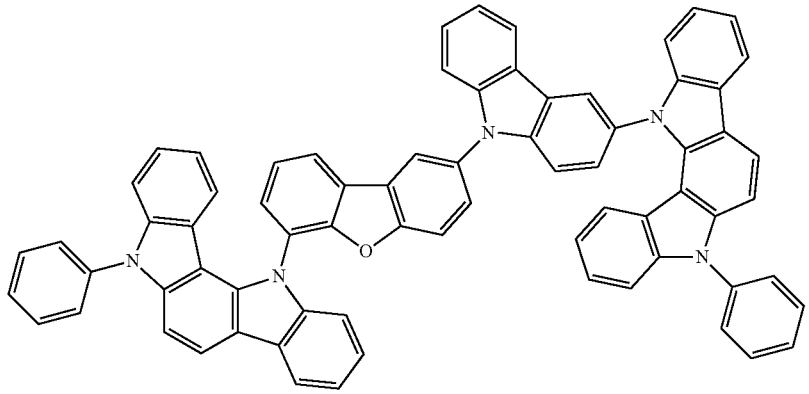
H-15
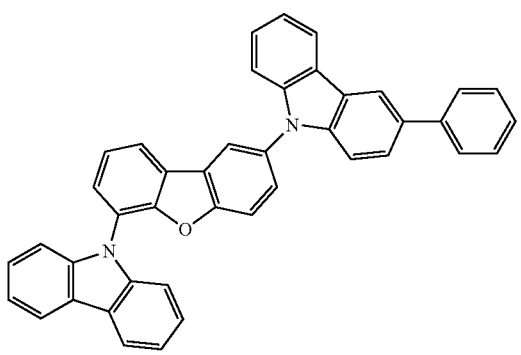
H-16
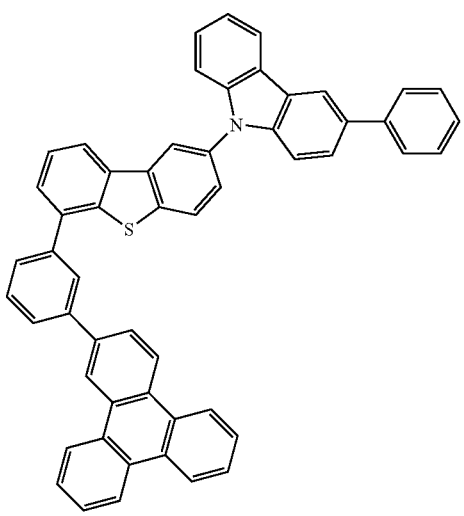

H-17
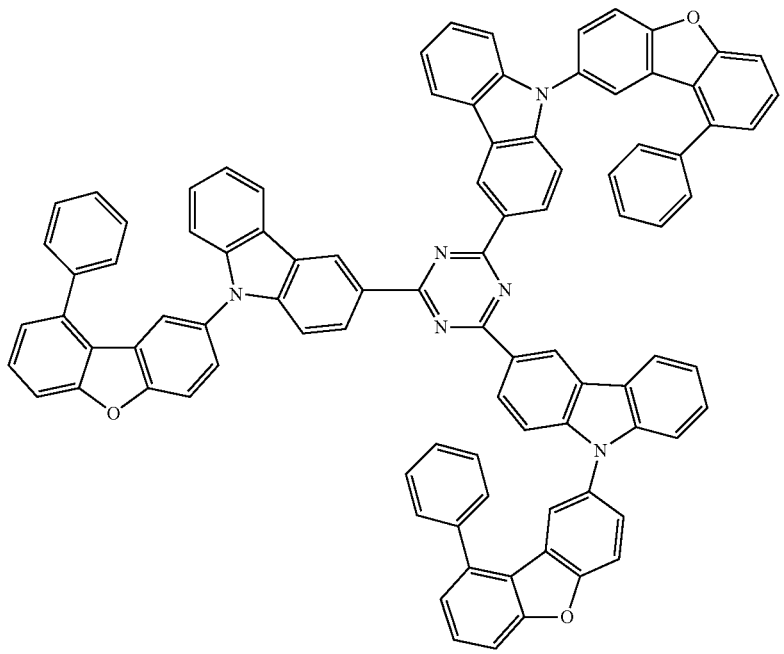
H-18
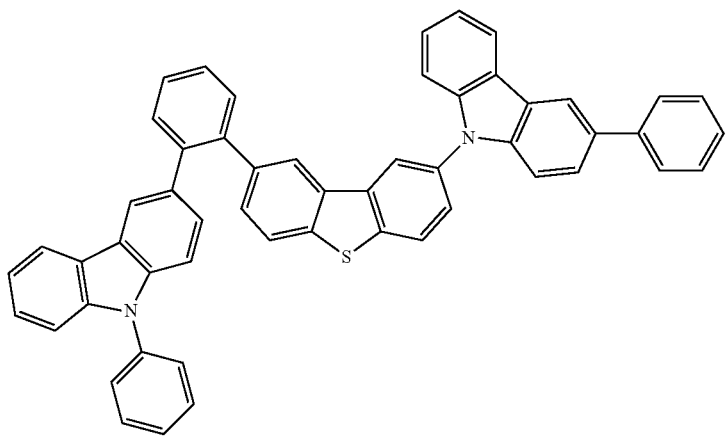
H-19
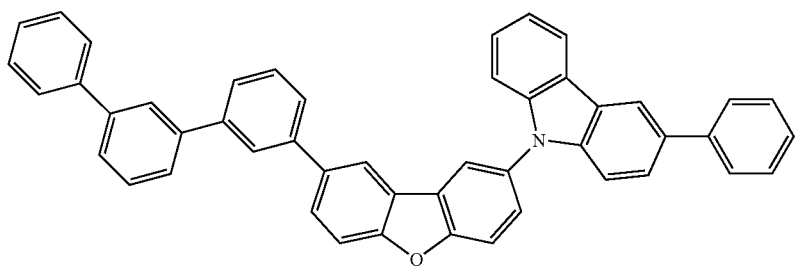

H-20
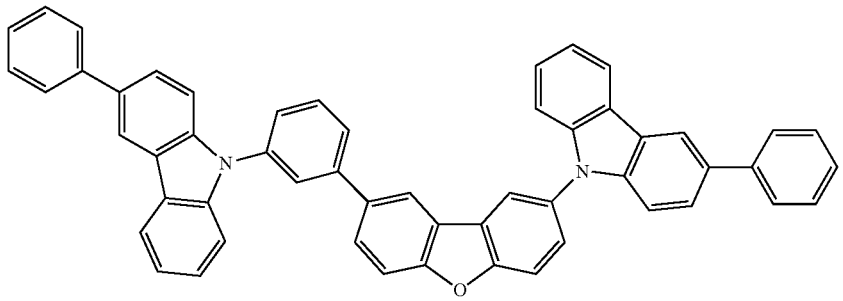
H-21
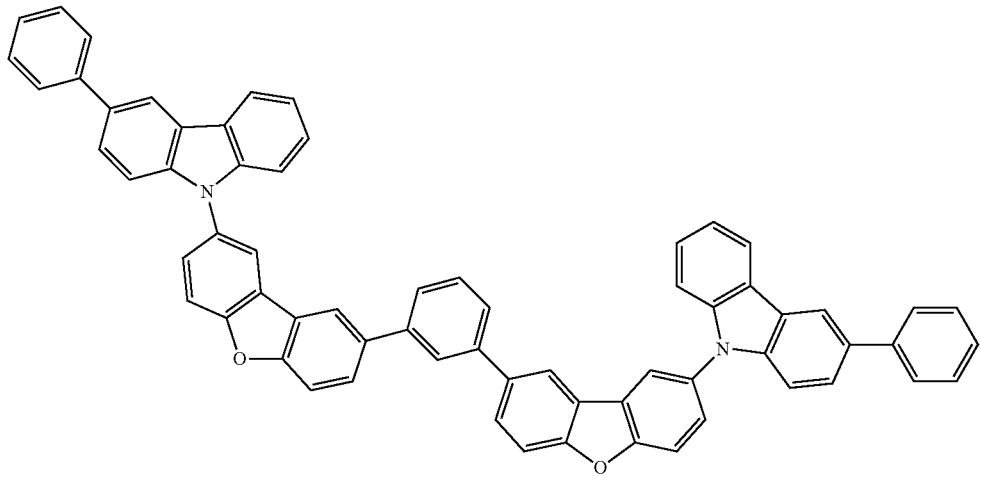
H-22
H-23
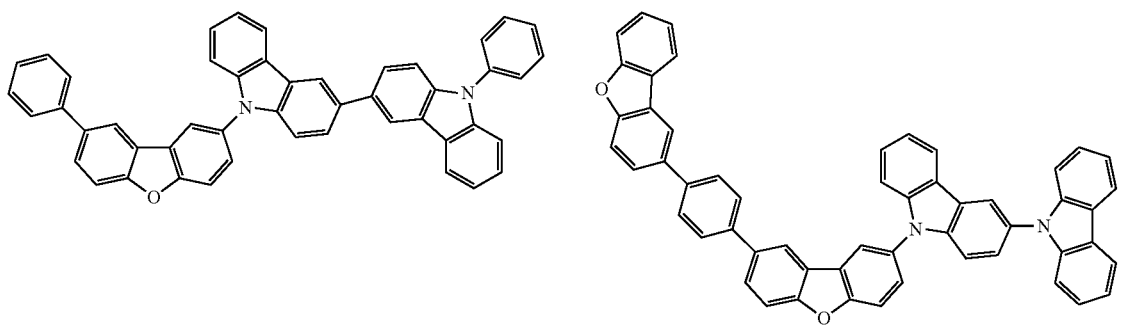
H-24
H-25
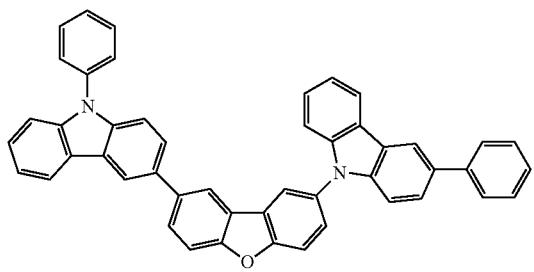
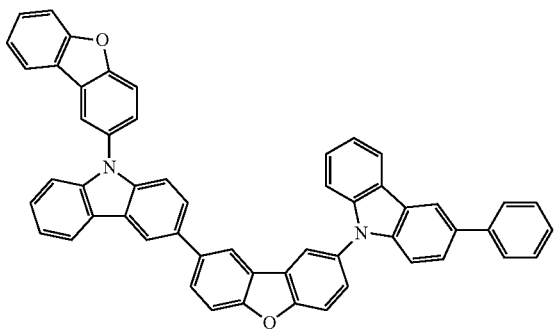

H-26
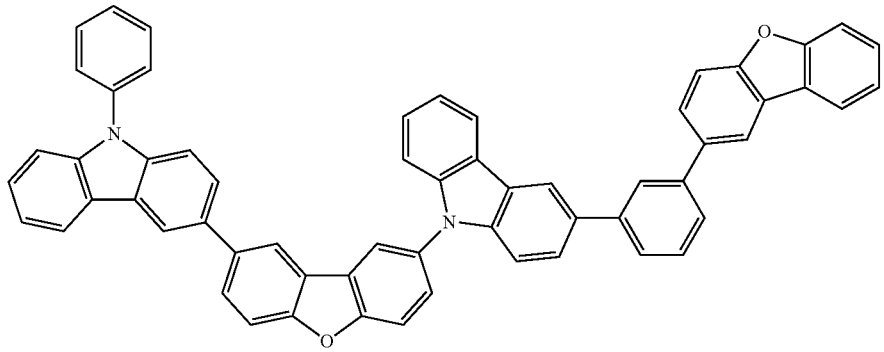
H-27
H-28
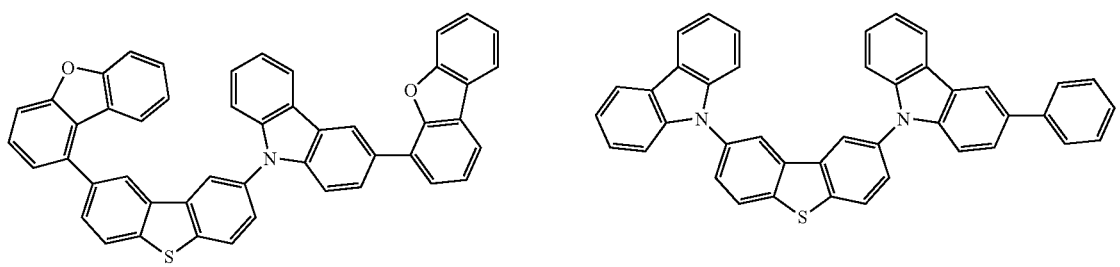
H-29
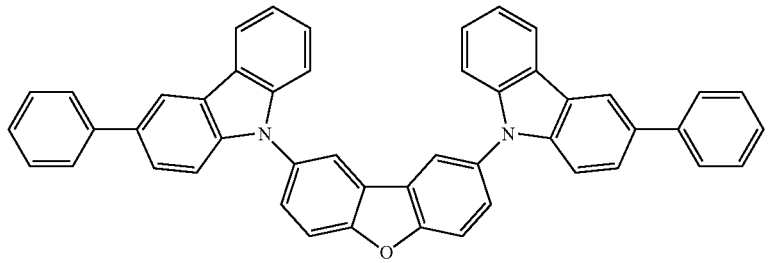
H-30
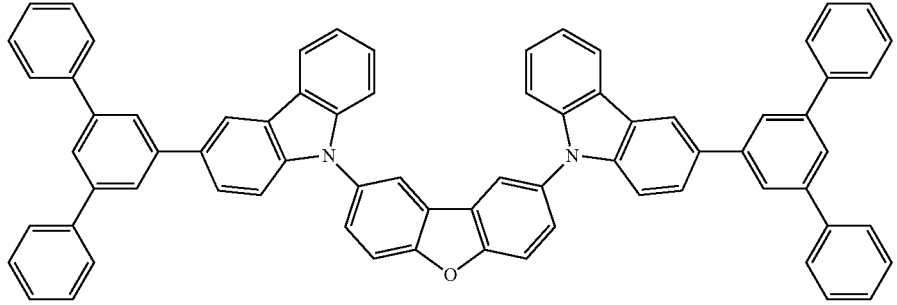
H-31
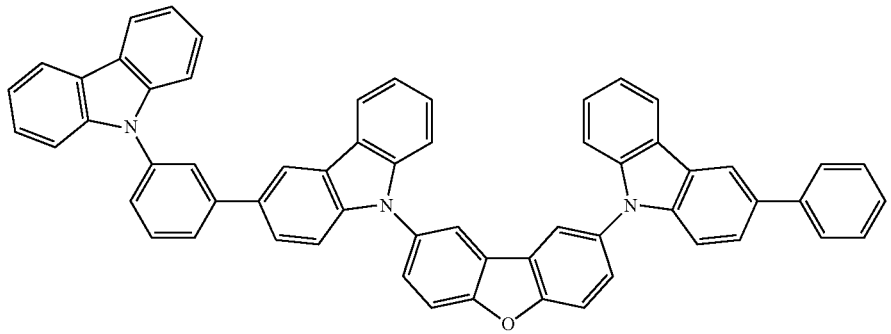

H-32
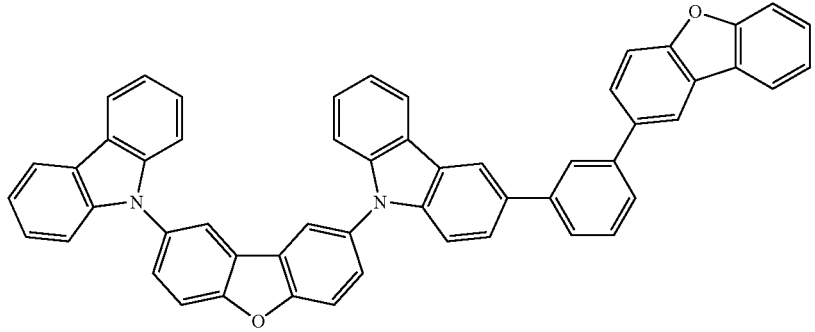
H-33
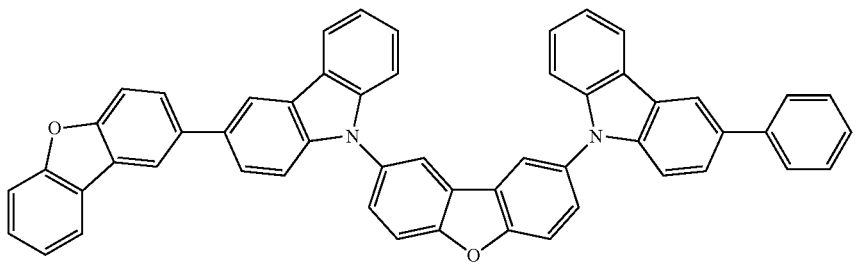
H-34
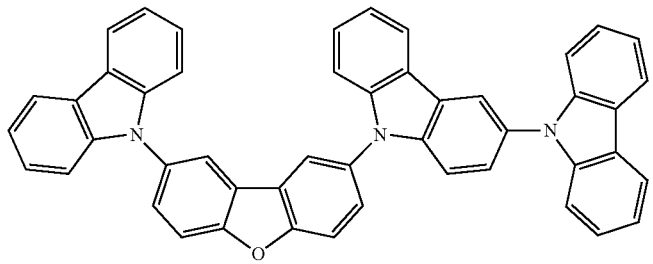
H-35
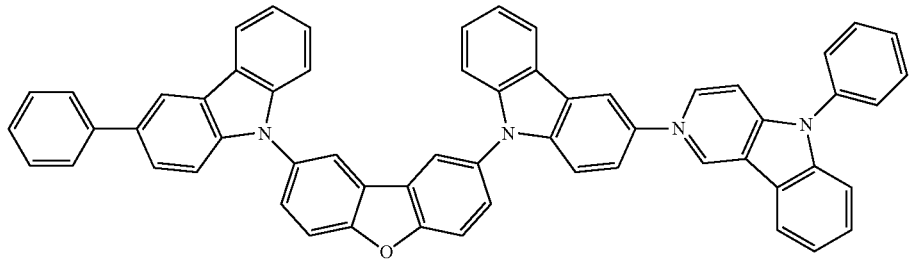
H-36 H-37
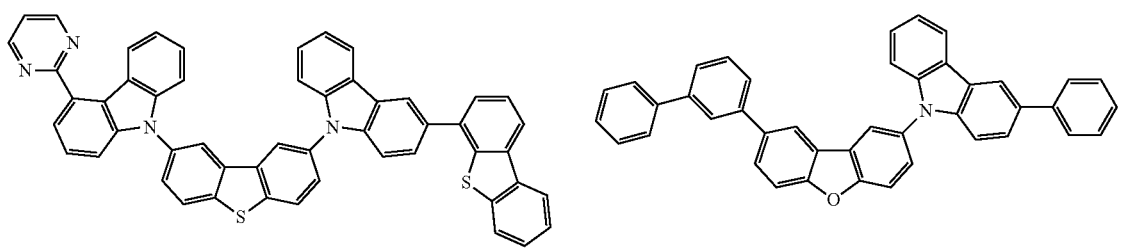

H-38
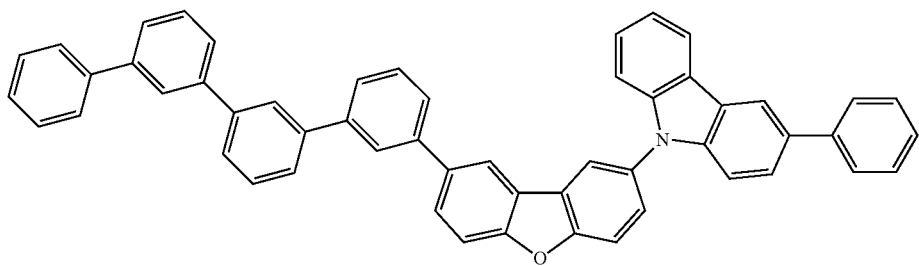
H-39
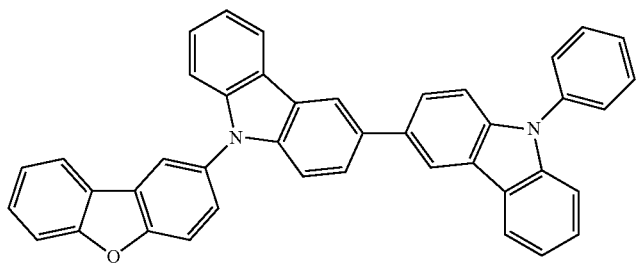
H-40
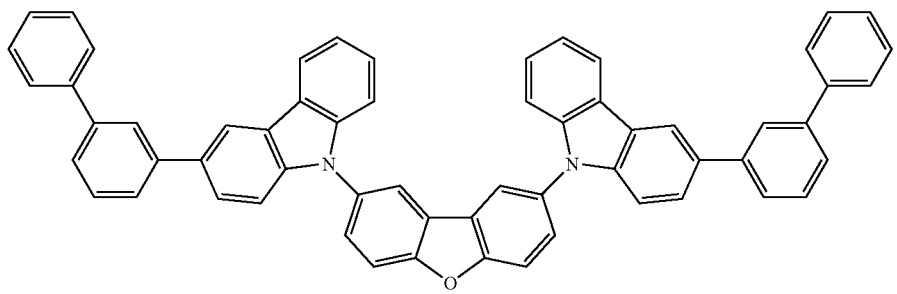
H-41 H-42
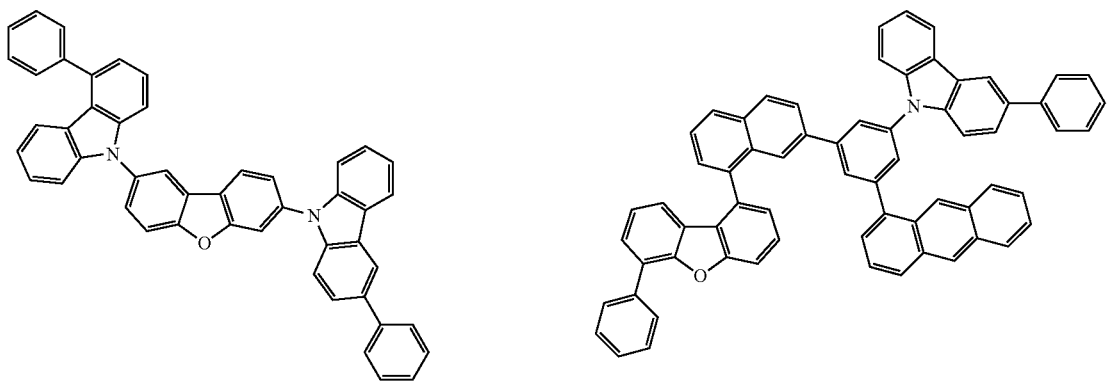

-continued
H-43
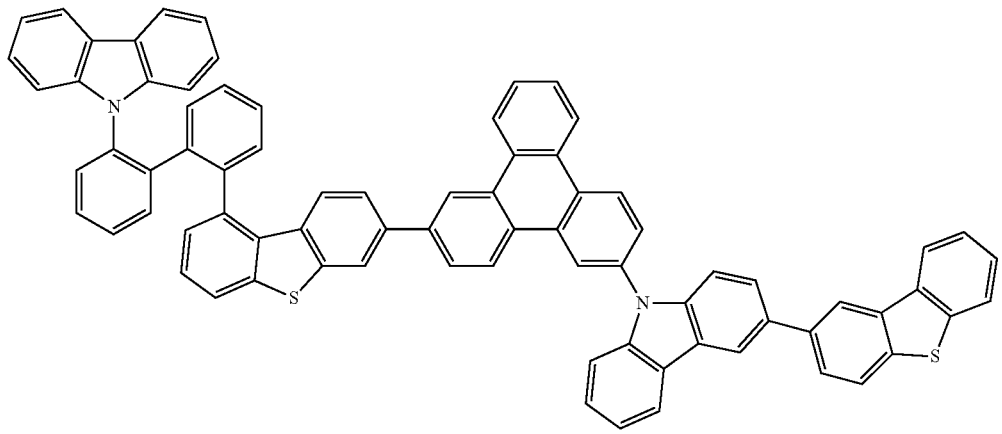
H-44
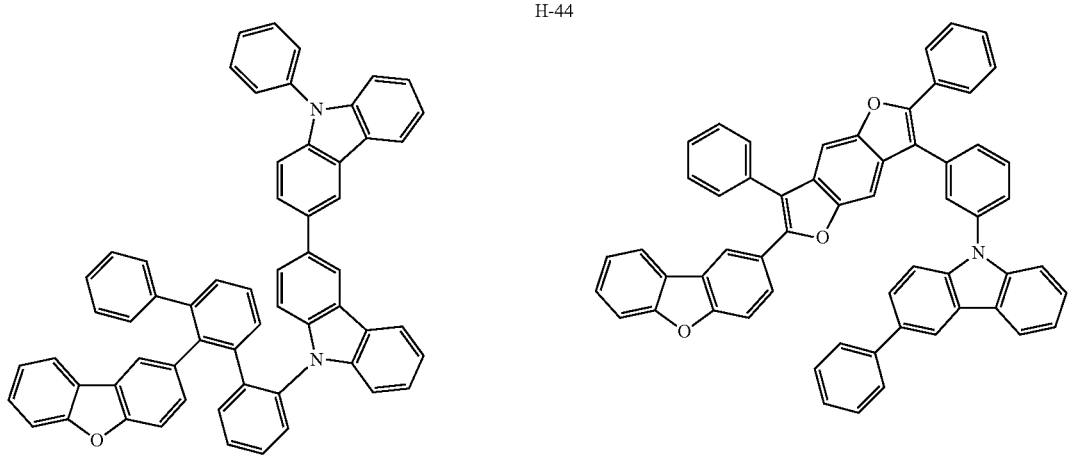
H-45
H-46
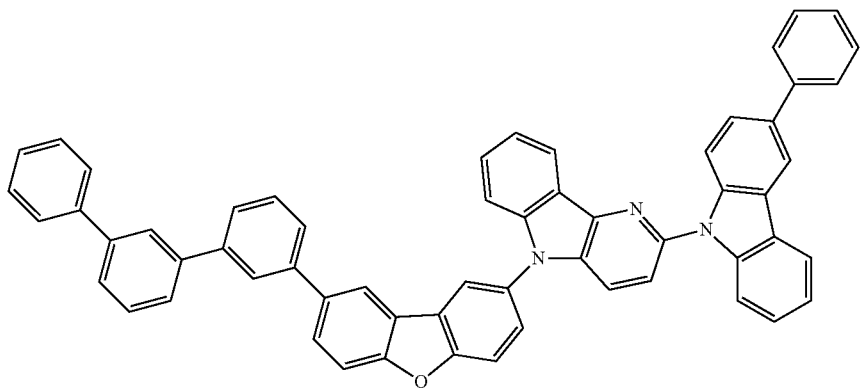
H-47
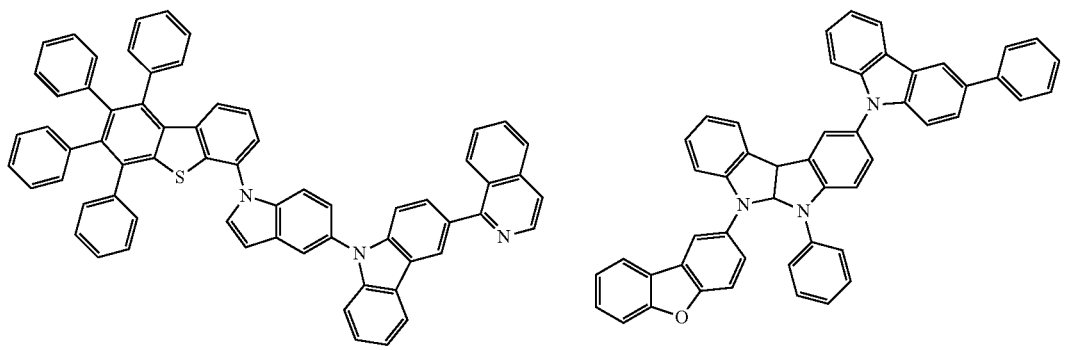
H-48

-continued
H-49
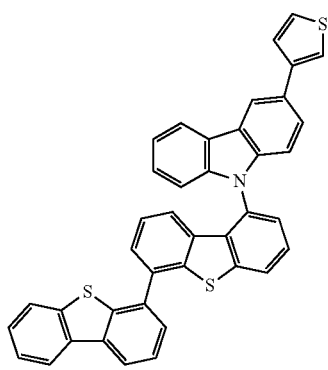
H-50
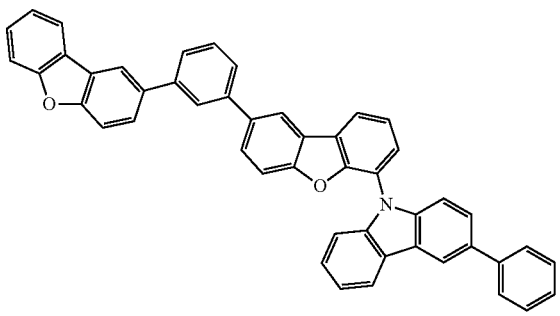
H-51
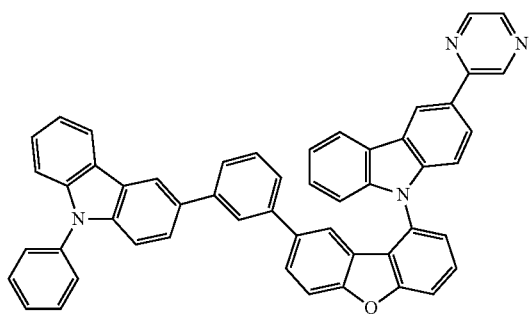
H-52
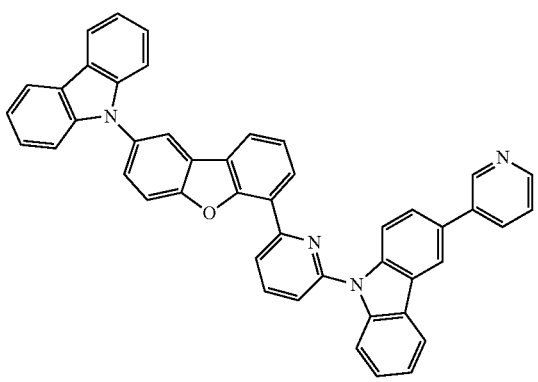
H-53
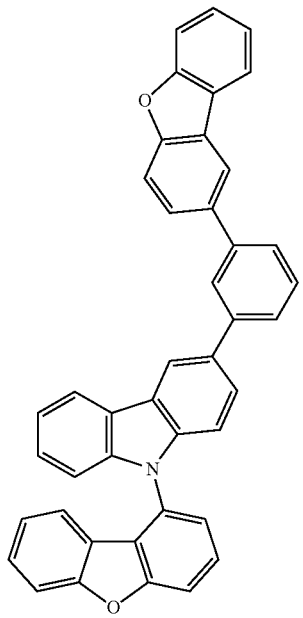

-continued
H-54
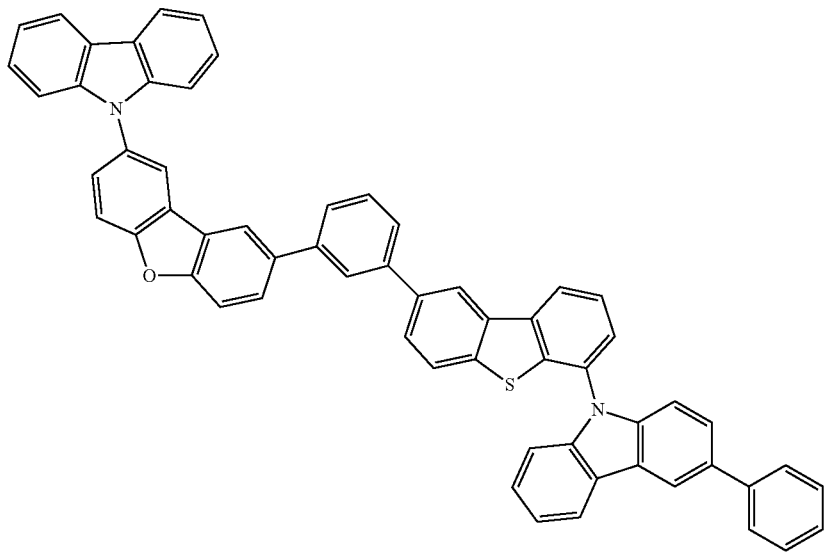
H-55
H-56
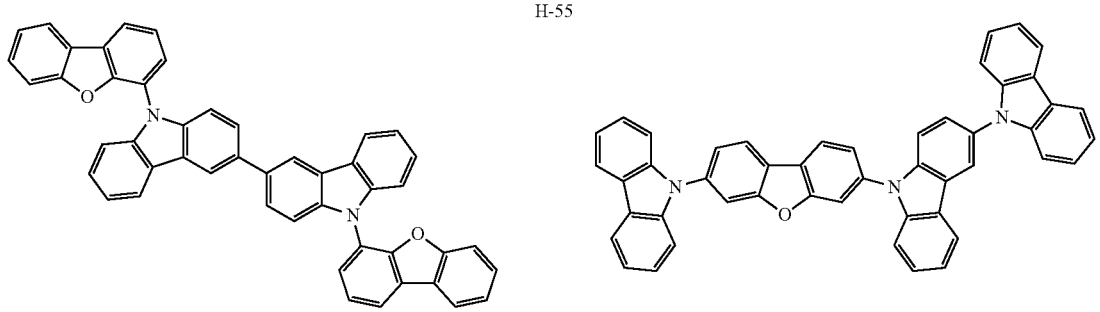
H-57
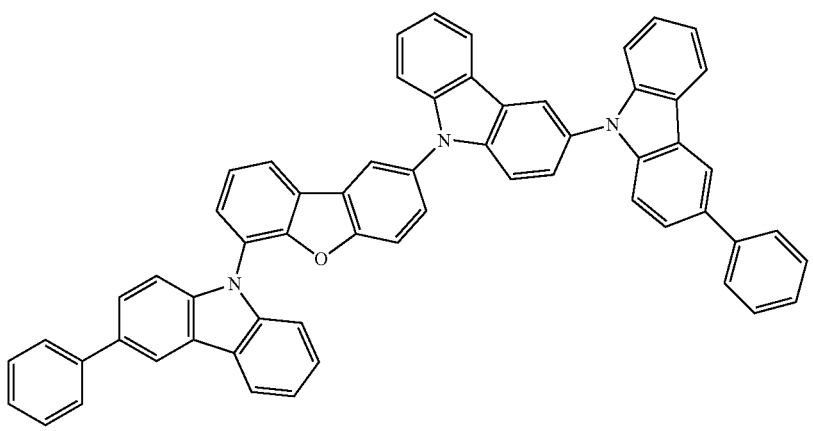
H-58
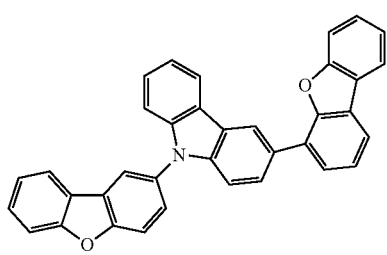
H-59
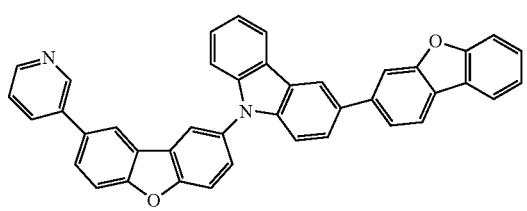

-continued
H-60
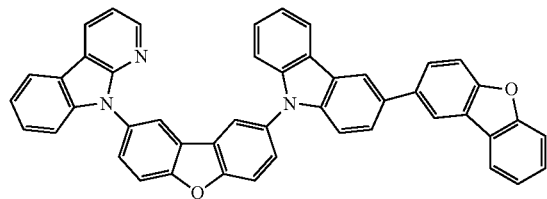
H-61
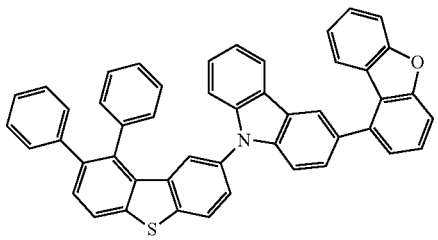
H-62
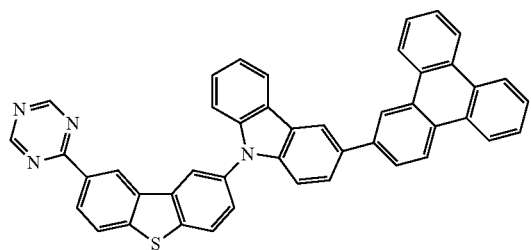
H-63
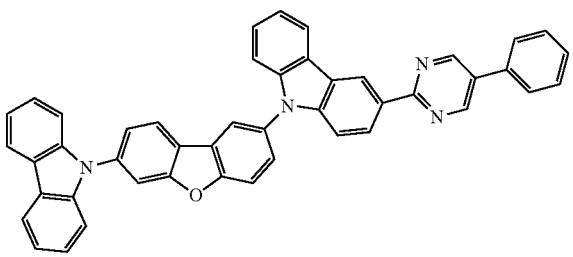
H-64
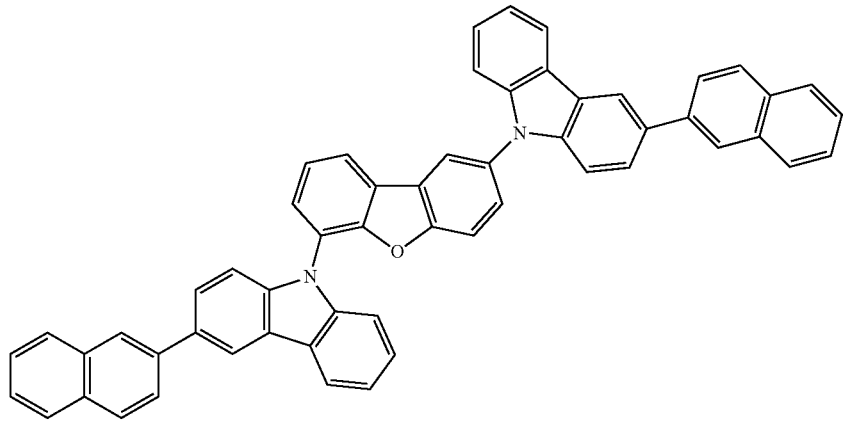
H-65
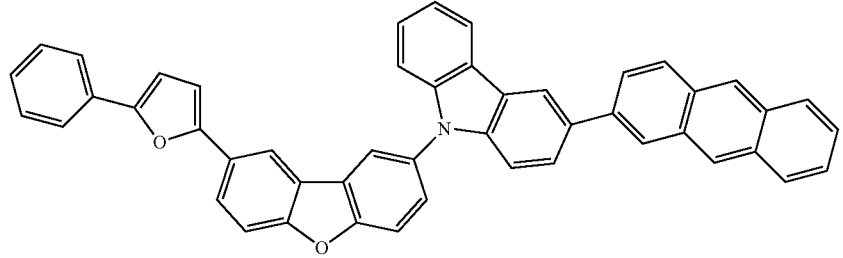
H-66
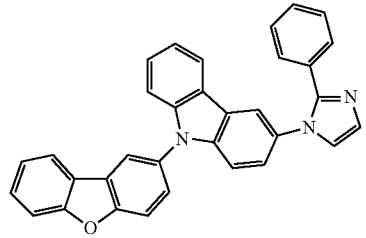
H-67
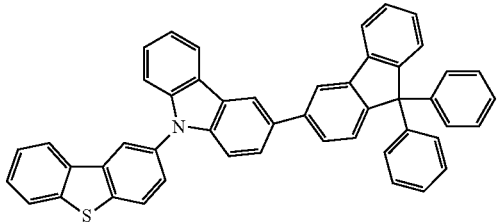

-continued
H-68
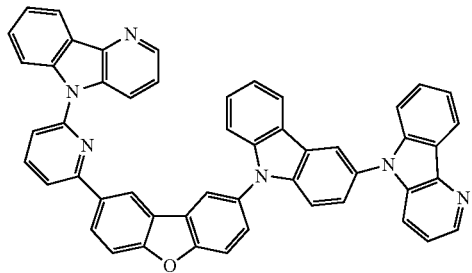
H-69
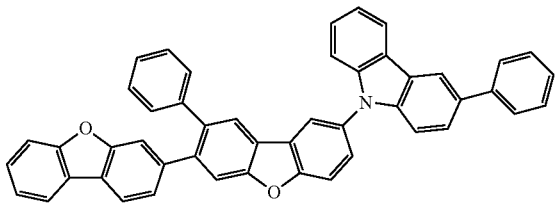
H-70
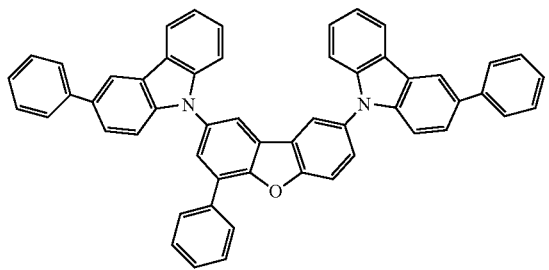
H-71
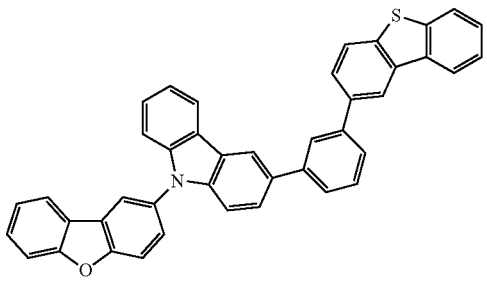
H-72
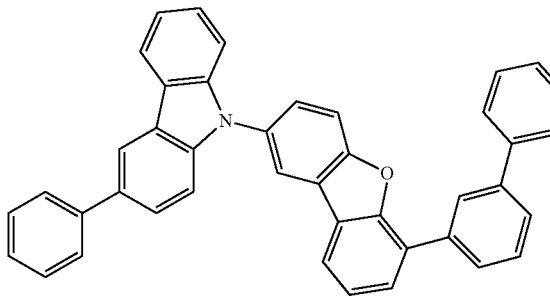
H-73
H-74
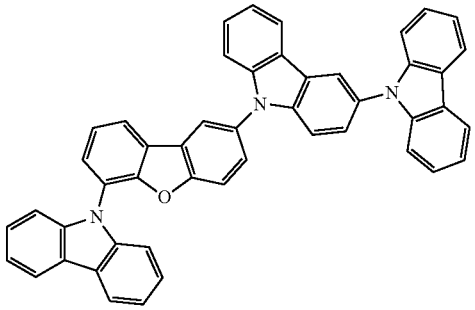
H-75
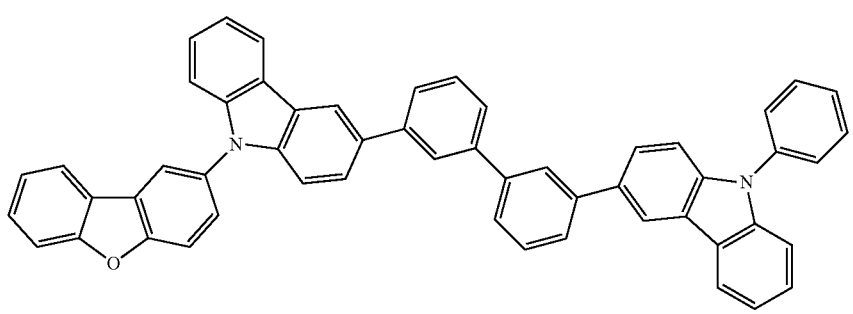

-continued
H-76
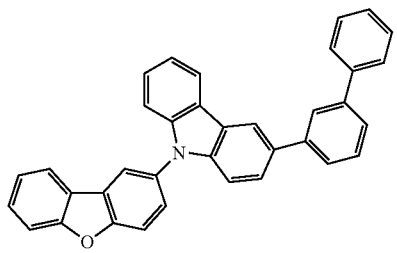
H-77
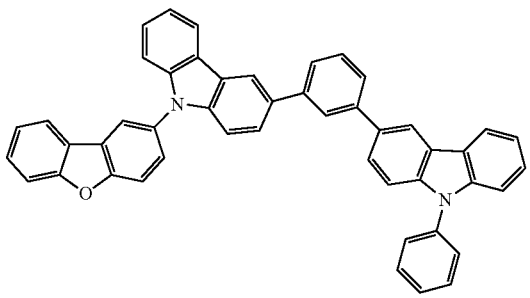
H-78
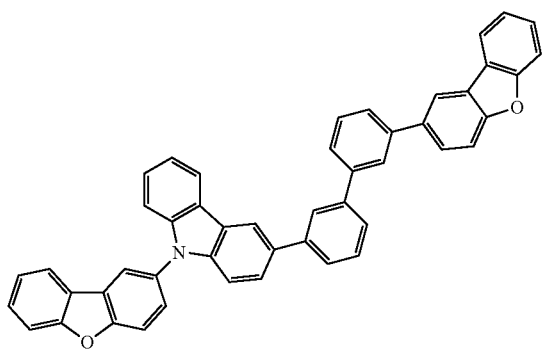
H-79
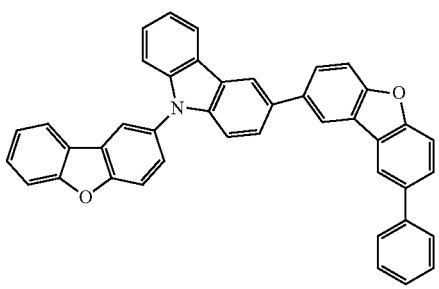
H-80
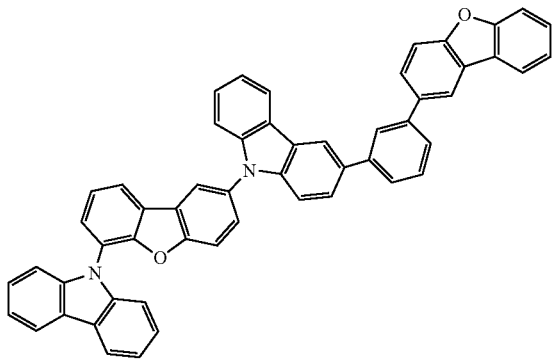
H-81
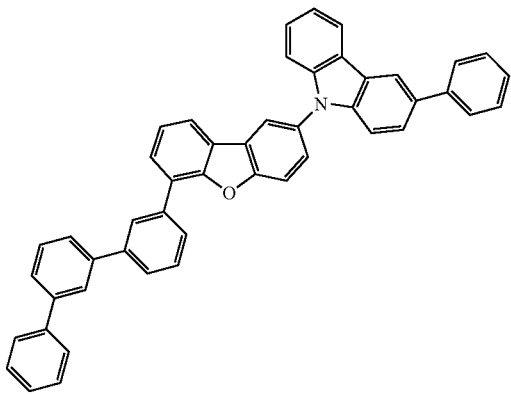
H-82
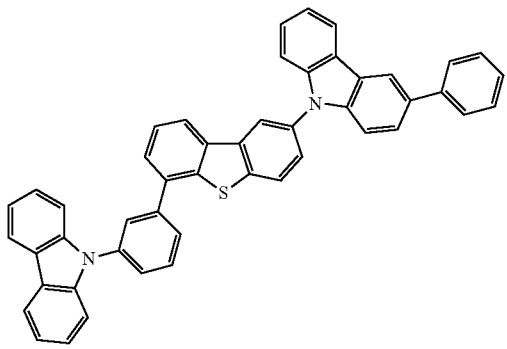
H-83
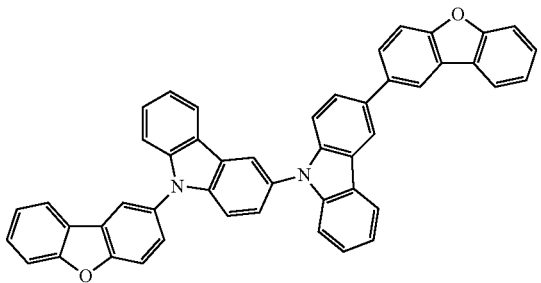

H-84
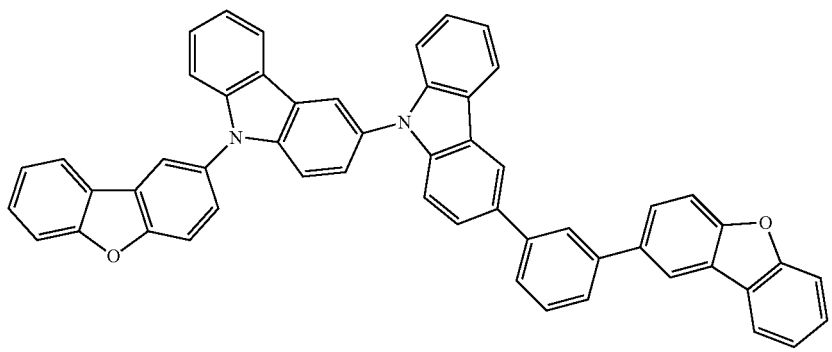
H-85
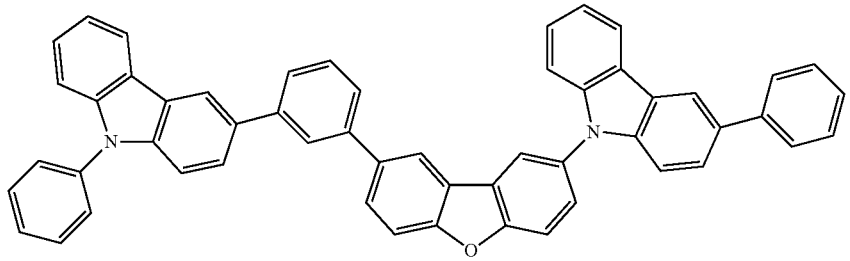
H-86
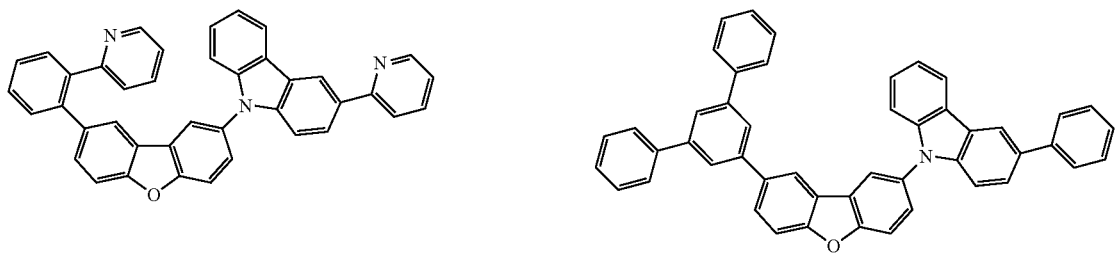
H-87
H-88
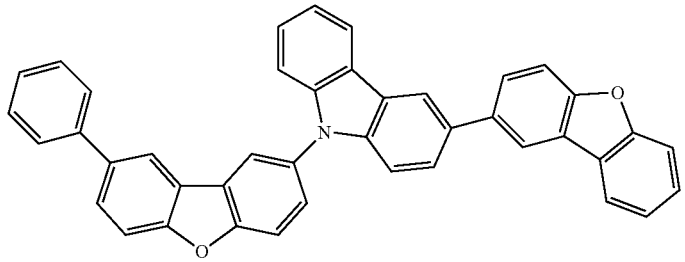
H-89
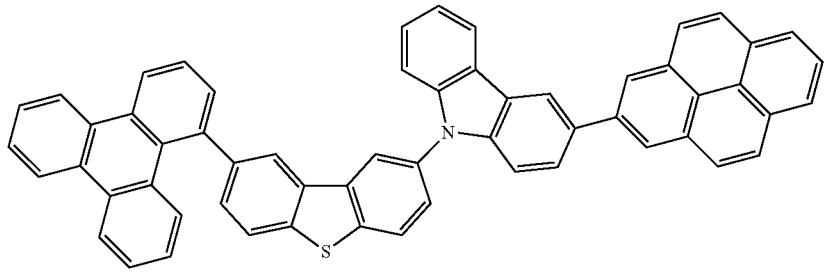

-continued
H-90
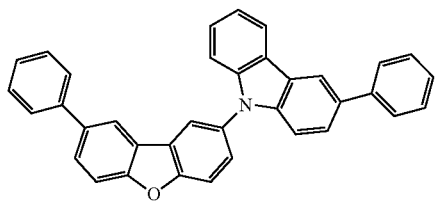
H-91
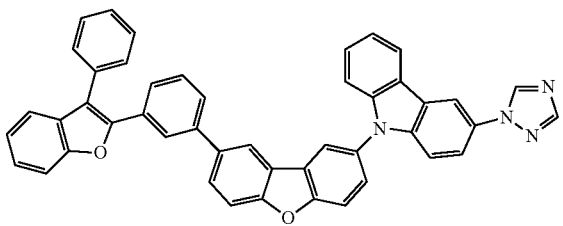
H-92
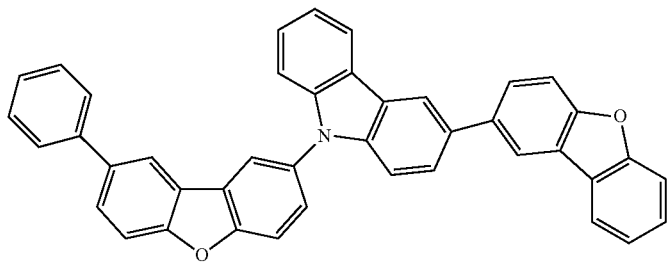
H-93
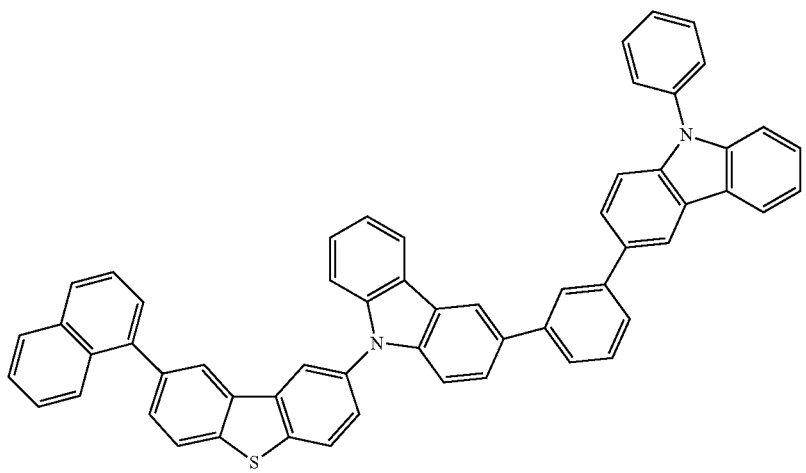
H-94
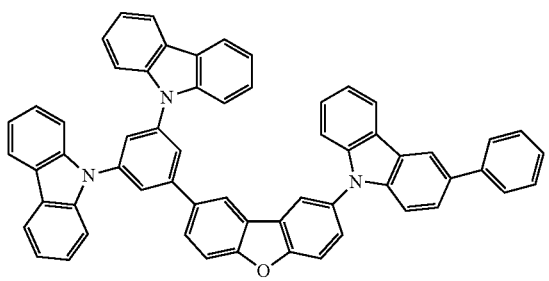
H-95
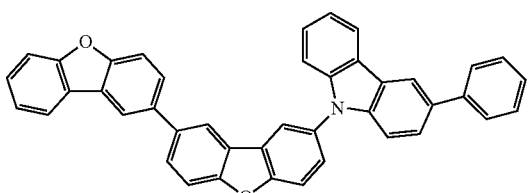
H-96
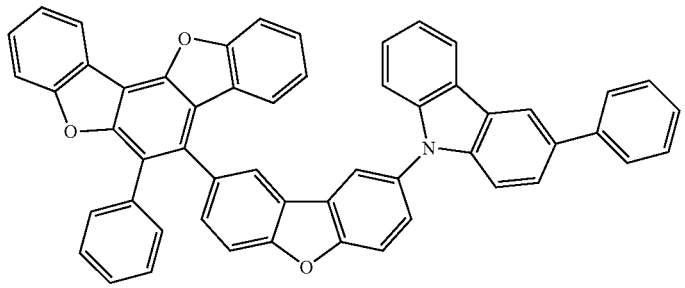

-continued
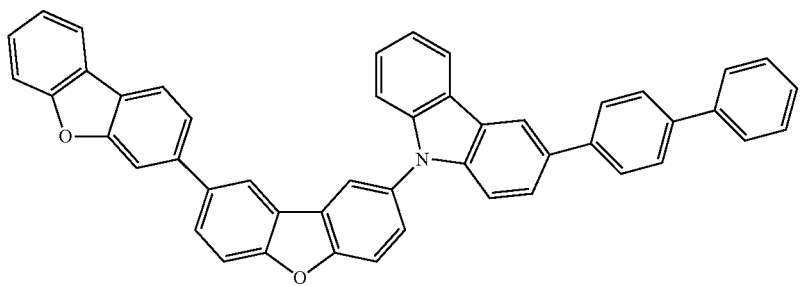
H-97
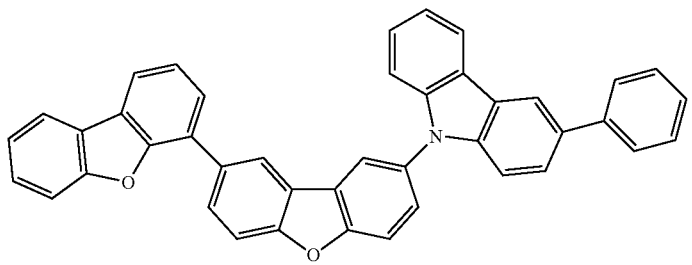
H-98
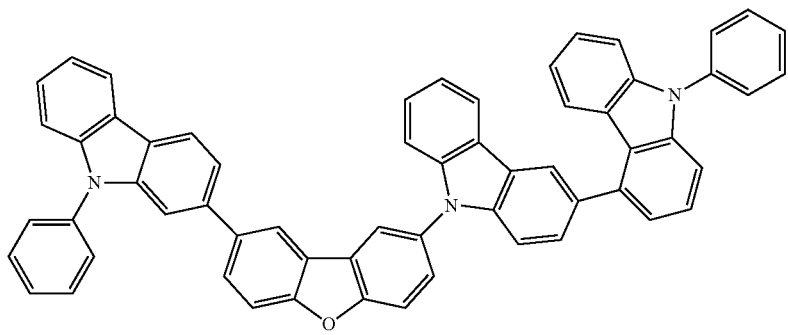
H-99
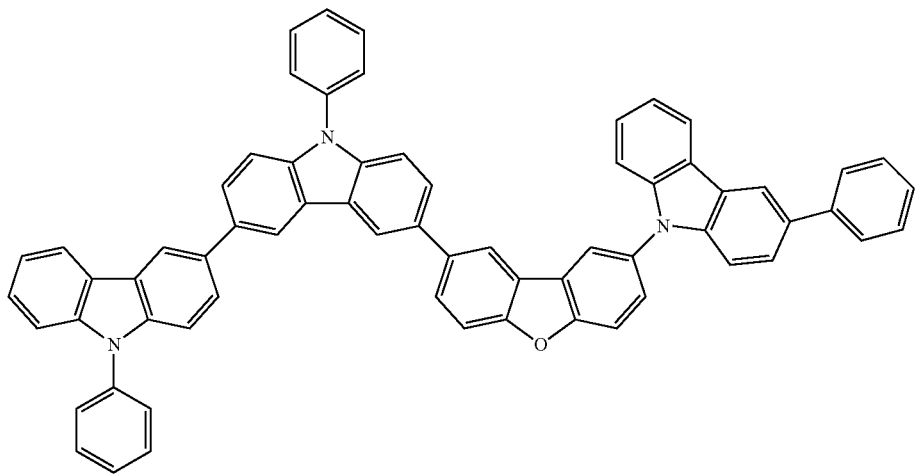
H-100

-continued
H-101
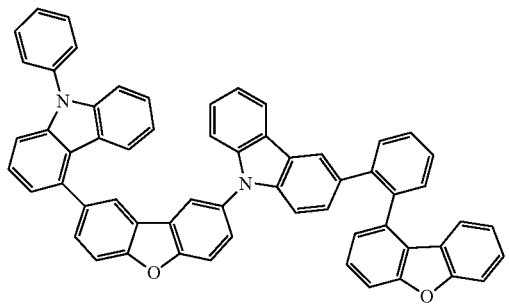
H-102
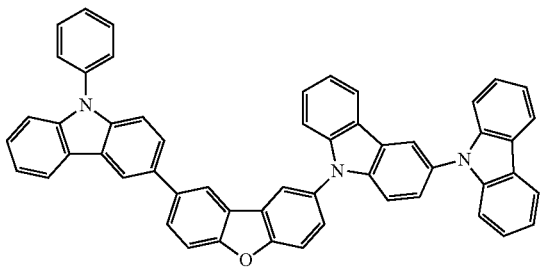
H-103
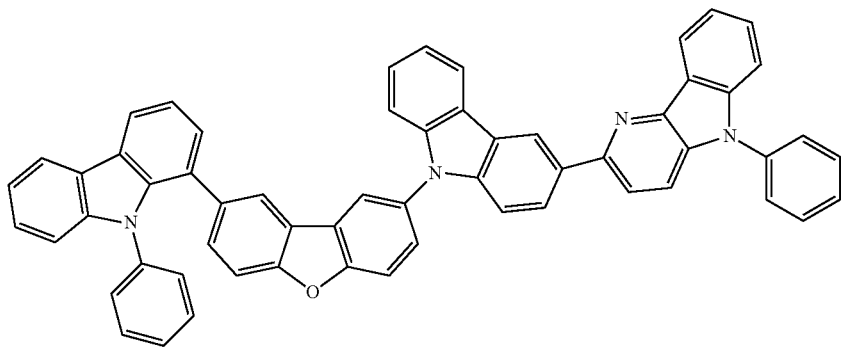
H-104
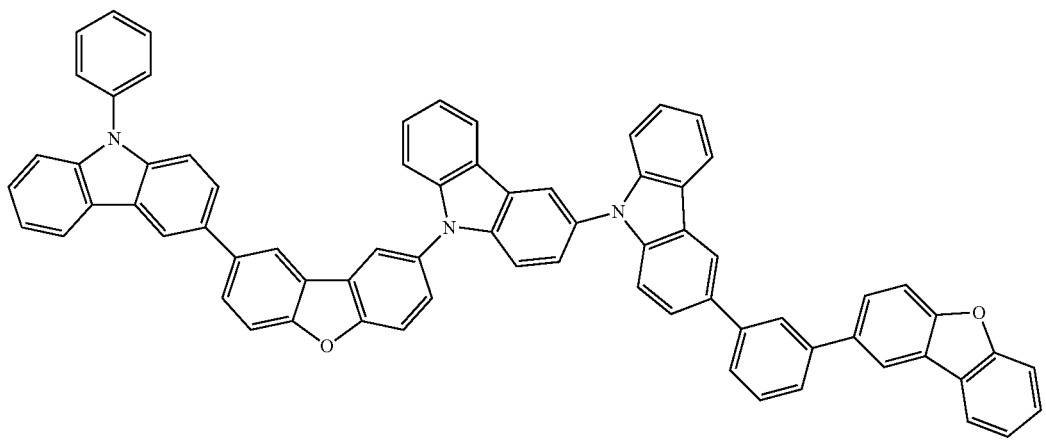
H-105
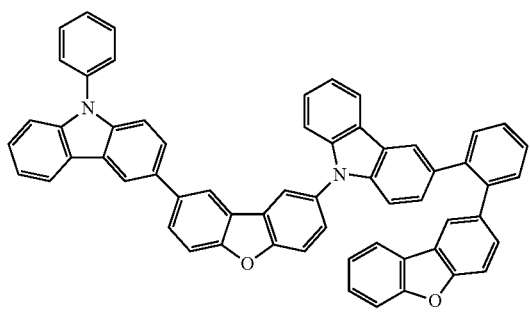
H-106
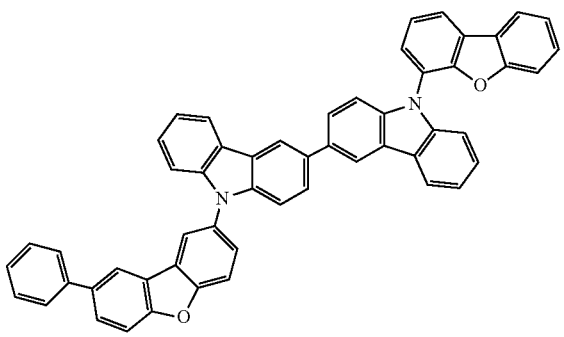

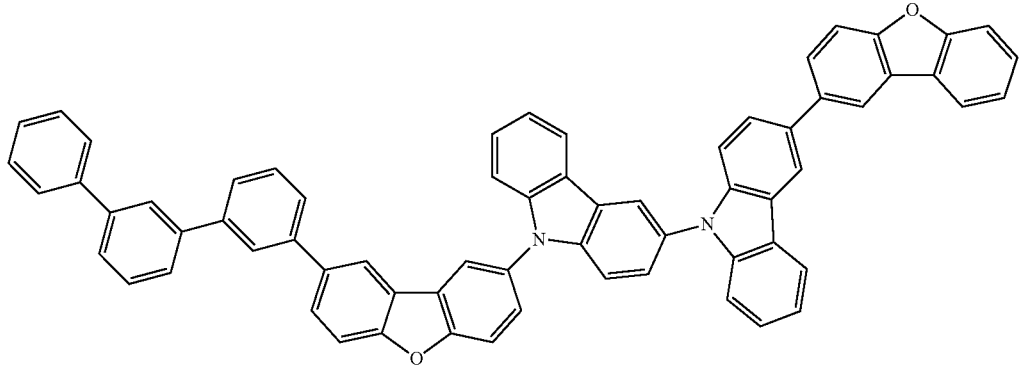
H-107
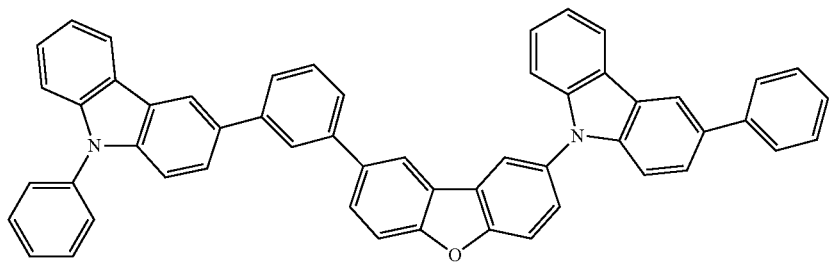
H-108
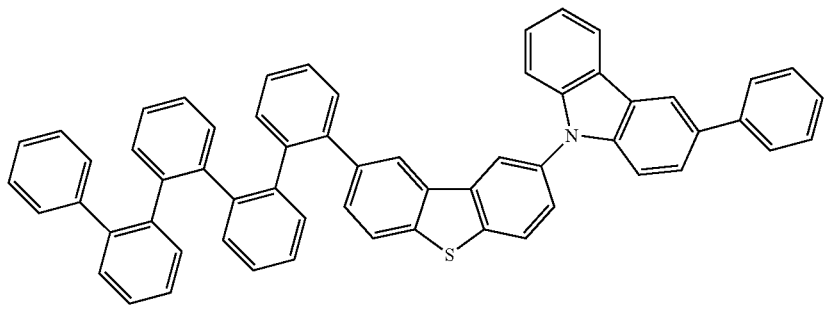
H-109
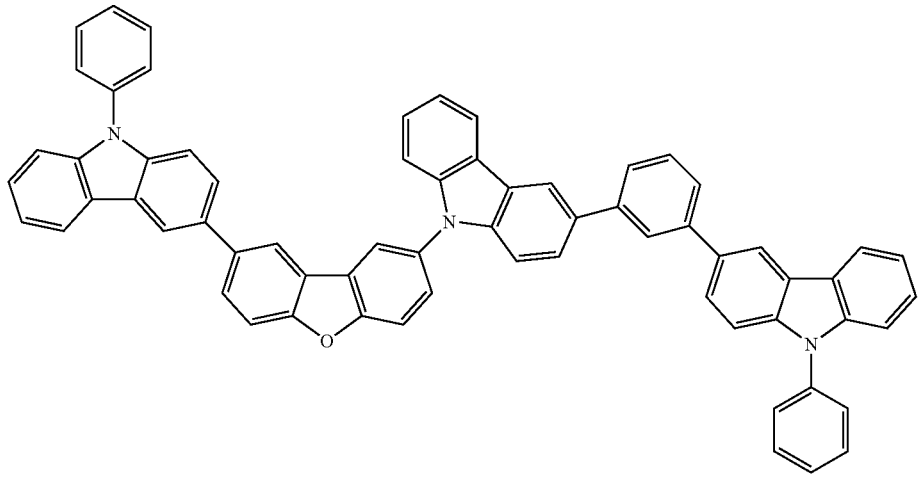
H-110

H-111
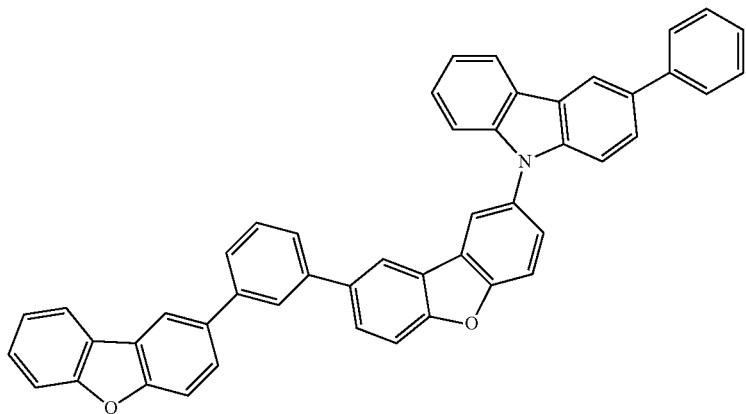
H-112
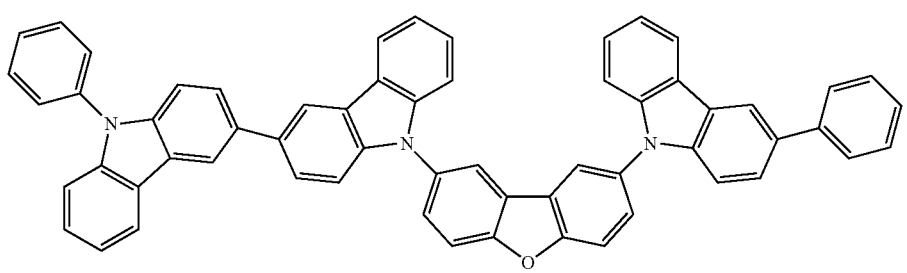
H-113
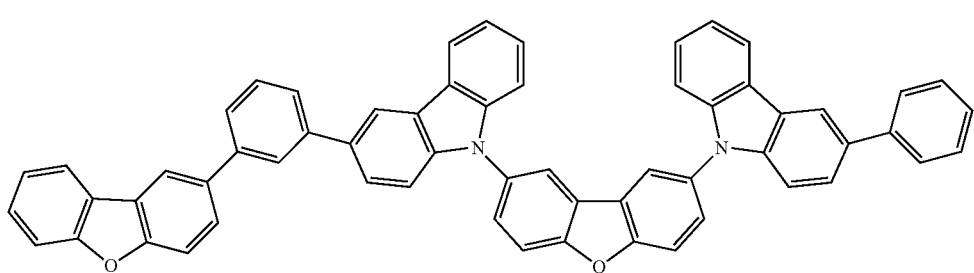
H-114
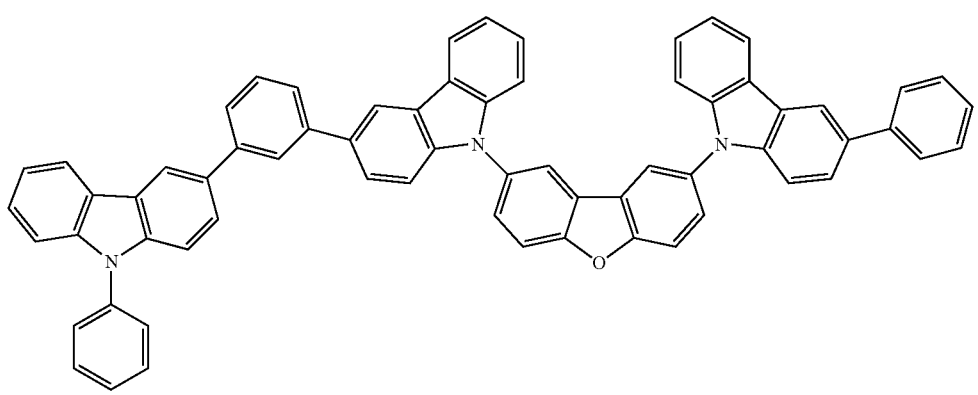
H-115
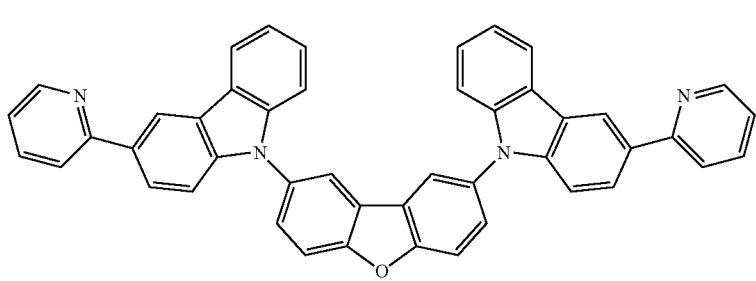

H-116
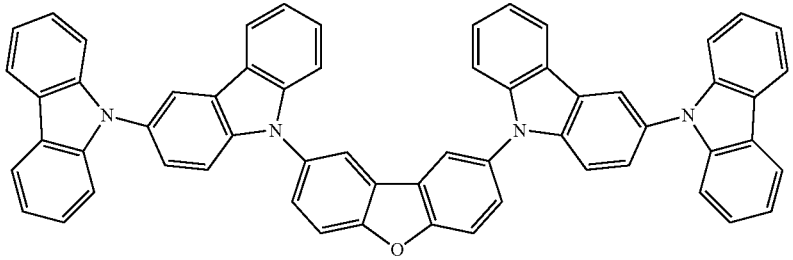
H-117
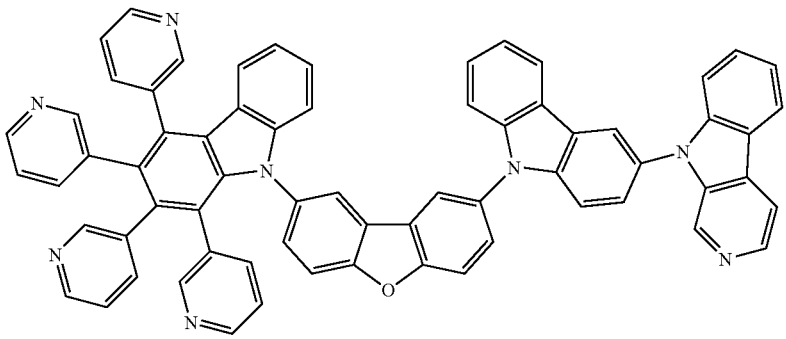
H-118
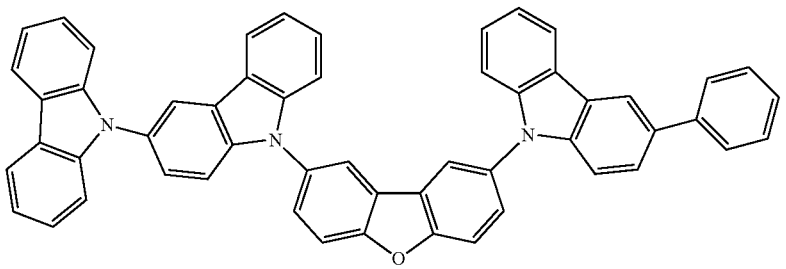
H-119                                    H-120
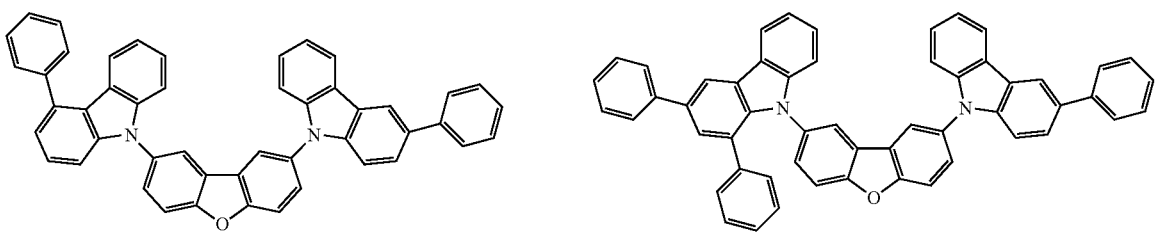
H-121
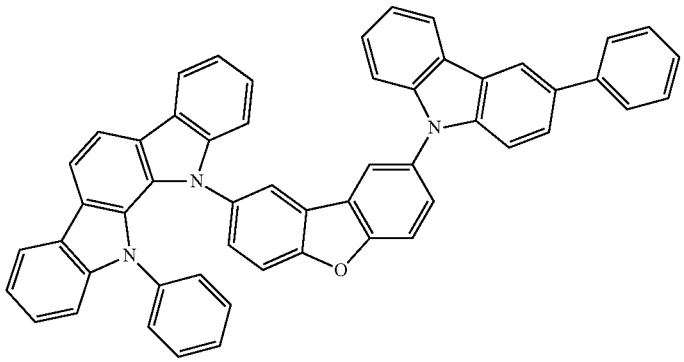

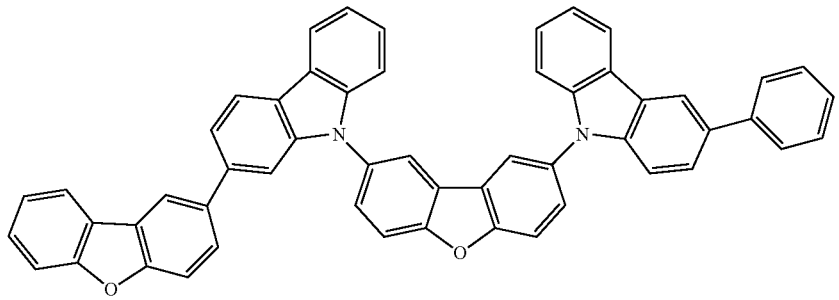
H-122
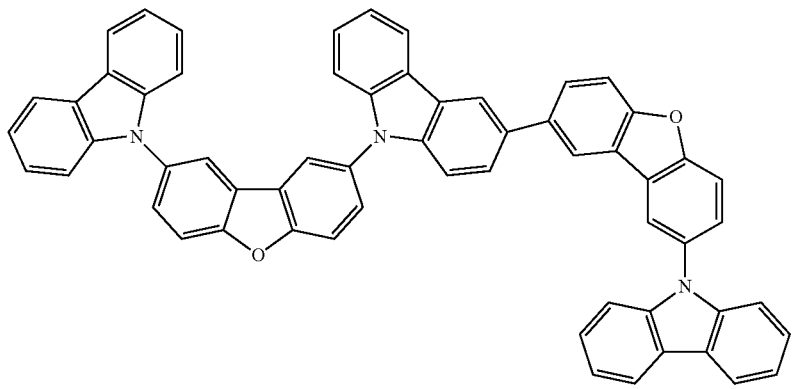
H-123
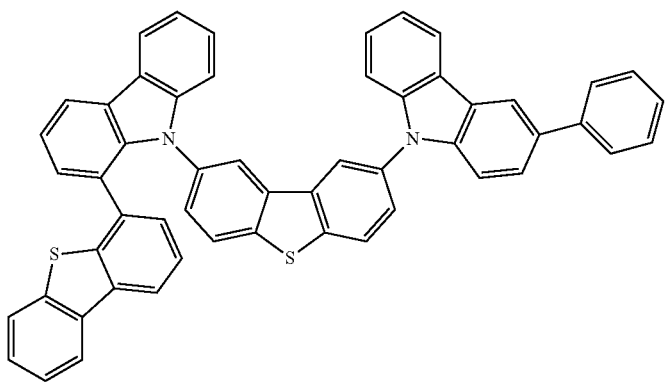
H-124
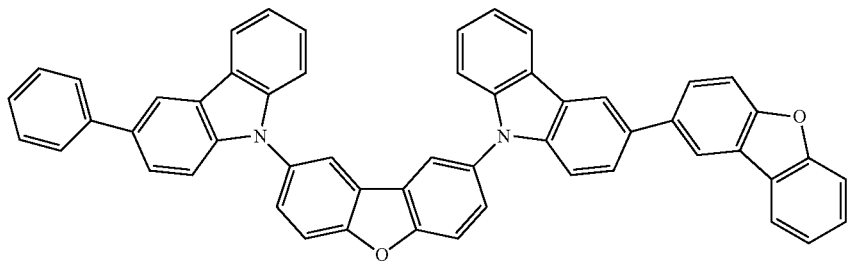
H-125
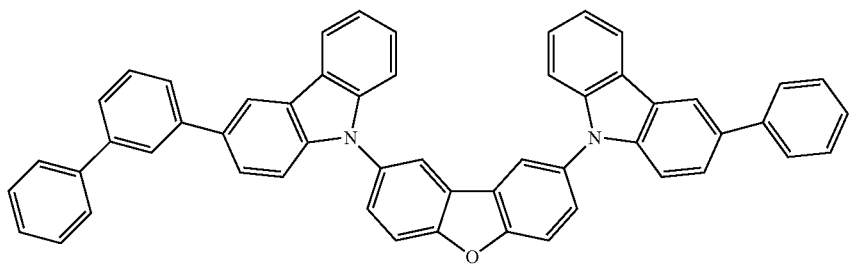
H-126

H-127
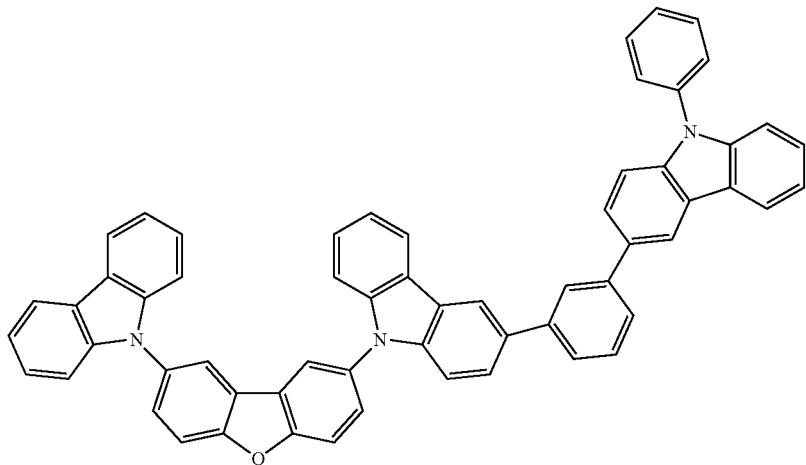
H-128
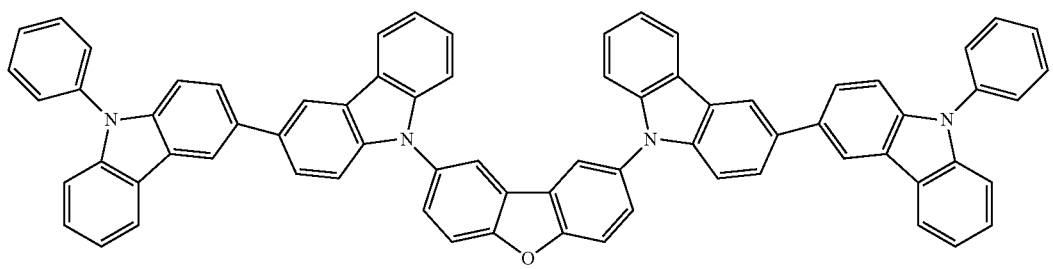
H-129
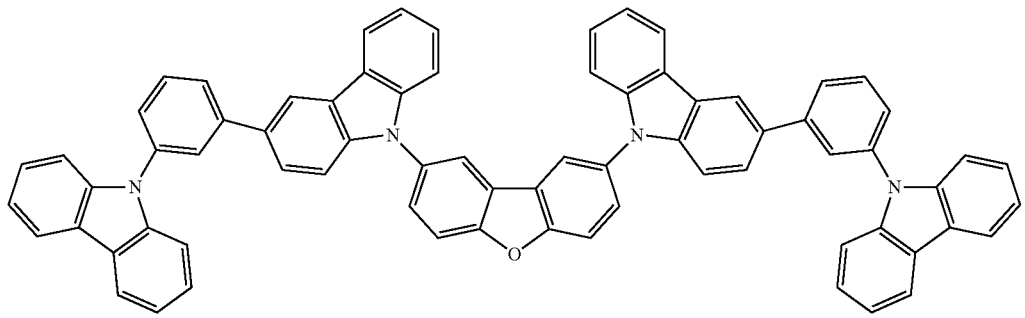
H-130
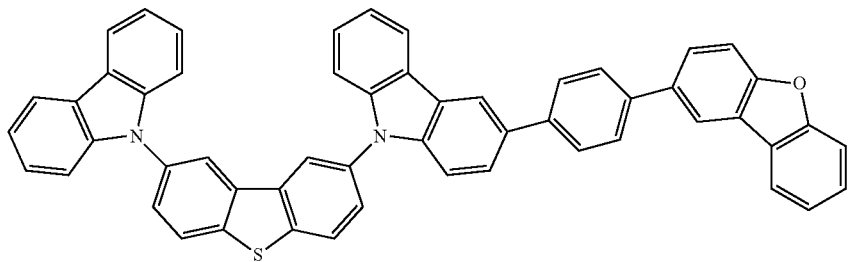

-continued
H-131
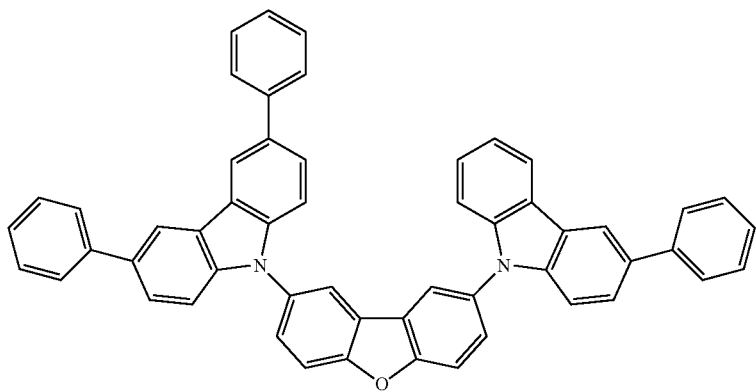
H-132
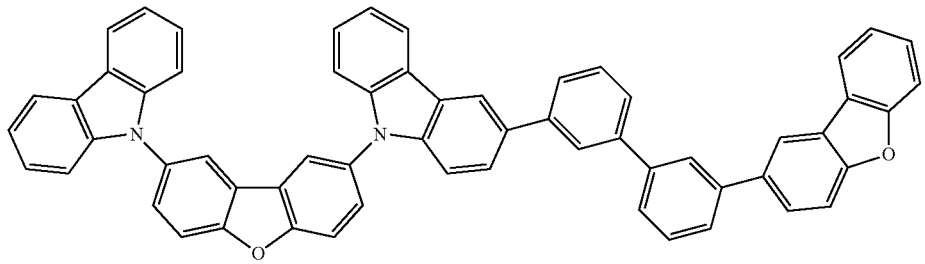
H-133
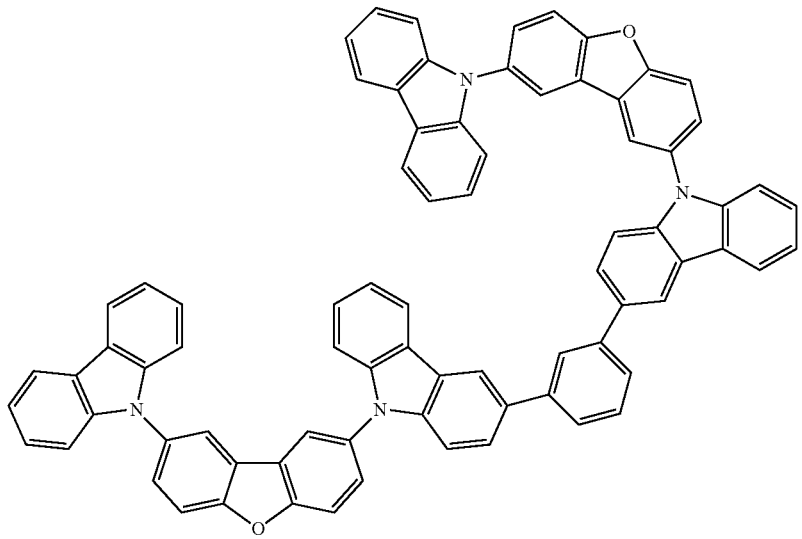
H-134
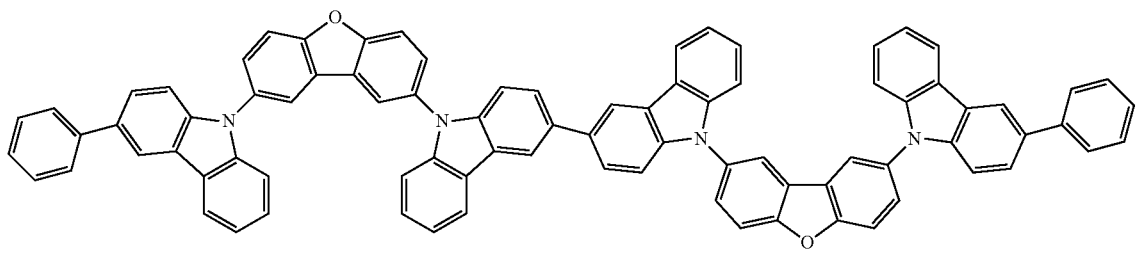

H-135
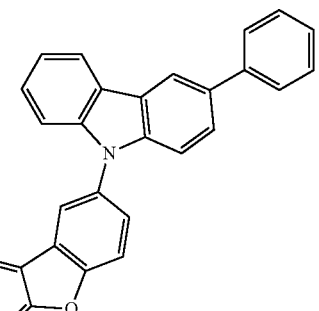
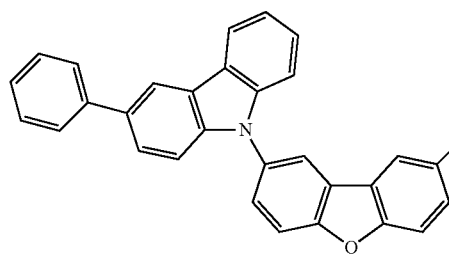
H-136
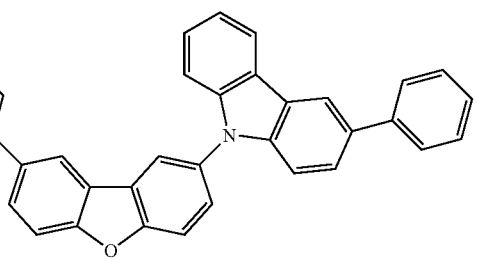
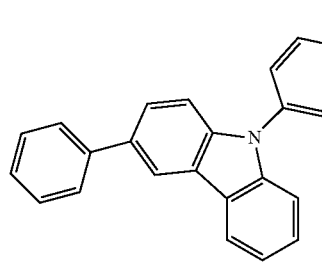
H-137
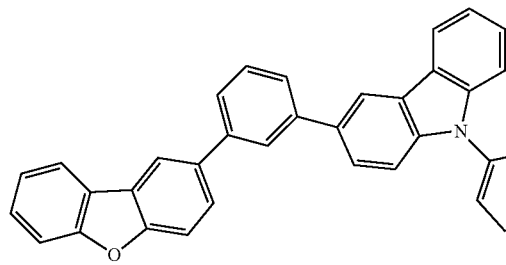
H-138
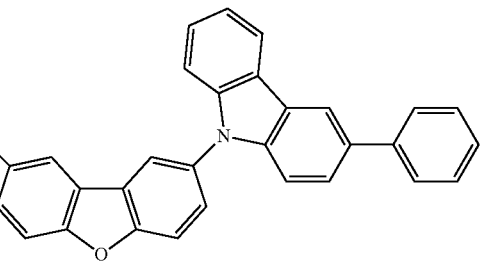

-continued

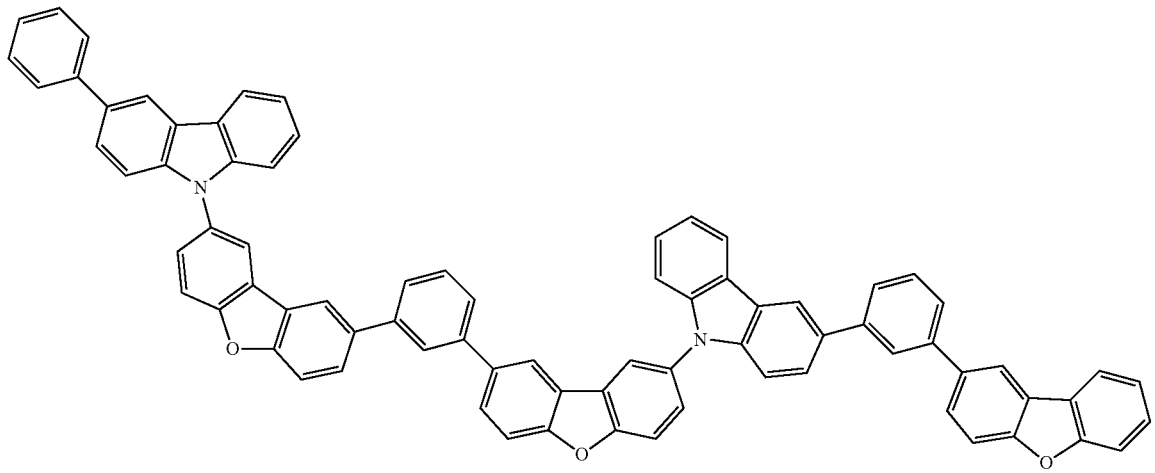

H-139

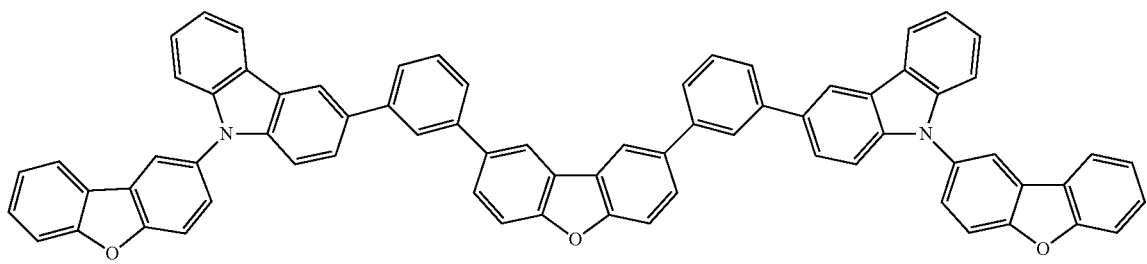

H-140

Synthetic Examples

The synthetic examples of the compounds represented by Formulas (H1) to (H4) are shown below, but the present invention shall not be restricted to them. Among the specific examples of the compounds described above, the synthetic methods of H-12, H-19 and H-29 are explained below as the examples thereof.

«Synthesis of Exemplified Compound H-12»

H-12 can be synthesized according to the following scheme.

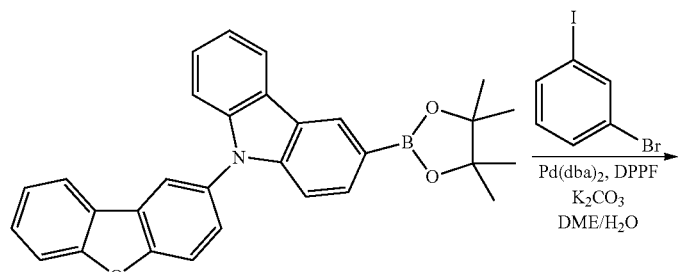

Intermediate 1

-continued

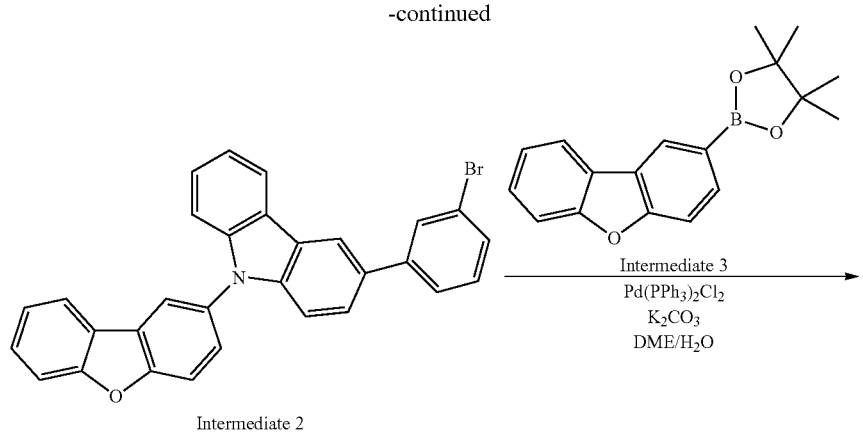

Intermediate 2

Intermediate 3
Pd(PPh$_3$)$_2$Cl$_2$
K$_2$CO$_3$
DME/H$_2$O

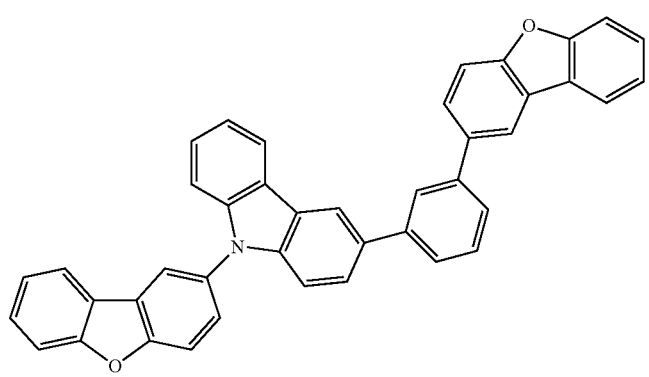

H-12

Synthesis of Intermediate 2:

A flask was charged with 5.0 g (10.9 mmol) of an intermediate 1, 3.1 g (10.9 mmol) of 1,3-iodobromobenzene and 3.0 g (21.7 mmol) of potassium carbonate under nitrogen flow, and 20 mL of ethylene glycol dimethyl ether and 5 mL of water were added thereto, followed by stirring the mixture for 10 minutes. Bis(dibenzylideneacetone)palladium 0.6 g (1.04 mmol) and 1,1'-bis(diphenylphosphino)ferrocene 0.6 g (1.08 mmol) were added thereto, and the mixture was refluxed for 3 hours by heating. The reaction liquid was left cooling down to room temperature, and then water was added thereto. The mixture was extracted with ethyl acetate, and the extract was concentrated under reduced pressure. The resulting crude product was refined by means of silica gel chromatography to obtain 3.6 g (yield: 68%) of an intermediate 2. The structure thereof was confirmed by a nuclear magnetic resonance spectrum and a mass spectrum.

«Synthesis of Exemplified Compound H-12»

A flask was charged with 1.6 g (3.28 mmol) of the intermediate 2, 1.16 g (3.93 mmol) of an intermediate 3 and 1.12 g (8.2 mmol) of potassium carbonate under nitrogen flow, and 12 mL of ethylene glycol dimethyl ether and 3 mL of water were added thereto, followed by stirring the mixture for 10 minutes. Dichlorobis(triphenylphosphine)palladium (II) 230 mg (0.328 mmol) was added thereto, and the mixture was refluxed for 3 hours by heating. The reaction liquid was left cooling down to room temperature, and then water was added thereto. The mixture was extracted with ethyl acetate, and the extract was concentrated under reduced pressure. The resulting crude product was refined by means of silica gel chromatography to obtain 1.17 g (yield: 62%) of an exemplified compound H-12. The structure thereof was confirmed by a nuclear magnetic resonance spectrum and a mass spectrum. A compound obtained by further refining the above compound by sublimation was used for preparing an organic EL device described later.

1H-NMR (400 MHz, THF-d8)

Measuring apparatus: JEOL JNM-AL400 (400 MHz), manufactured by JEOL Ltd.

Assignment of spectra (chemical shift δ, peak shape, proton number)

7.32 to 7.58 (m, 9H), 7.61 (d, J=7.8 Hz, 2H), 7.67 (td, J=5.9 Hz, 2.9 Hz, 4H), 7.75 (t, J=7.8 Hz, 1H), 7.79 to 7.83 (m, 2H), 7.97 (d, J=7.8 Hz, 1H), 8.02 to 8.04 (m, 2H), 8.16 (d, J=2.0 Hz, 1H), 8.25 (d, J=4.9 Hz, 2H), 8.48 (d, J=2.0 Hz, 1H)

MS (ES+): m/z=576 (M+1)$^+$

«Synthesis of Exemplified Compound H-19»

H-19 can be synthesized according to the following scheme.

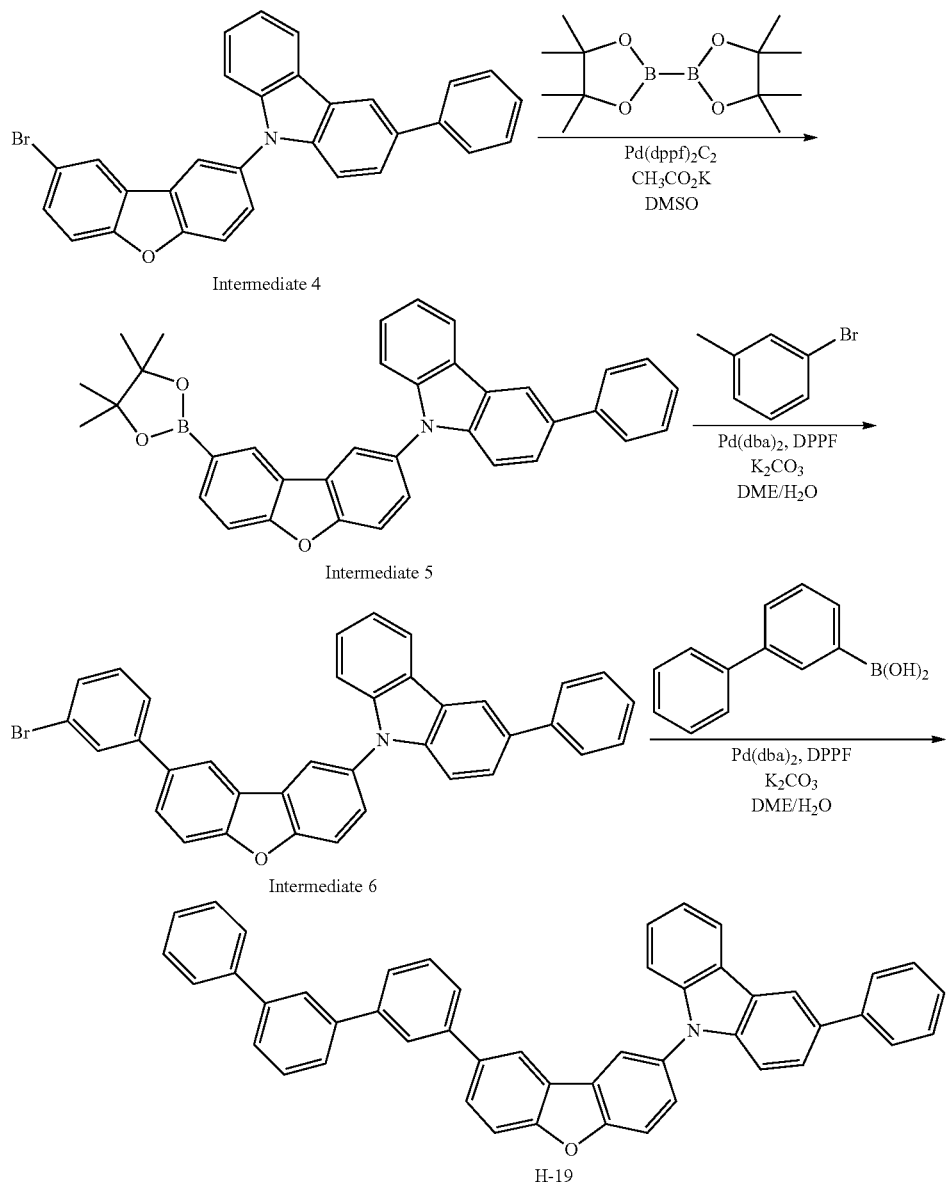

Synthesis of Intermediate 5:

A flask was charged with 10 g (20.5 mmol) of an intermediate 4, 5.7 g (22.5 mmol) of bis(pinacolate)diboron and 2.6 g (26.5 mmol) of potassium acetate under nitrogen flow, and 70 mL of dimethyl sulfoxide was added thereto and stirred. A 1,1'-bis(diphenylphosphino)ferrocene-palladium (II) dichloride-dichloromethane complex 1.6 g (1.97 mmol) was added thereto, and the mixture was heated at 90° C. for 6 hours. The reaction liquid was left cooling down to room temperature, and then water was added thereto. The mixture was extracted with ethyl acetate, and the extract was concentrated under reduced pressure. The resulting crude product was refined by means of silica gel chromatography to obtain 6.2 g (yield: 51%) of an intermediate 5. The structure thereof was confirmed by a nuclear magnetic resonance spectrum and a mass spectrum.

Synthesis of Intermediate 6:

A flask was charged with 6.2 g (11.6 mmol) of the intermediate 5, 3.3 g (11.6 mmol) of 1,3-iodobromobenzene and 3.0 g (21.7 mmol) of potassium carbonate under nitrogen flow, and 20 mL of ethylene glycol dimethyl ether and 5 mL of water were added thereto, followed by stirring the mixture for 10 minutes. Bis(dibenzylideneacetono)palladium 0.6 g (1.04 mmol) and 1,1'-bis(diphenylphosphine) ferrocene 0.6 g (1.08 mmol) were added thereto, and the mixture was refluxed for 3 hours by heating. The reaction liquid was left cooling down to room temperature, and then water was added thereto. The mixture was extracted with ethyl acetate, and the extract was concentrated under reduced pressure. The resulting crude product was refined by means of silica gel chromatography to obtain 4.2 g (yield: 64%) of an intermediate 6. The structure thereof was confirmed by a nuclear magnetic resonance spectrum and a mass spectrum.

Synthesis of Exemplified Compound H-19:

A flask was charged with 2.0 g (3.5 mmol) of the intermediate 6, 0.77 g (3.85 mmol) of 3-biphenylboronic acid and 1.0 g (7.24 mmol) of potassium carbonate under nitrogen flow, and 8 mL of ethylene glycol dimethyl ether and 2 mL of water were added thereto, followed by stirring the mixture for 10 minutes. Bis(dibenzylideneacetone)palladium 0.2 g (3.5 mmol) and 1,1'-bis(diphenylphosphine)ferrocene 0.2 g (3.5 mmol) were added thereto, and the mixture was refluxed for 3 hours by heating. The reaction liquid was left cooling down to room temperature, and then water was added thereto. The mixture was extracted with ethyl acetate, and the extract was concentrated under reduced pressure. The resulting crude product was refined by means of silica gel chromatography to obtain 1.6 g (yield: 72%) of an exemplified compound H-19. The structure thereof was confirmed by a nuclear magnetic resonance spectrum. A compound obtained by further refining the above compound by sublimation was used for preparing an organic EL device described later.

1H-NMR (400 MHz, THF-d8)

Measuring apparatus: JEOL JNM-AL400 (400 MHz), manufactured by JEOL Ltd.

Assignment of spectra (chemical shift δ, peak shape, proton number)

7.31 to 7.37 (m, 3H), 7.41 to 7.52 (m, 7H), 7.53 (t, J=7.3 Hz, 1H), 7.59 (t, J=7.3 Hz, 2H), 7.64 to 7.69 (m, 7H), 7.74 (dd, J=7.8 Hz, 3.9 Hz, 3H), 7.83 (dd, J=8.8 Hz, 3.9 Hz, 2H), 7.87 (s, 1H), 7.92 (s, 1H), 8.21 to 8.23 (m, 3H), 8.39 (s, 1H)

«Synthesis of Exemplified Compound H-29»

H-29 can be synthesized according to the following scheme.

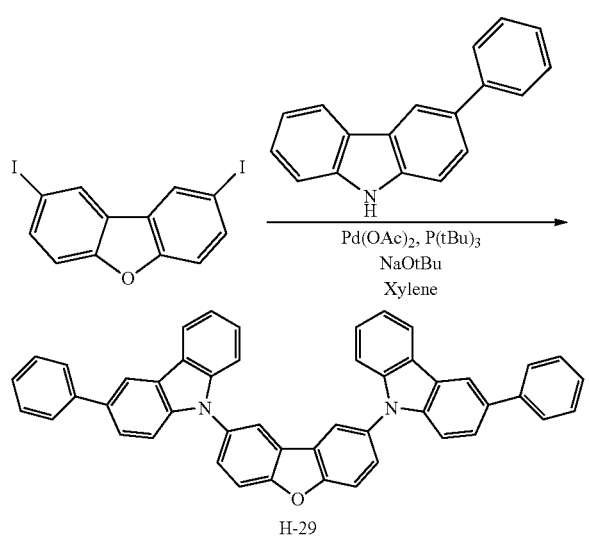

H-29

Palladium acetate 160 mg (0.714 mmol) was added to 1.2 mL of a 50% xylene solution of tributylphosphine under nitrogen flow, and the mixture was stirred at room temperature for 30 minutes. Subsequently, 50 mL of dehydrated xylene, 2.0 g (4.76 mmol) of 2,7-diiododibenzofuran, 2.78 g (11.4 mmol) of 3-phenylcarbazole and 1.37 g (14.3 mmol) of sodium t-butyrate were added thereto, and the mixture was refluxed for 5 hours by heating. The reaction liquid was left cooling down and then filtered through celite, and water was added to the filtrate, followed by extracting the aqueous phase with ethyl acetate. The organic layer was repeatedly washed with water and concentrated under reduced pressure. The resulting crude product was refined by means of silica gel chromatography to obtain 1.0 g (yield: 32%) of an exemplified compound H-29. The structure thereof was confirmed by a nuclear magnetic resonance spectrum. A compound obtained by further refining the above compound by sublimation was used for preparing an organic EL device described later.

1H-NMR (400 MHz, THF-d8)

Measuring apparatus: JEOL JNM-AL400 (400 MHz), manufactured by JEOL Ltd.

Assignment of spectra (chemical shift δ, peak shape, proton number)

7.30 to 7.26 (m, 4H), 7.39 to 7.49 (m, 10H), 7.66 (dd, J=8.3 Hz, 2.0 Hz, 2H), 7.71 to 7.74 (m, 6H), 7.90 (d, J=8.8 Hz, 2H), 8.16 (d, J=2.0 Hz, 2H), 8.20 (d, J=7.8 Hz, 2H), 8.37 (d, J=1.5 Hz, 2H).

«Layer Constitution of Organic EL Device»

The layer constitution of the organic EL device of the present invention shall be explained. In the organic EL device of the present invention, the preferred specific examples of the layer constitution of various organic layers interposed between an anode and a cathode are shown below, but the present invention shall not be restricted to them.

(i) Anode/light-emitting layer unit/electron-transporting layer/cathode (ii) Anode/hole-transporting layer/light-emitting layer unit/electron-transporting layer/cathode (iii) Anode/hole-transporting layer/light-emitting layer unit/hole-blocking layer/electron-transporting layer/cathode (iv) Anode/hole-transporting layer/light-emitting layer unit/electron-transporting layer/electron-injecting layer/cathode (v) Anode/hole-injecting layer/hole-transporting layer/light-emitting layer unit/electron-transporting layer/electron-injecting layer/cathode (vi) Anode/hole-transporting layer/light-emitting layer unit/hole-blocking layer/electron-transporting layer/electron-injecting layer/cathode (vii) Anode/hole-injecting layer/hole-transporting layer/light-emitting layer unit/hole-blocking layer/electron-transporting layer/electron-injecting layer/cathode An electron-blocking layer can also be used as the blocking layer in addition to the hole-blocking layer.

The light-emitting layer unit (hereinafter referred to merely as the light-emitting layer) may be a single light-emitting layer or may comprise plural light-emitting layers. Further, the light-emitting layer unit may have a non-light-emitting intermediate layer between the plural light-emitting layers, and it may comprise a multiphoton unit constitution in which the above intermediate layer is a charge-generating layer. In the above case, the charge-generating layer includes a conductive inorganic compound layer comprising ITO (indium tin oxide), IZO (indium zinc oxide), $ZnO_2$, TiN, ZrN, HfN, $TiO_x$, $VO_x$, CuI, InN, GaN, $CuAlO_2$, $CuGaO_2$, $SrCu_2O_2$, $LaB_6$, $RuO_2$ and the like, a double layer film such as $Au/Bi_2O_3$ and the like, a multi-layer film such as $SnO_2/Ag/SnO_2$, ZnO/Ag/ZnO, $Bi_2O_3/Au/Bi_2O_3$, $TiO_2/TiN/TiO_2$, $TiO_2/ZrN/TiO_2$ and the like, a conductive organic matter layer comprising fullerenes such as C60 and the like, oligothiophene and the like, a conductive organic compound layer comprising metal phthalocyanines, non-metal phthalocyanines, metal porphyrins and the like.

The light-emitting layer in the organic EL device of the present invention is preferably a white light-emitting layer, and lighting equipments prepared by using it are preferred. That is, the organic EL device emits preferably a white light.

The various layers constituting the organic EL device of the present invention shall be explained below.

«Light-Emitting Layer»

The light-emitting layer is a layer emitting light by recombination of an electron and a hole which are injected from an electrode or an electron-transporting layer and a hole-transporting layer, and a part emitting light may be an inside of the light-emitting layer or an interface between the light-emitting layer and a layer adjacent thereto.

The total of the film thicknesses of the light-emitting layers shall not specifically be restricted, and it is controlled to a range of preferably 2 nm to 5 μm, more preferably 2 nm to 200 nm and particularly preferably 5 nm to 100 nm from the viewpoints of obtaining a homogeneity of the film, preventing a high voltage unnecessary in emitting light from being applied and enhancing a stability of a luminescent color against an operating current.

The light-emitting layer can be prepared by using a luminous dopant and a host compound each described later to form a layer by, for example, a vacuum deposition method, a wet method (called as well a wet process and including, for example, a spin coating method, a casting method, a die coating method, a blade coating method, a roll coating method, an ink jet method, a printing method, a spray coating method, a curtain coating method, an LB method (a Langmuir Blodgett method) and the like) and the like. When the phosphorescent organic metal complex prescribed in the present invention is used as a material for the light-emitting layer, the film is formed preferably by the wet process.

The light-emitting layer in the organic EL device of the present invention contains a luminous dopant (phosphorescent luminous dopant (called as well a phosphorescent dopant and a phosphorescent luminous dopant group), a fluorescent dopant and the like) compound and a luminous host compound. At least one luminous dopant is the blue phosphorescent organic metal complex represented by Formula (1) or (2) described above, and at least one luminous host compound is the compound represented by Formula (H1) described above.

(1) Luminous Dopant Compound:

The luminous dopant compound (called the luminous dopant, the dopant compound or merely the dopant) shall be explained. Fluorescent dopants (called as well fluorescent compounds) and phosphorescent dopants (called as well phosphorescent luminous bodies, phosphorescent compounds, phosphorescent luminous compounds and the like) can be used as the luminous dopant.

(1.1) Phosphorescent Dopant (Called as Well a Phosphorescent Luminous Dopant):

The phosphorescent dopant which can be used in the present invention shall be explained.

The phosphorescent dopant according to the present invention is a compound which is observed to emit light in an excited triplet state. To be specific, it is defined as a compound which emits a phosphorescent light at room temperature (25° C.) and which has a phosphorescence quantum yield of 0.01 or more at 25° C., and the preferred phosphorescence quantum yield is 0.1 or more.

The phosphorescence quantum yield described above can be measured by a method described in Experimental Chemistry Course 7, fourth edition, spectroscopy II, p. 398 (edited in 1992, Maruzen). A phosphorescence quantum yield in a solution can be measured by using various solvents, and in the phosphorescent dopant which can be used in the present invention, the phosphorescence quantum yield (0.01 or more) described above is achieved preferably in any of optional solvents.

The principle of emission in the phosphorescent dopant includes two kinds, and one of them is an energy transfer type in which carriers are recombined on a host compound having transported carriers thereon to bring about an excited state of the luminous host compound and in which an energy thereof is transferred to a phosphorescent dopant to thereby obtain emission from the phosphorescent dopant. The other is a carrier trap type in which a phosphorescent dopant works as a carrier trap to recombine carriers on the phosphorescent dopant and in which emission from the phosphorescent dopant is obtained. In both cases, a condition therefor is that an energy in the excited state of the phosphorescent dopant is lower than an energy in the excited state of the host compound.

Also, compounds described in the following patents may be used in combination in the light-emitting layer which can be used in the present invention.

They include, for example, International Publication 00/70655, JP-A 2002-280178, JP-A 2001-181616, JP-A 2002-280179, JP-A 2001-181617, JP-A 2002-280180, JP-A 2001-247859, JP-A 2002-299060, JP-A 2001-313178, JP-A 2002-302671, JP-A 2001-345183, JP-A 2002-324679, International Publication 02/15645, JP-A 2002-332291, JP-A 2002-50484, JP-A 2002-332292, JP-A 2002-83684, JP-A (through PCT) 2002-540572, JP-A 2002-117978, JP-A 2002-338588, JP-A 2002-170684, JP-A 2002-352960, International Publication 01/93642, JP-A 2002-50483, JP-A 2002-1004760, JP-A 2002-173674, JP-A 2002-359082, JP-A 2002-175884, JP-A 2002-363552, JP-A 2002-184582, JP-A 2003-7469, JP-A (through PCT) 2002-525808, JP-A 2003-7471, JP-A (through PCT) 2002-525833, JP-A 2003-31366, JP-A 2002-226495, JP-A 2002-234894, JP-A 2002-235076, JP-A 2002-241751, JP-A 2001-319779, JP-A 2001-319780, JP-A 2002-62824, JP-A 2002-100474, JP-A 2002-203679, JP-A 2002-343572, JP-A 2002-203678 and the like.

(1.2) Fluorescent Dopant (Called as Well a Fluorescent Compound):

The fluorescent dopant includes coumarin base dyes, pyran base dyes, cyanine base dyes, croconium base dyes, squarium base dyes, oxobenzanthracene base dyes, fluorescein base dyes, rhodamine base dyes, pyrylium base dyes, perylene base dyes, stilbene base dyes, polythiophene base dyes, rare earth complex base fluorescent substances and compounds having a high fluorescence quantum yield represented by laser dyes.

Also, the luminous dopants which can be used in the present invention may be used in combination of plural kinds thereof and may be used in combination of the phosphorescent dopants having different structures or in combination of the phosphorescent dopants with the fluorescent dopants.

The specific examples of publicly known phosphorescent dopants which can be preferably used in the present invention are listed below, but it is a matter of course that the present invention shall not be restricted to them.

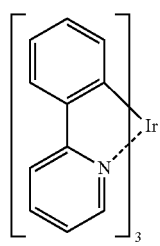 D-1
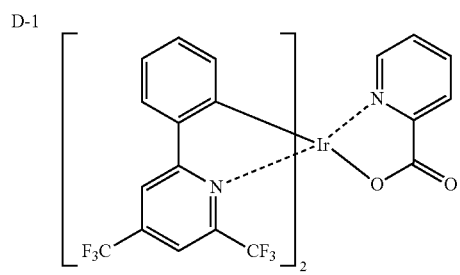 D-2
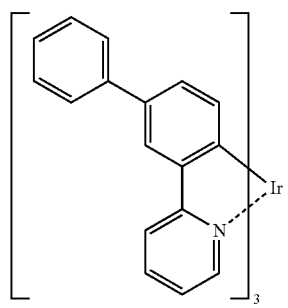 D-3
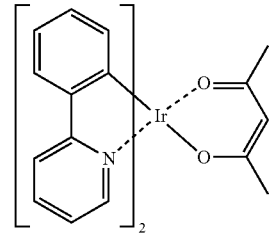 D-4
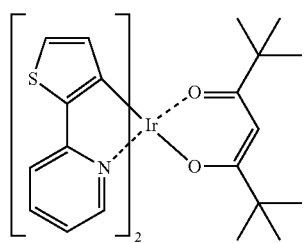 D-5
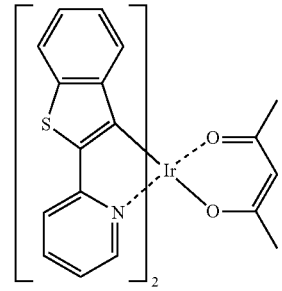 D-6
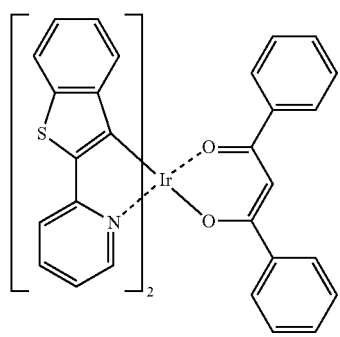 D-7
D-8
D-9
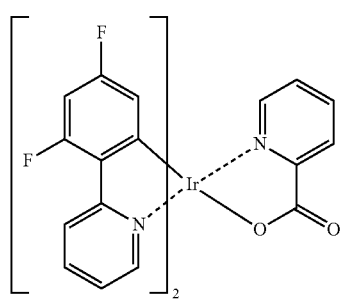
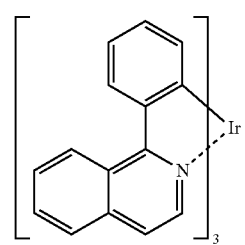 D-10

-continued
D-11
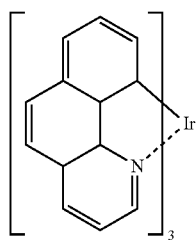
D-12
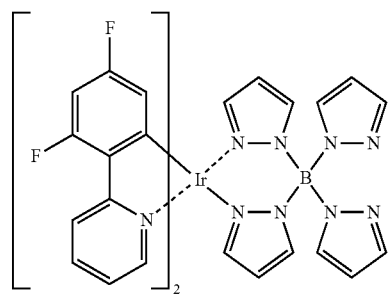
D 13
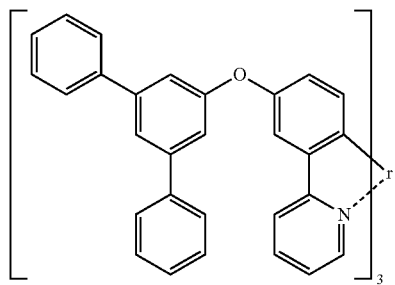
D 14
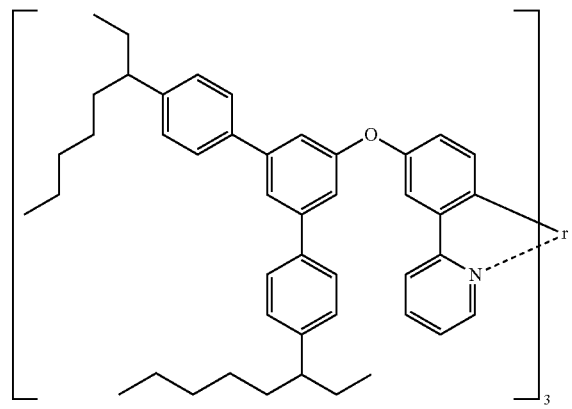
D 15
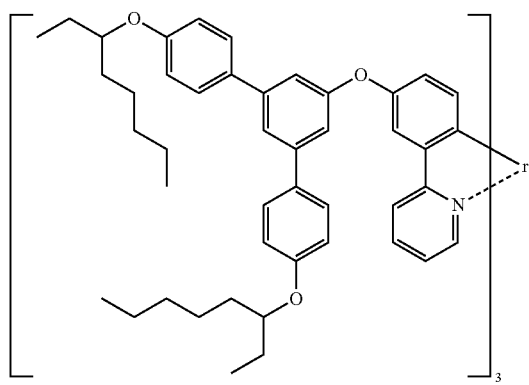
D 16
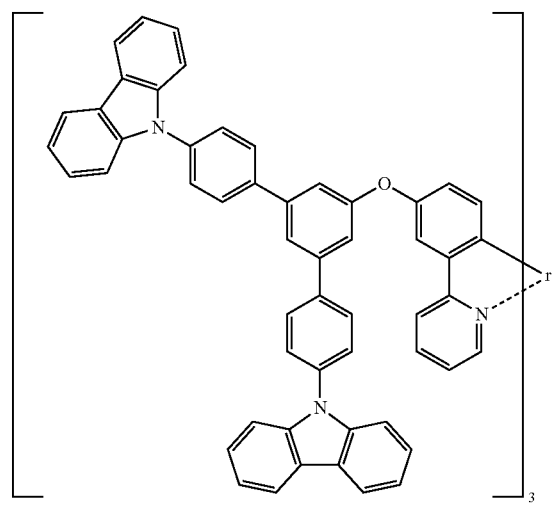

-continued
D 17 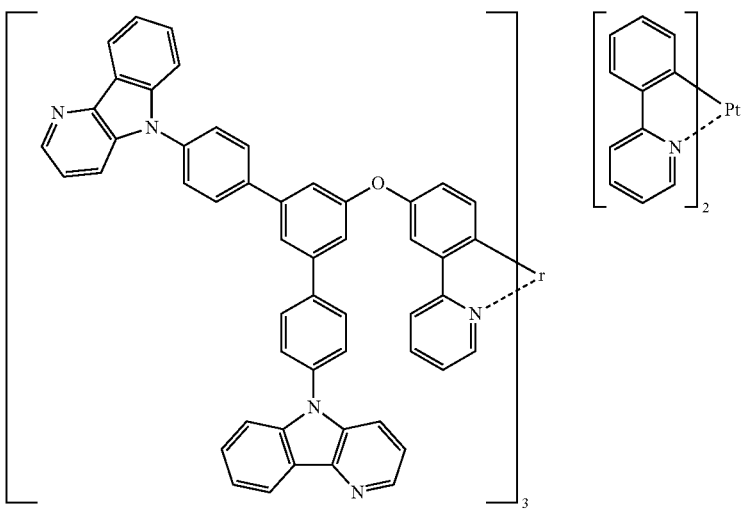 D 18
D 19 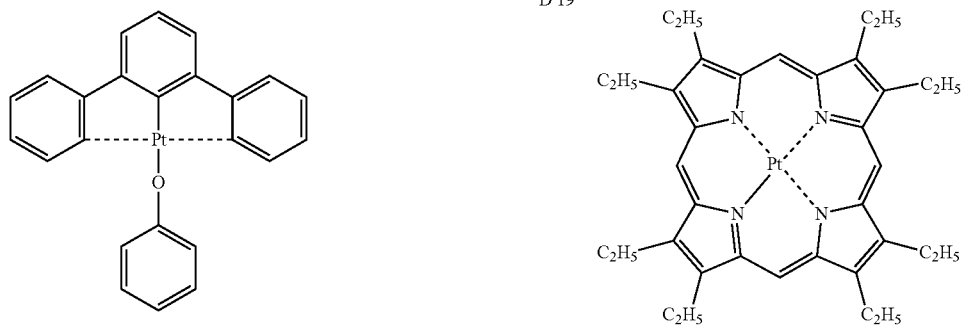 D 20
D 21 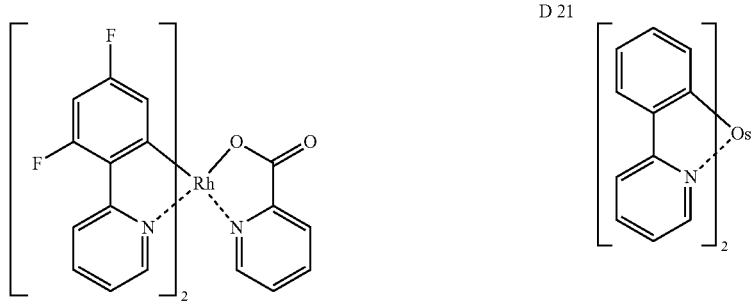 D 22
D 23 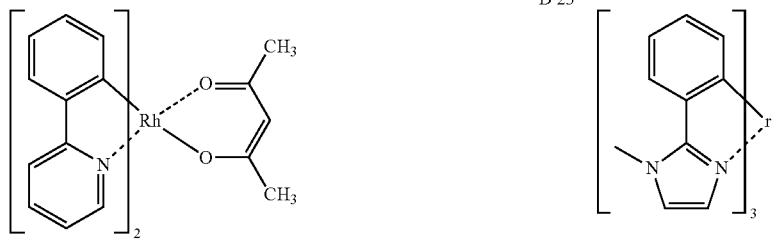 D 24
D 25 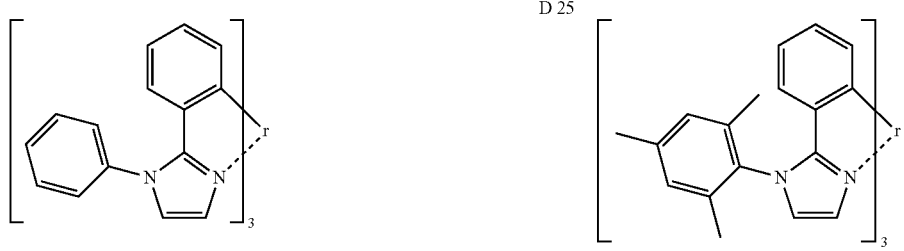 D 26

-continued
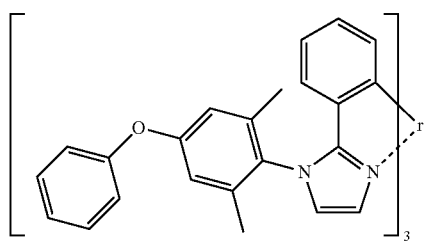
D 27
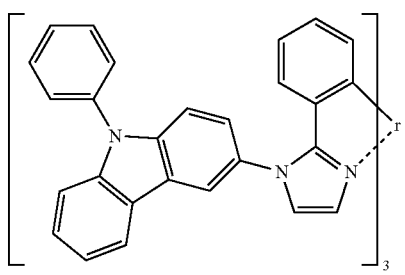
D 28
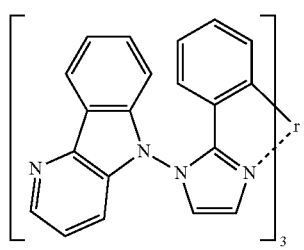
D 29
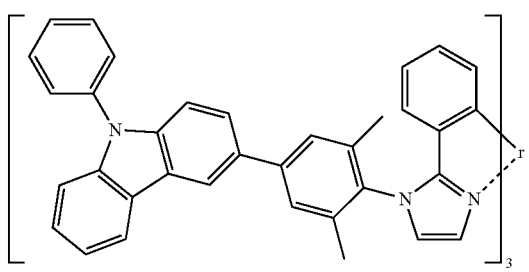
D 30
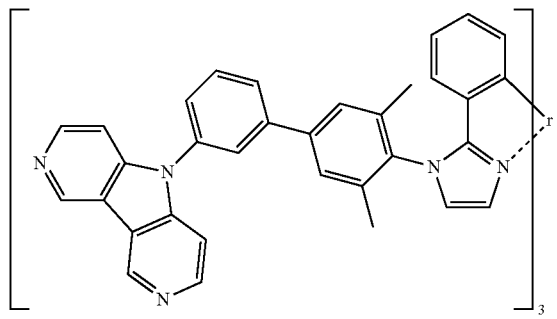
D 31
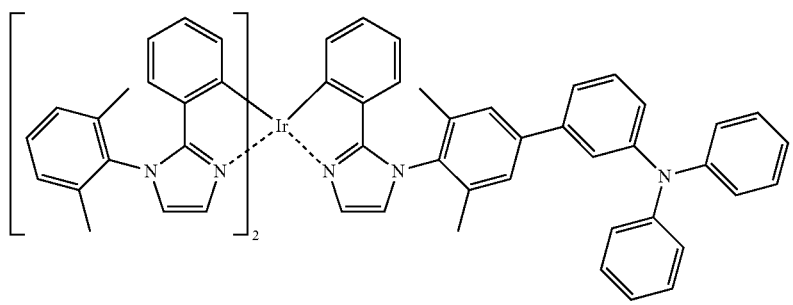
D-32
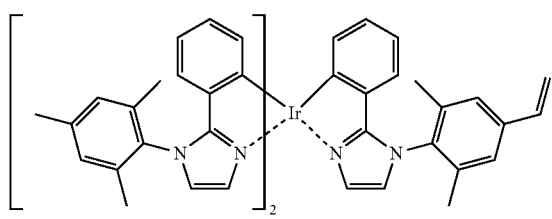
D-33
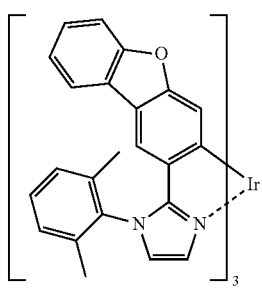
D-34

-continued
D-35
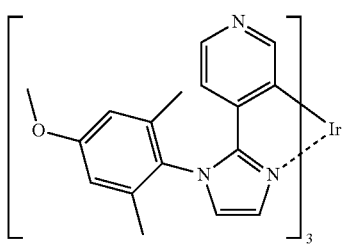
D-36
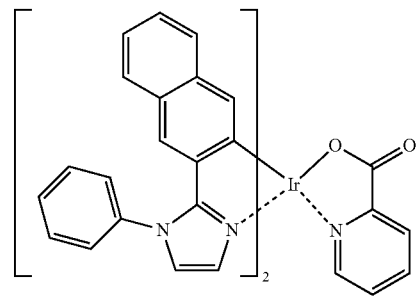
D-37
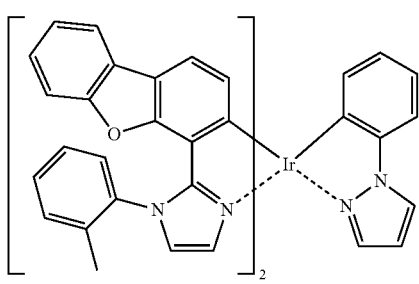
D-38
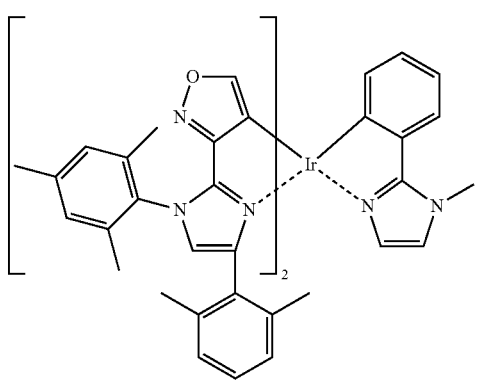
D-39
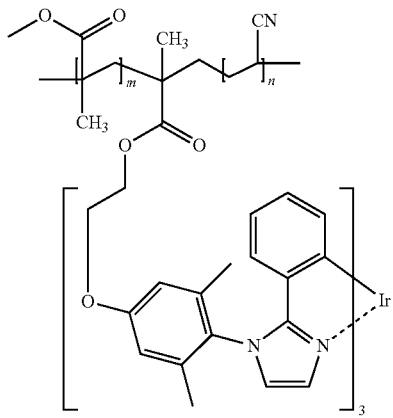
D-40
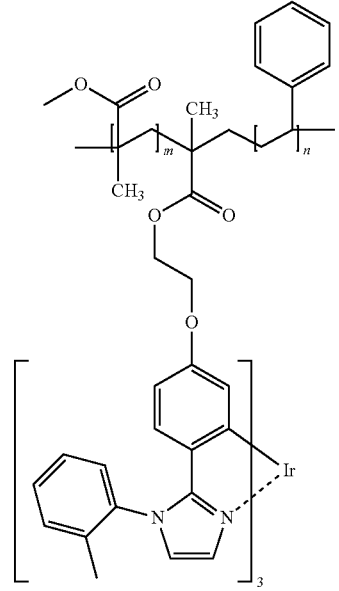
D-41
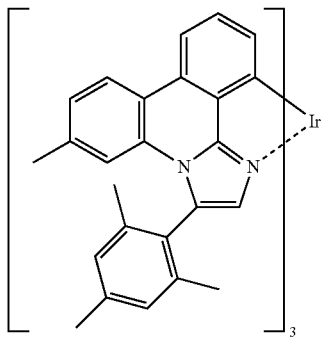
D-42
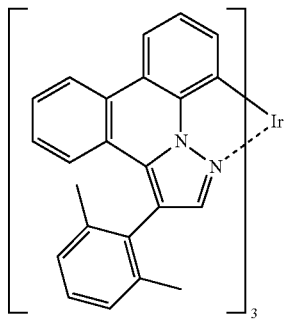

D-43

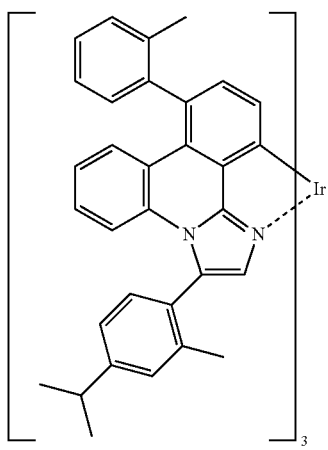

D-44

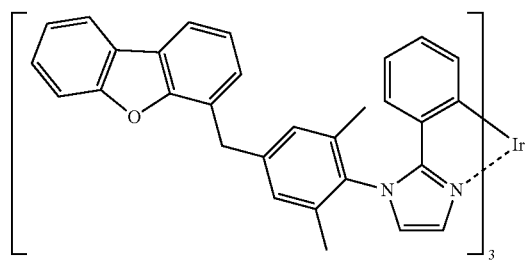

D-45

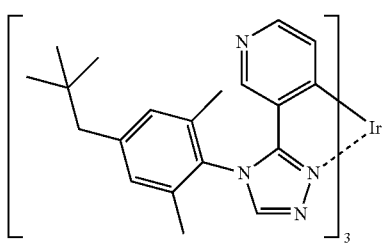

D-46

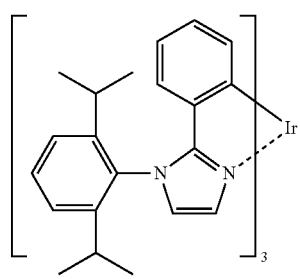

D-47

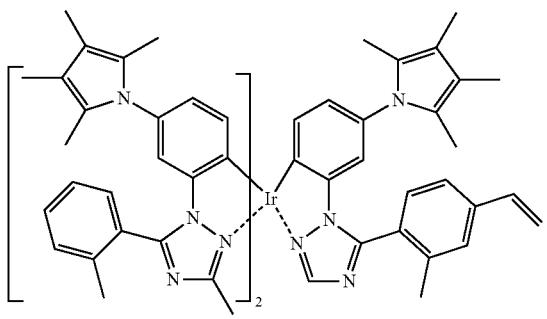

D-48

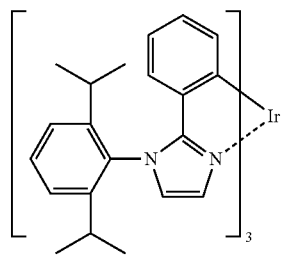

D-49

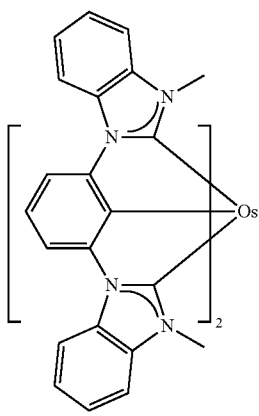

Luminous Host Compound (Called as Well a Luminous Host):

In the present invention, the host compound is defined as a compound in which a mass ratio thereof in the light-emitting layer is 20% or more based on the compounds contained in the above layer and in which a phosphorescence quantum yield in phosphorescence emission is less than 0.1 at room temperature (25° C.). The phosphorescence quantum yield is preferably less than 0.01. Also, a mass ratio thereof in the light-emitting layer is preferably 50% or more based on the compounds contained in the above layer.

The host compound which can be used in the present invention shall not specifically be restricted, and compounds which have so far been used for organic EL devices can be used. However, the compound represented by Formula (H1) according to the present invention is particularly preferred as a host for the blue phosphorescent dopant in the light-emitting layer of the organic EL device of the present invention.

Also, compounds which have so far been publicly known may be used as the host compound in combination with the compound represented by Formula (H1) according to the present invention. The compounds which may be used in combination include, to be representative, compounds having fundamental skeletons such as carbazole derivatives, triarylamine derivatives, aromatic derivatives, nitrogen-containing heterocyclic compounds, thiophene derivatives, furan derivatives, oligoarylene compounds and the like, carboline derivatives, diazacarbazole derivatives (in this regard, the diazacarbazole derivatives show compounds obtained by substituting at least one carbon atom of a hydrocarbon ring constituting a carboline ring of the carboline derivative with a nitrogen atom) and the like.

The publicly known luminous hosts which can be used in the present invention are preferably compounds which have a hole transporting ability and an electron transporting ability and inhibit emitted light from being shifted to a longer wavelength and which have a high Tg (glass transition temperature). Tg thereof is more preferably 100° C. or higher.

Use of plural luminous hosts makes it possible to control transfer of charges and provide the organic EL device with a high efficiency.

Also, different emitted lights can be mixed by using plural publicly known compounds which are used as the phosphorescent dopant described above, and this makes it possible to obtain optional luminescent colors. The host compound used in the present invention may be either low molecular weight compounds or high molecular weight compounds having repetitive units or may be low molecular weight compounds (polymerizable luminous hosts) having polymerizable groups such as a vinyl group and an epoxy group, and one kind or a plurality of the above compounds may be used.

The specific examples of the publicly known luminous hosts include compounds described in the following documents.

They are JP-A 2001-257076, JP-A 2002-308855, JP-A 2001-313179, JP-A 2002-319491, JP-A 2001-357977, JP-A 2002-334786, JP-A 2002-8860, JP-A 2002-334787, JP-A 2002-15871, JP-A 2002-334788, JP-A 2002-43056, JP-A 2002-334789, JP-A 2002-75645, JP-A 2002-338579, JP-A 2002-105445, JP-A 2002-343568, JP-A 2002-141173, JP-A 2002-352957, JP-A 2002-203683, JP-A 2002-363227, JP-A 2002-231453, JP-A 2003-31657, JP-A 2002-234888, JP-A 2003-27048, JP-A 2002-255934, JP-A 2002-260861, JP-A 2002-280183, JP-A 2002-299060, JP-A 2002-302516, JP-A 2002-305083, JP-A 2002-305084, JP-A 2002-308837 and the like.

«Injecting Layer: Hole-Injecting Layer (Anode Buffer Layer), Electron-Injecting Layer (Cathode Buffer Layer)»

An injecting layer is provided if necessary and includes an electron-injecting layer and a hole-injecting layer. The injecting layer may be provided, as shown in the layer structure described above, between an anode and a hole-transporting layer and between a cathode and an electron-transporting layer. Or, it may be provided between an anode and a light-emitting layer and between a cathode and a light-emitting layer. The injecting layer is a layer provided between an electrode and an organic layer in order to reduce the driving voltage and enhance the luminous brightness, and it is described in [Organic EL Device and Industrialization Cutting Edge] (published by NTS Corporation, Nov. 30, 1998, second edition, chapter 2 [Electrode material] (p. 123 to 166) in detail, and it includes a hole-injecting layer (anode buffer layer) and an electron-injecting layer (cathode buffer layer).

The details of the anode buffer layer (hole-injecting layer) are described in JP-A 9-45479, JP-A 9-260062, JP-A 8-288069 and the like. The specific examples thereof include a phthalocyanine buffer layer represented by copper phthalocyanine, a hexaazatriphenylene derivative buffer layer described in JP-A (through PCT) 2003-519342, JP-A 2006-135145 and the like, an oxide buffer layer represented by vanadium oxide, an amorphous carbon buffer layer, a polymer buffer layer formed by using an electroconductive polymer such as polyaniline (emeraldine), polythiophene and the like and an ortho-metalated complex layer represented by a tris(2-phenylpyridine)iridium complex and the like.

The details of the cathode buffer layer (electron-injecting layer) are described in JP-A 6-325871, JP-A 9-17574, JP-A 10-74586 and the like. To be specific, it includes a metal buffer layer represented by strontium, aluminum and the like, an alkali metal compound buffer layer represented by lithium fluoride, potassium fluoride and the like, an alkaline earth metal compound buffer layer represented by magnesium fluoride, cesium fluoride and the like and an oxide buffer layer represented by aluminum oxide. The buffer layer (injecting layer) described above is preferably a very thin layer, and a film thickness thereof falls preferably, though depending on the materials, in a range of 0.1 nm to 5 μm.

«Blocking Layer: Hole-Blocking Layer, Electron-Blocking Layer»

The blocking layer is provided, if necessary, in addition to the fundamental constitutional layers of the organic compound thin films as described above. It includes, for example, hole-blocking layers described in JP-A 11-204258, JP-A 11-204359, [Organic EL Device and Industrialization Cutting Edge], p. 237 (published by NTS Corporation, Nov. 30, 1998).

The hole-blocking layer has a function of an electron-transporting layer in a broad sense and comprises a hole-blocking material having a notably small ability of transporting a hole while having a function of transporting an electron, and it blocks a hole while transporting an electron, whereby a probability of recombining a hole and an electron can be enhanced.

Also, the constitution of an electron-transporting layer described later can be used, if necessary, as the hole-blocking layer.

The hole-blocking layer of the organic EL device of the present invention is provided preferably adjacent to the light-emitting layer. The hole-blocking layer contains preferably carbazole derivatives, carboline derivatives and diazacarbazole derivatives (in this regard, the diazacarbazole derivatives show compounds obtained by substituting any one of carbon atoms constituting a carboline ring with a nitrogen atom) which are listed as the host compounds described above.

In the present invention, when plural light-emitting layers having plural different luminescent colors are present, a light-emitting layer (shortest wavelength layer) in which an emission maximum wavelength is present in a shortest wavelength side is the closest preferably to an anode among all the light-emitting layers. In the above case, a hole-blocking layer is added and provided preferably between the above shortest wavelength layer and a light-emitting layer close to the anode next to the above shortest wavelength layer. Further, 50% or more of the compounds contained in the hole-blocking layer provided in the above position has preferably an ionization potential which is as large by 0.3 eV or more as that of the host compound of the shortest wavelength light-emitting layer described above.

The ionization potential is defined by energy required for discharging an electron present in an HOMO (highest occupied molecular orbital) level of a compound to a vacuum level, and it can be determined, for example, by the following method.

(1) It can be determined in the form of a value (eV unit-reduced value) calculated by carrying out structural optimization by using Gaussian 98 (Gaussian 98, Revision A. 11. 4, M. J. Frisch, et al, Gaussian Inc., Pittsburgh Pa., 2002) which is a software for calculating a molecular orbital, manufactured by Gaussian Inc. High interrelation between the calculated value determined by the above method and the experimental value is involved in the background that the above calculated value is effective.

(2) The ionization potential can be determined as well by a method in which it is measured directly by a photoelectron spectroscopy. For example, it can be determined by means of a low energy electron spectroscopic equipment [Model AC-1] manufactured by Riken Keiki Co., Ltd. or suitably using a method known as a UV photoelectron spectroscopy.

On the other hand, the electron-blocking layer has a function of a hole-transporting layer in a broad sense and comprises a material having a notably small ability of transporting an electron while having a function of transporting a hole, and it blocks an electron while transporting a hole, whereby a probability of recombining an electron and a hole can be enhanced.

Also, the constitution of a hole-transporting layer described later can be used, if necessary, for the electron-blocking layer. The film thicknesses of the hole-blocking layer and the electron-blocking layer which can be used in the present invention are preferably 3 to 100 nm, more preferably to 30 nm.

«Hole-Transporting Layer»

A hole-transporting layer comprises a hole-transporting material having a function of transporting a hole, and the hole-injecting layer and the electron-blocking layer are included as well in the hole-transporting layer in a broad sense. The hole-transporting layer can be provided in a single layer or plural layers.

The hole-transporting material has any of an injection property or a transporting property of a hole and a barriering property of an electron, and it may be either of an organic substance and an inorganic substance. It includes, for example, triazole derivatives, oxadiazole derivatives, imidazole derivatives, polyarylalkane derivatives, pyrazoline derivatives and pyrazolone derivatives, phenylenediamine derivatives, arylamine derivatives, amino-substituted chalcone derivatives, oxazole derivatives, styrylanthracene derivatives, fluorenone derivatives, hydrazone derivatives, stilbene derivatives, silazane derivatives, aniline base copolymers, conductive high molecular oligomers, particularly thiophene oligomers and the like.

Also, azatriphenylene derivatives described in JP-A (through PCT) 2003-519432, JP-A 2006-135145 and the like can be used similarly as the hole-transporting material.

The compounds described above can be used as the hole-transporting material, and porphyrin compounds, aromatic tertiary amine compounds and styrylamine compounds, particularly the aromatic tertiary amine compounds are preferably used.

The representative examples of the aromatic tertiary amine compounds and the styrylamine compounds include N,N,N',N'-tetraphenyl-4,4'-diaminophenyl; N,N'-diphenyl-N,N'-bis(3-methylphenyl)-[1,1'-biphenyl]-4,4'-diamine (TPD); 2,2-bis(4-di-p-tolylaminophenyl)propane; 1,1-bis(4-di-p-trylaminophenyl)cyclohexane; N,N,N',N'-tetra-p-tolyl-4,4'-diaminobiphenyl; 1,1-bis(4-di-p-tolylaminophenyl)-4-phenylcyclohexane; bis(4-dimethylamino-2-methylpenyl) phenylmethane; bis(4-di-p-tolylaminophenyl) phenylmethane; N,N'-diphenyl-N,N'-di(4-methoxyphenyl)-4,4'-diaminobiphenyl; N,N,N',N'-tetraphenyl-4,4'-diaminodiphenyl ether; 4,4'-bis(diphenylamino) quadriphenyl; N,N,N-tri(p-tolyl)amine; 4-(di-p-tolylamino)-4'-[4-(di-p-tolylamino)styryl]stilbene; 4-N,N-dipenylamino-(2-diphenylvinyl)benzene; 3-methoxy-4'-N,N-dipenylaminostilbene; N-phenylcarbazole, and compounds having two condensed aromatic rings in a molecule described in U.S. Pat. No. 5,061,569, for example, 4,4'-bis[N-(1-naphthyl)-N-phenylamino]biphenyl (NPD), 4,4',4"-tris[N-(3-methylphenyl)-N-phenylamino]triphenylamine (MTDATA) described in JP-A 4-308688, in which three triphenylamine units are connected in a star burst form.

Further, polymer materials in which the above materials are introduced into a polymer chain or in which the above materials are used to form a principal chain of a polymer can be used as well.

Also, inorganic compounds such as p type-Si, p type-SiC and the like can be used as well for the hole-injecting material and the hole-transporting material.

Further, so-called p type hole-transporting materials described in JP-A 11-251067 and Applied Physics Letters 80 (2002), p. 139 written by J. Huang et al. can be used as well. In the present invention, the above materials are preferably used since light-emitting devices having a higher efficiency are obtained.

The hole-transporting layer can be formed by forming a thin film from the hole-transporting materials described above by a publicly known method such as, for example, a vacuum deposition method, a spin coating method, a casting method, a printing method including an ink jet method, an LB method and the like.

A film thickness of the hole-transporting layer shall not specifically be restricted and is usually 5 nm to 5 μm, preferably 5 nm to 200 nm. The hole-transporting layer may be a single layer structure comprising at least one kind of the materials described above.

Also, a hole-transporting layer in which an impurity is doped and which has a high p property can be used as well. The examples thereof include those described in the respective gazettes of JP-A 4-297076 and JP-A 2000-196140 and JP-A 2001-102175, J. Appl. Phys., 95, 5773 (2004) and the like.

In the present invention, the above hole-transporting layer having a high p property is preferably used since the devices having lower power consumption can be prepared.

The specific examples of the compounds used preferably for forming the hole-injecting layer and the hole-transporting layer of the organic EL device according to the present invention are listed below, but the present invention shall not be restricted to them.

121 122
HT-1
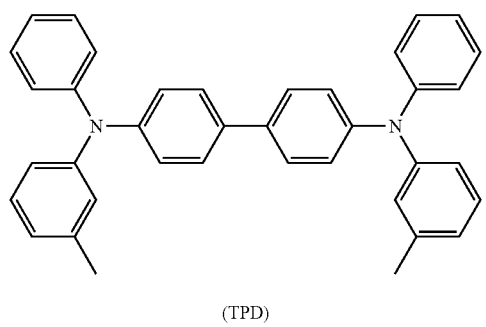
(TPD)
HT-2
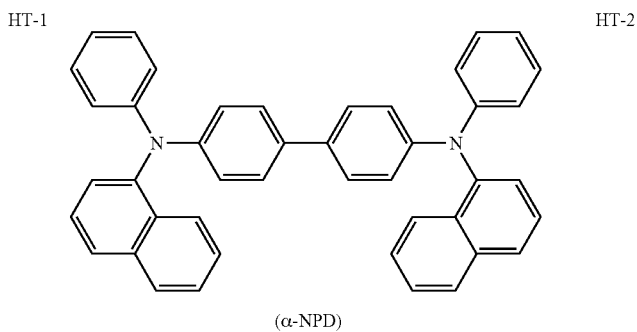
(α-NPD)
HT-3
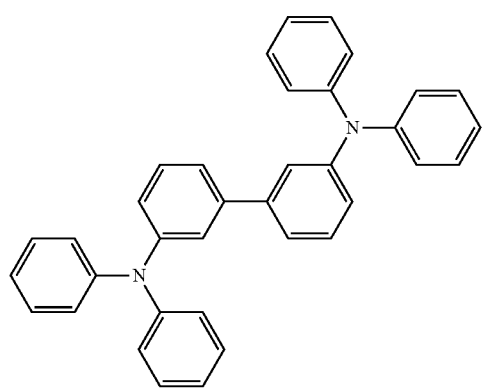
HT-4
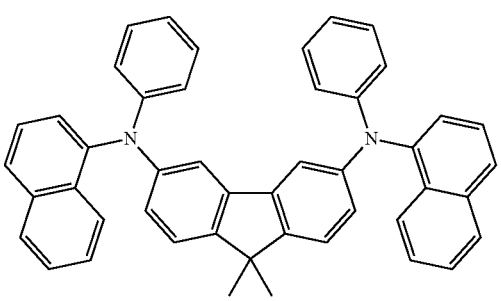
HT-5
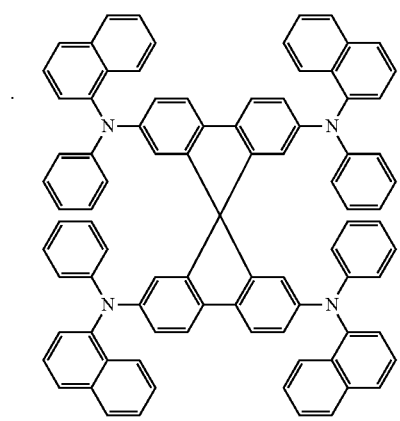
HT-6
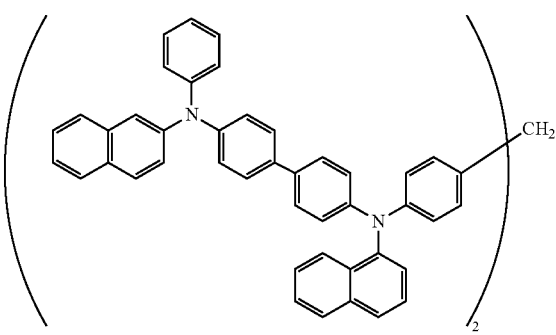
HT-7
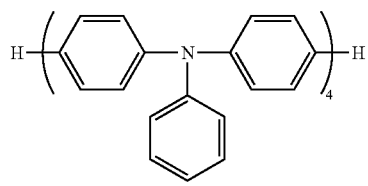
HT-8
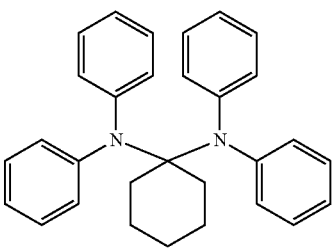

-continued
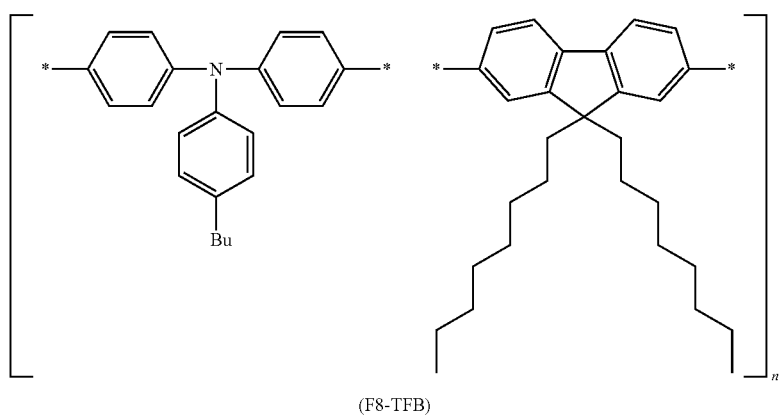
(F8-TFB)
HT-9
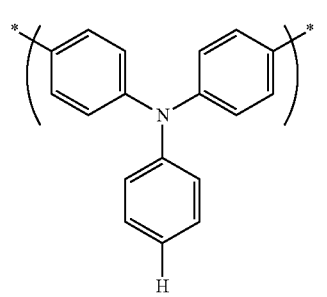
HT-10
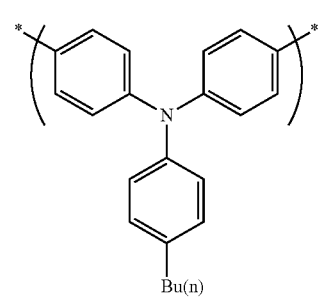
HT-11
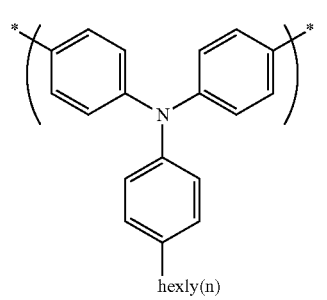
HT-12
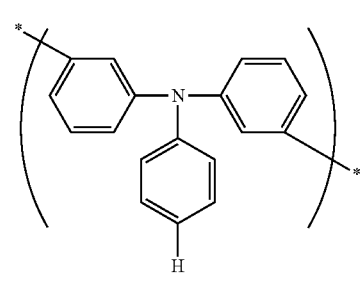
HT-13
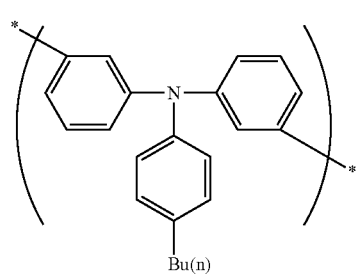
HT-14
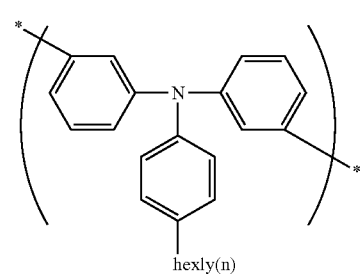
HT-15
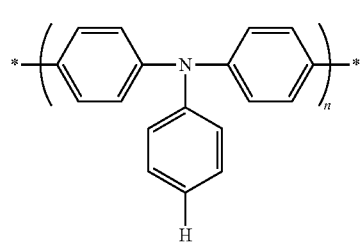
HT-16
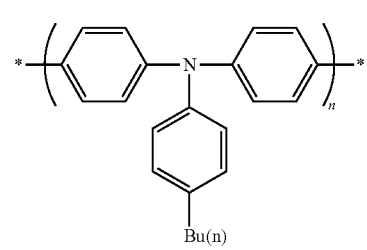
HT-17

-continued
HT-18
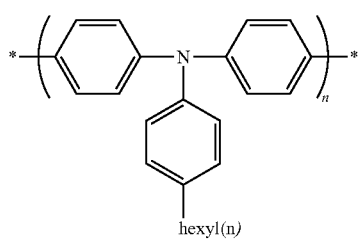
HT-19
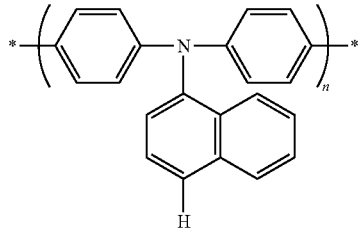
HT-20
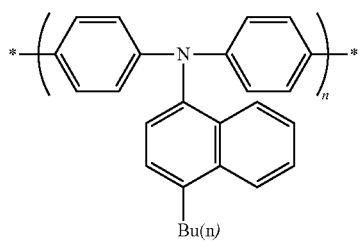
HT-21
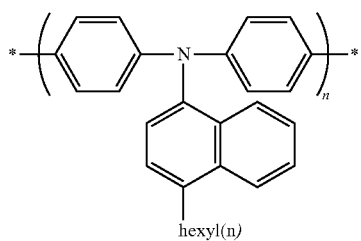
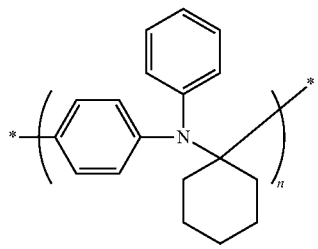
HT-22
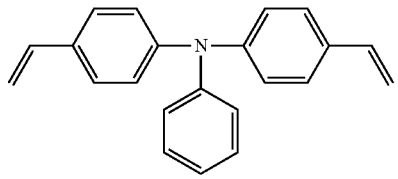
HT-23
HT-24
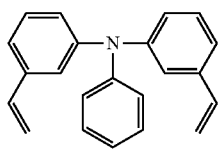
HT-25
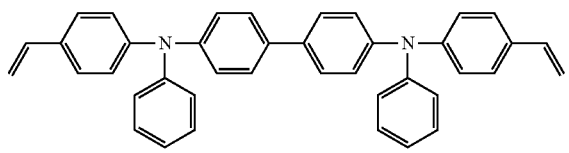
HT-26
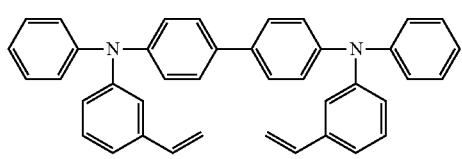
HT-27
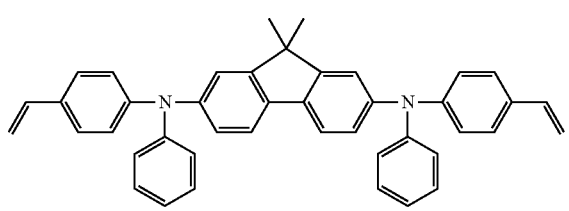
HT-28
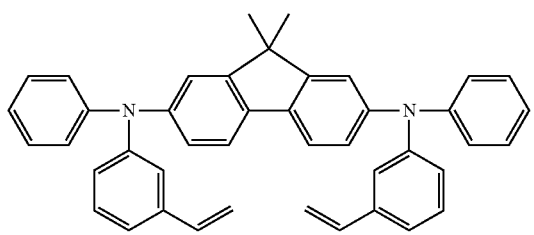
HT-29
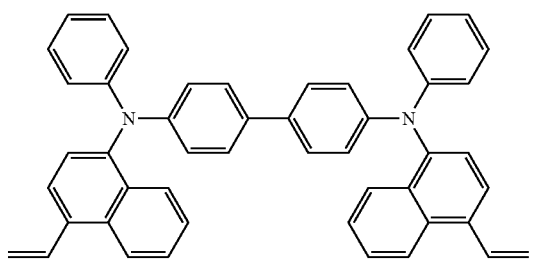

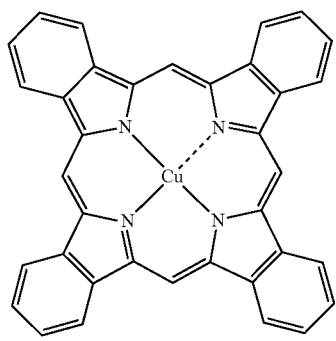
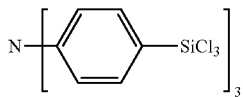
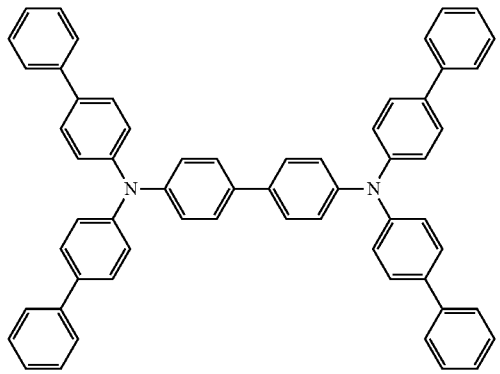
-continued
HT-30
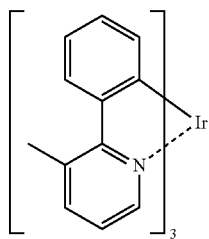
HT-31
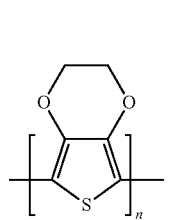
HT-32
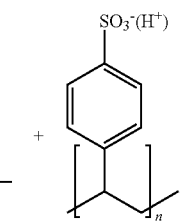
HT-33
HT-34
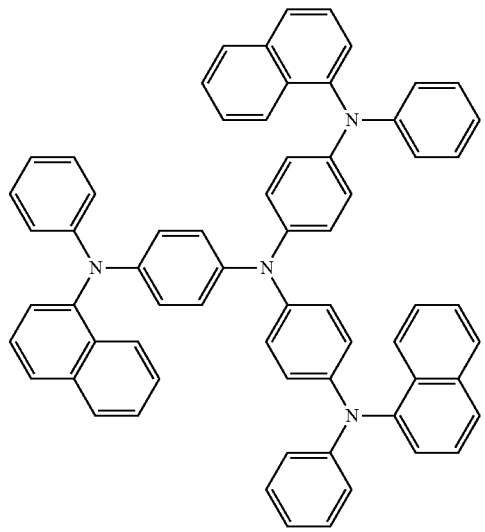
HT-35
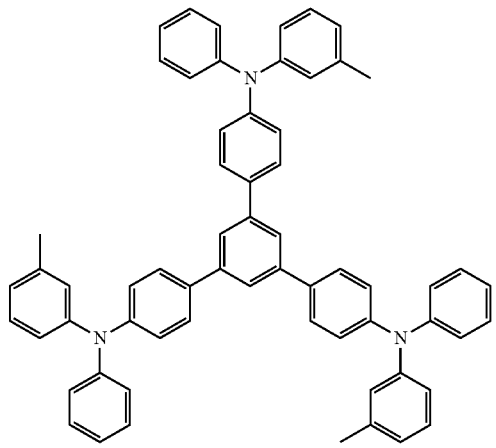
HT-37

-continued
HT-38
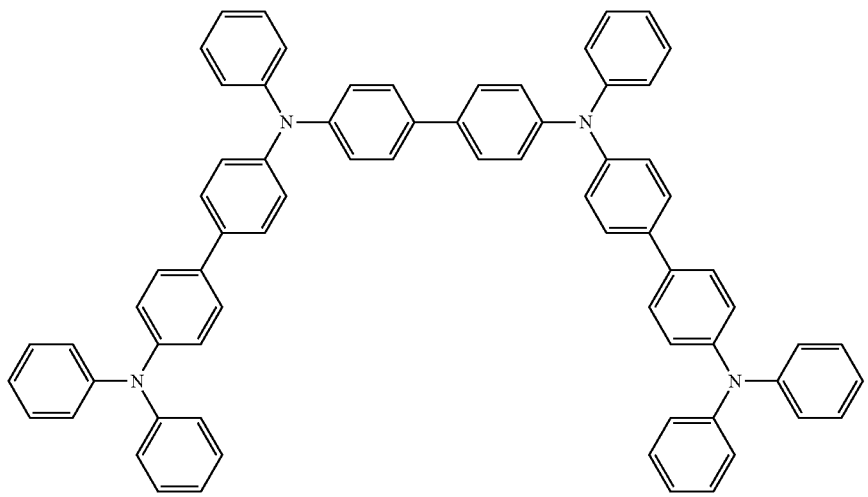
HT-39
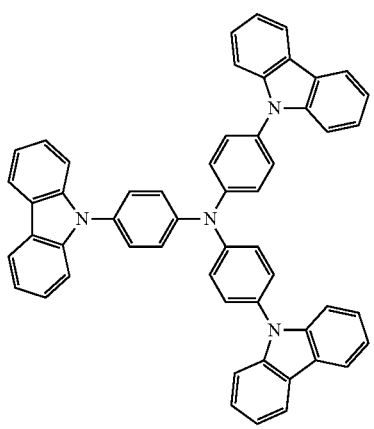
HT-40
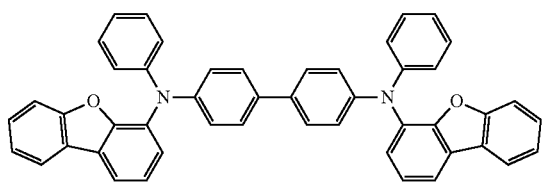
HT-41
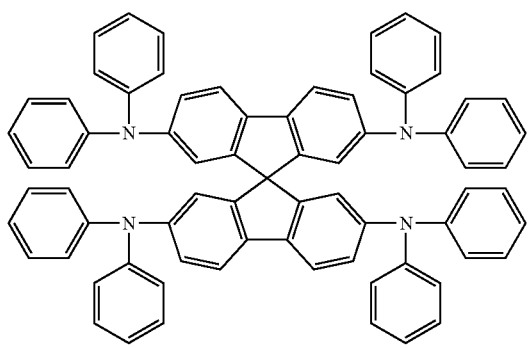
HT-42
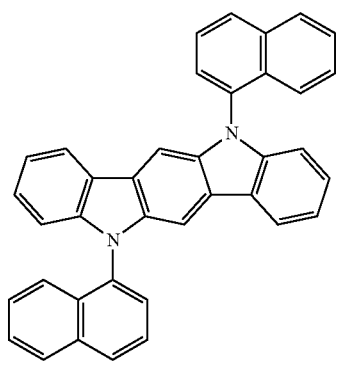
HT-43
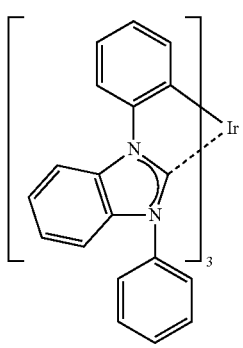
HT-44
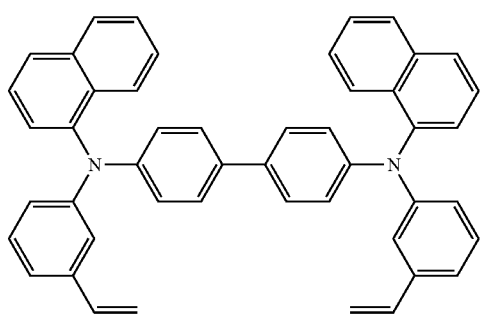

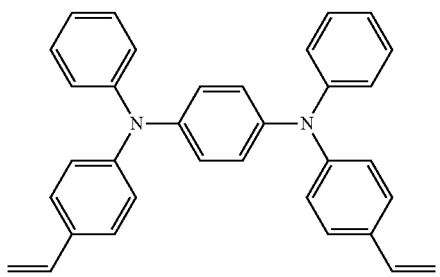

HT-45

《Electron-Transporting Layer》

An electron-transporting layer comprises a material having a function of transporting an electron, and the electron-injecting layer and the hole-blocking layer are included as well in the electron-transporting layer in a broad sense. The electron-transporting layer can be provided in a single layer or plural layers.

The electron-transporting layer has preferably a function of transmitting an electron injected from a cathode to the light-emitting layer, and optional compounds selected from compounds which have so far been publicly known can be used in combination as the constitutional material for the electron-transporting layer.

The examples of materials (hereinafter referred to as electron-transporting materials) used for the electron-transporting layer which have so far been publicly known include nitro-substituted fluorene derivatives, diphenylquinone derivatives, thiopyran dioxide derivatives, polycyclic aromatic hydrocarbons such as naphthaleneperylene and the like, heterocyclic tetracarboxylic acid anhydride, carbodiimide, fluorenylidenemethane derivatives, anthraquinodimethane and anthrone derivatives, oxadiazole derivatives, carboline derivatives or derivatives having a ring structure in which at least one carbon atom of a hydrocarbon ring constituting a carboline ring of the above carboline derivative is substituted with a nitrogen atom, hexaazatriphenylene derivatives and the like.

Further, thiadiazole derivatives obtained by substituting an oxygen atom of an oxadiazole ring with a sulfur atom in the oxadiazole derivatives described above and quinoxaline derivatives having a quinoxaline ring which is known as an electron-withdrawing group can also be used as the electron-transporting materials.

Polymer materials in which the above materials are introduced into a polymer chain or in which the above materials are used to form a principal chain of a polymer can be used as well.

Capable of also being used as the electron-transporting materials are metal complexes of 8-quinolinol derivatives, for example, tris(8-quinolinol)aluminum (Alq), tris(5,7-dichloro-8-quinolinol)aluminum, tris(5,7-dibromo-8-quinolinol)aluminum, tris(2-methyl-8-quinolinol)aluminum, tris(5-methyl-8-quinolinol)aluminum, bis(8-quinolinol)zinc (Znq) and the liked, and metal complexes obtained by replacing the central metals of the above metal complexes by In, Mg, Cu, Ca, Sn, Ga or Pb.

In addition to the above compounds, metal free or metal phthalocyanine, or compounds obtained by substituting the ends of the above compounds with an alkyl group, a sulfonic acid group and the like can also be used as the electron-transporting materials. Further, inorganic semiconductors such as n type-Si, n type-SiC and the like can also be used as the electron-transporting materials.

The electron-transporting layer is formed preferably by using the electron-transporting materials to form a thin film by, for example, a vacuum deposition method, a wet method (also called a wet process and including, for example, a spin coating method, a casting method, a die coating method, a blade coating method, a roll coating method, an ink jet method, a printing method, a spray coating method, a curtain coating method, an LB method (a Langmuir Blodgett method) and the like) and the like.

A film thickness of the electron-transporting layer shall not specifically be restricted and is usually 5 nm to 5000 nm, preferably 5 nm to 200 nm. The above electron-transporting layer may be a single layer structure comprising at least one of the materials described above.

Also, n type dopants of metal compounds such as metal complexes, metal halides and the like may be doped and used.

The specific examples of publicly known compounds (electron-transporting materials) used preferably for forming the electron-transporting layer in the organic EL device of the present invention are listed below, but the present invention shall not be restricted to them.

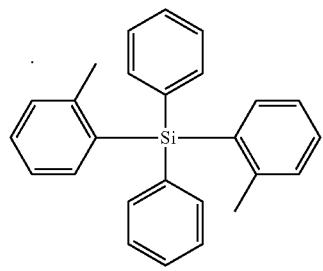
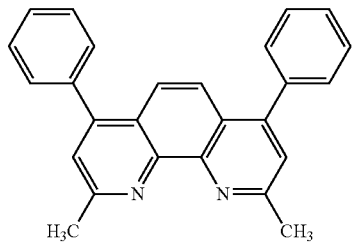
ET-1  ET-2
(BCP)
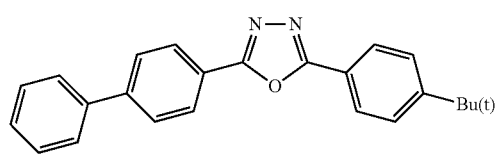
ET-3  ET-4
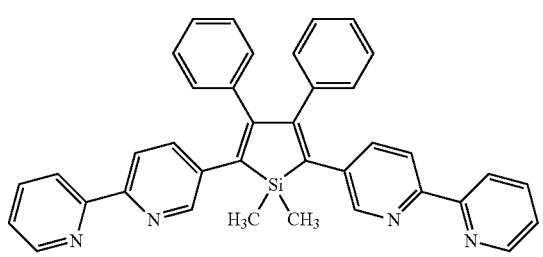
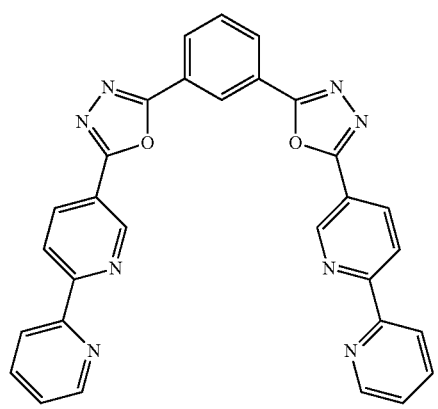
ET-5  ET-6
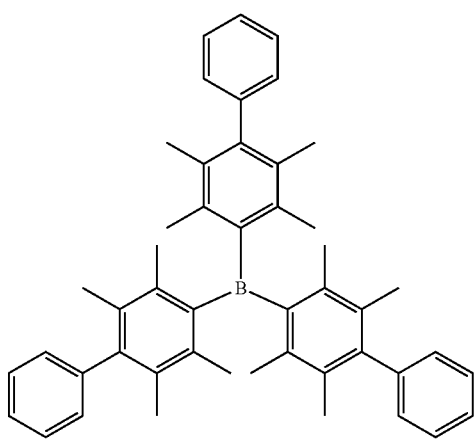
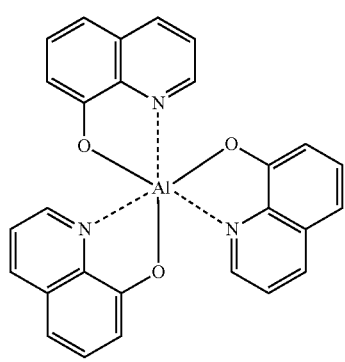
(Alq₃)
ET-7  ET-8
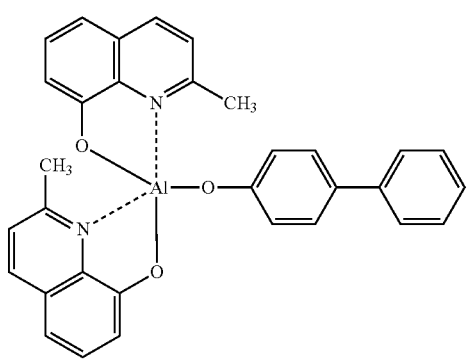
(BAlq)

-continued
ET-9
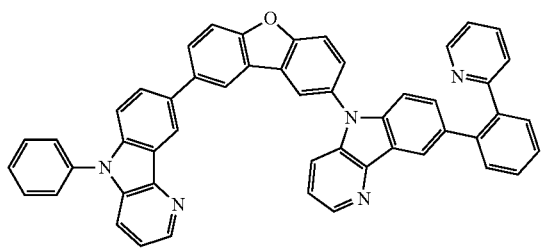
ET-10
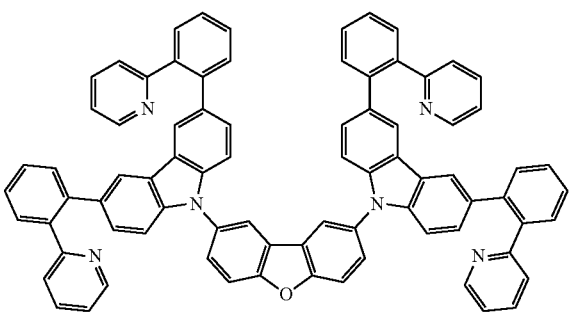
ET-11
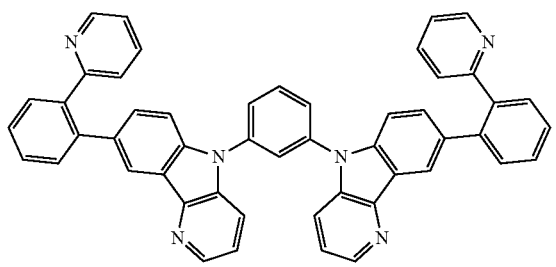
ET-12
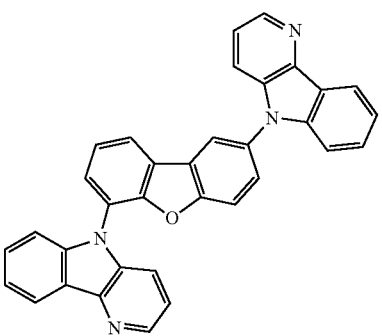
ET-13
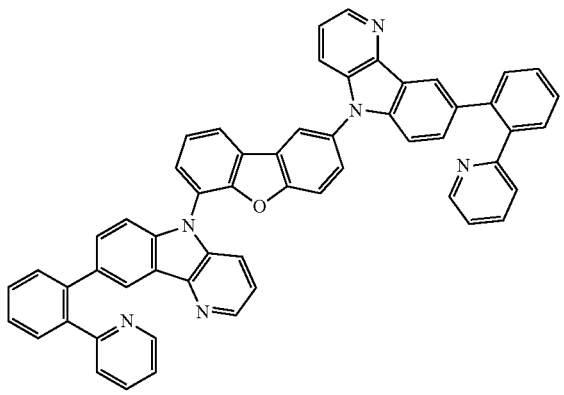
ET-14
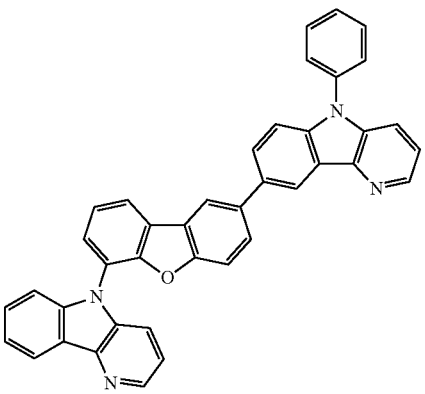
ET-15
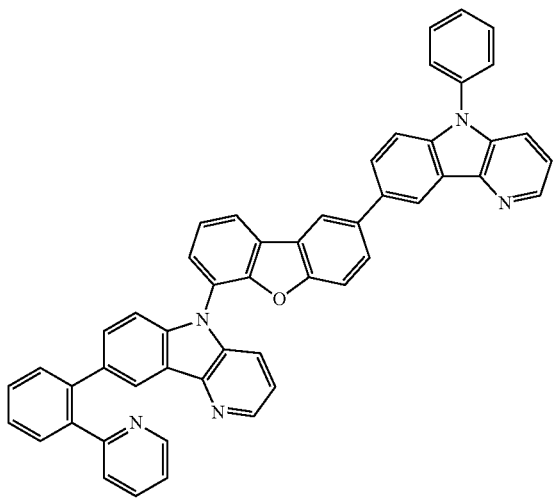
ET-16
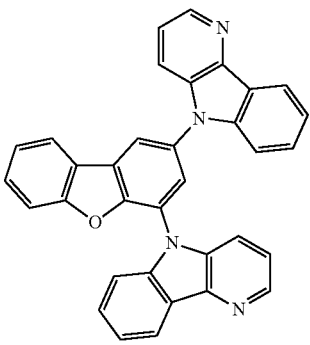

-continued
ET-17
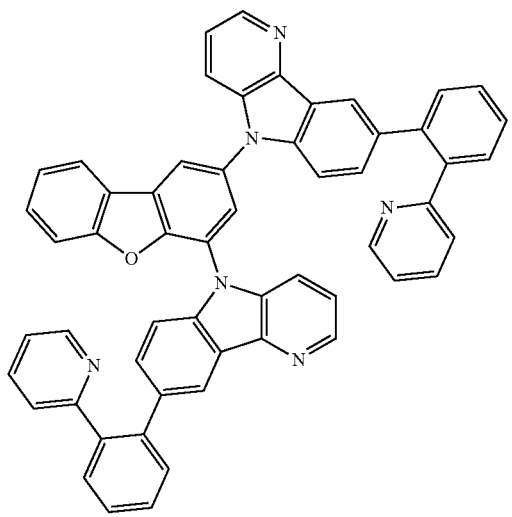
ET-18
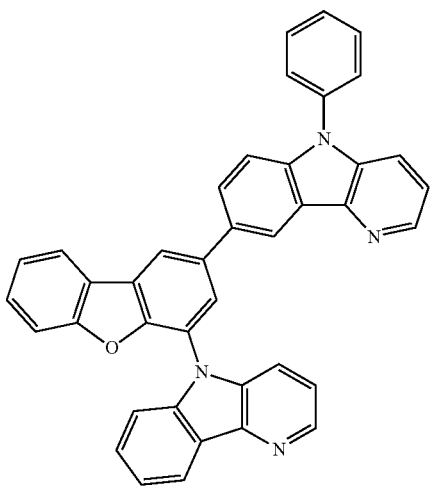
ET-19
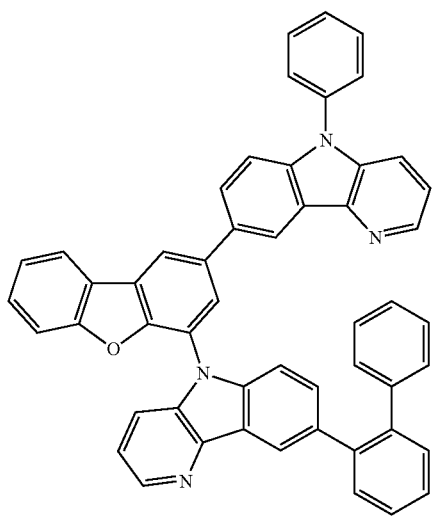
ET-20
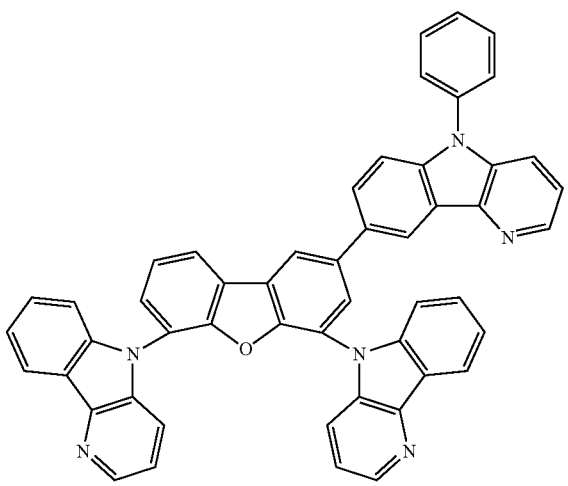
ET-21
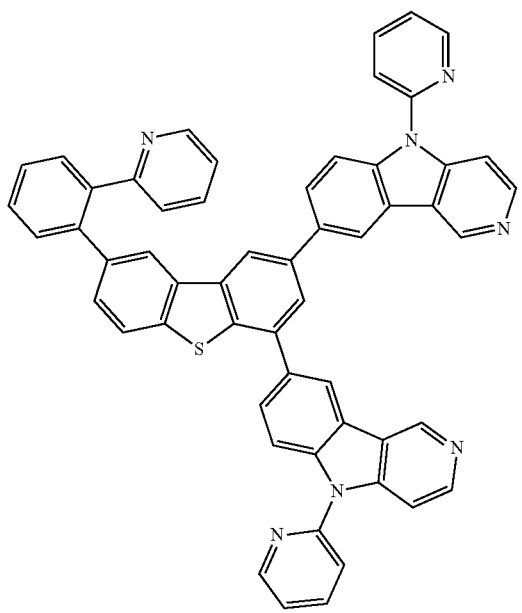

ET-22
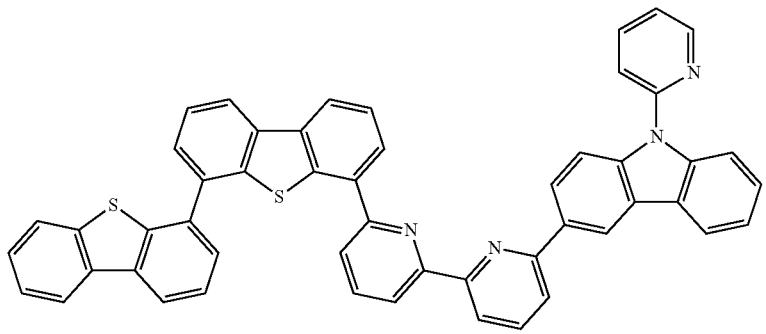
ET-23
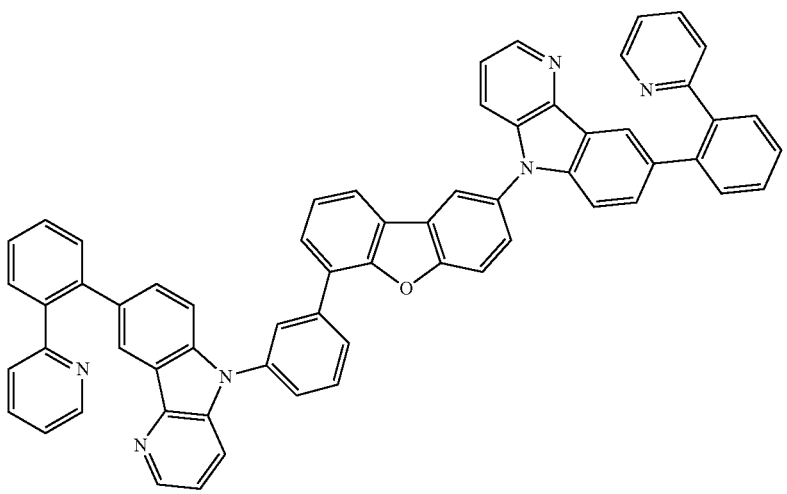
ET-24
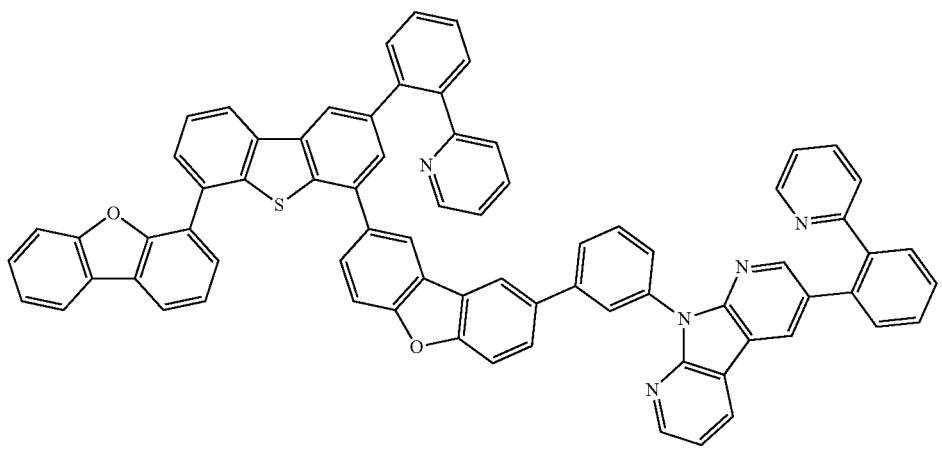

ET-25
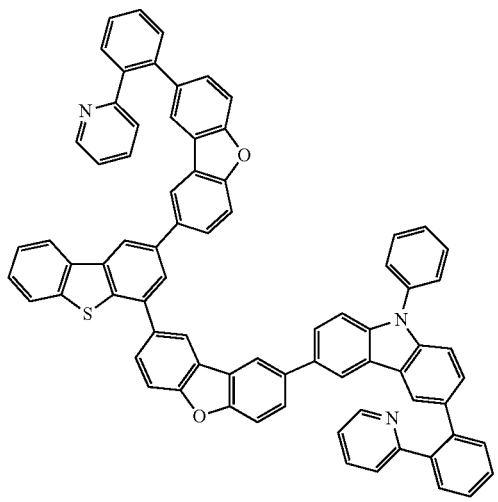
ET-26
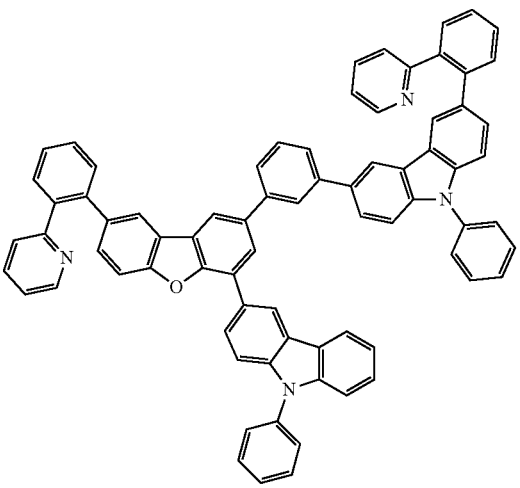
ET-27
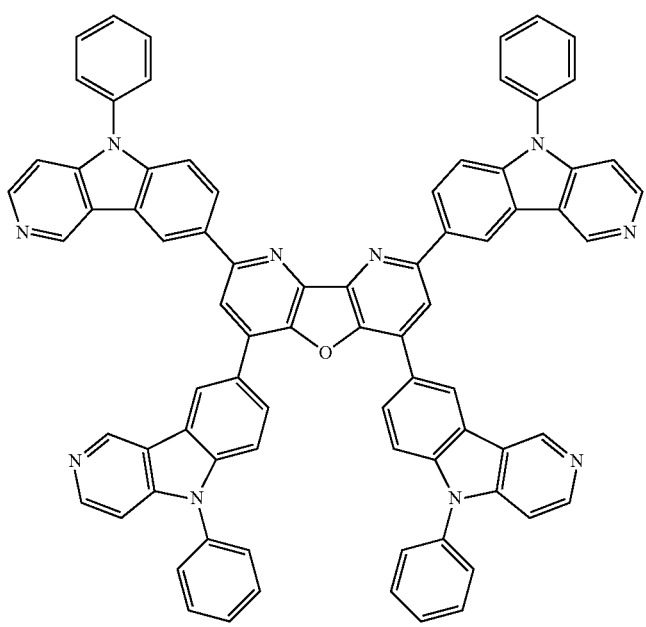
ET-28
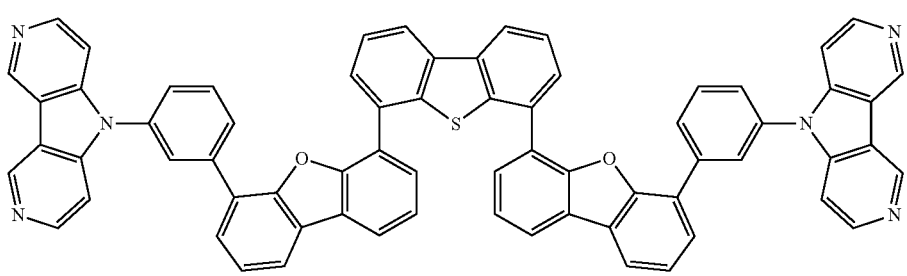

ET-29
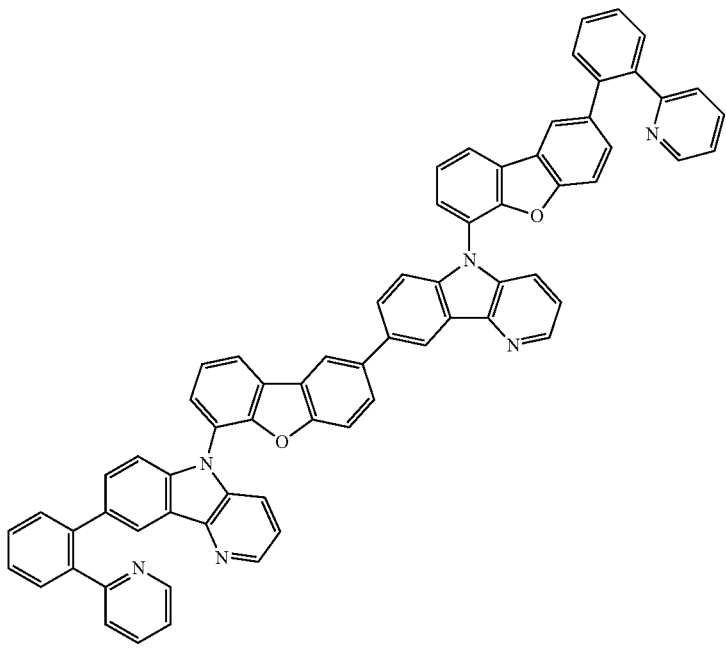
ET-30
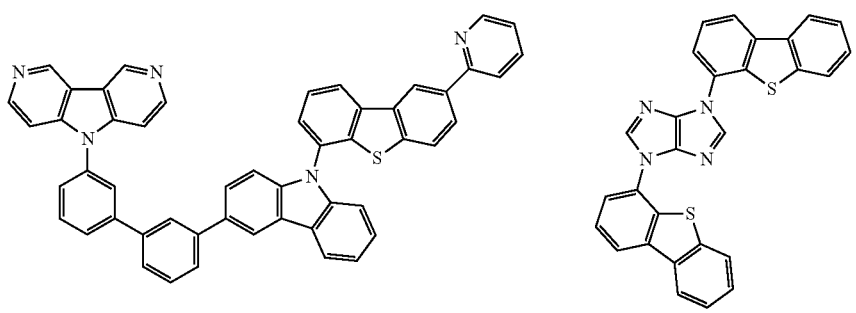
ET-31
ET-32
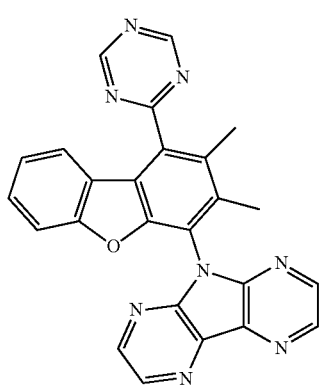
ET-33
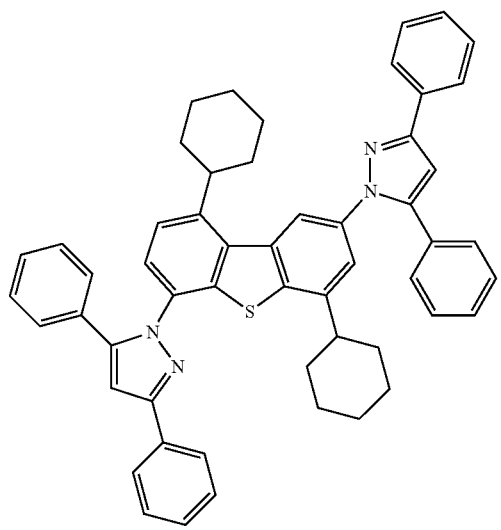

-continued
ET-34
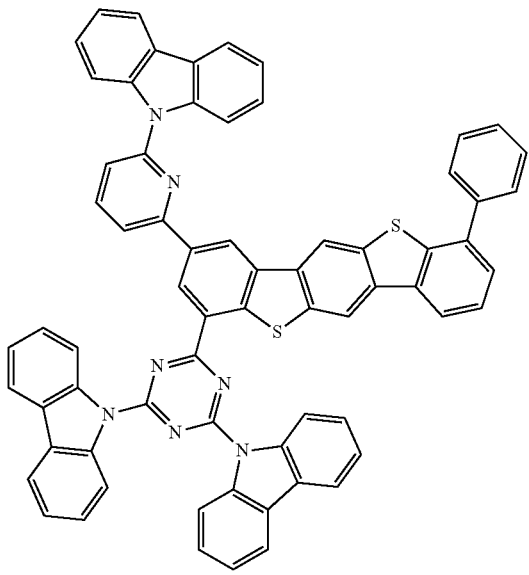
ET-35
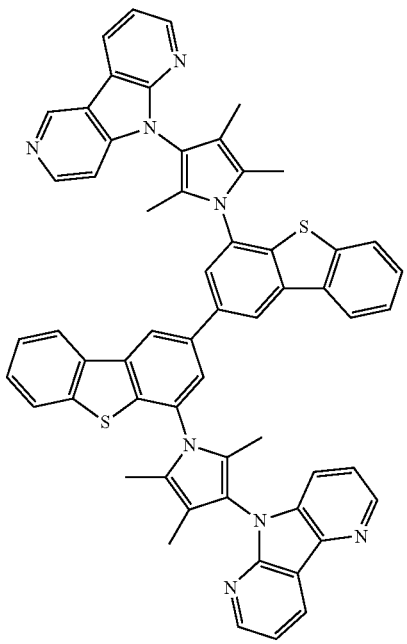
ET-36
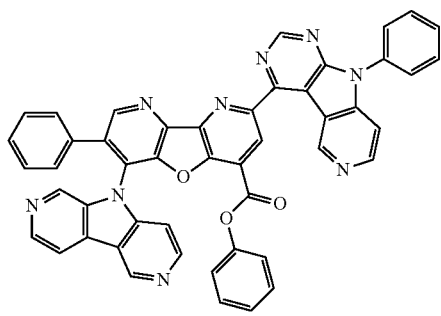
ET-37
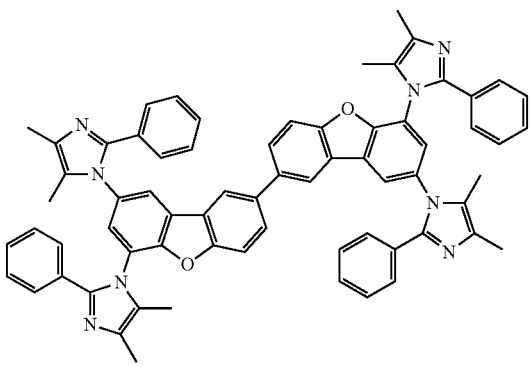
ET-38
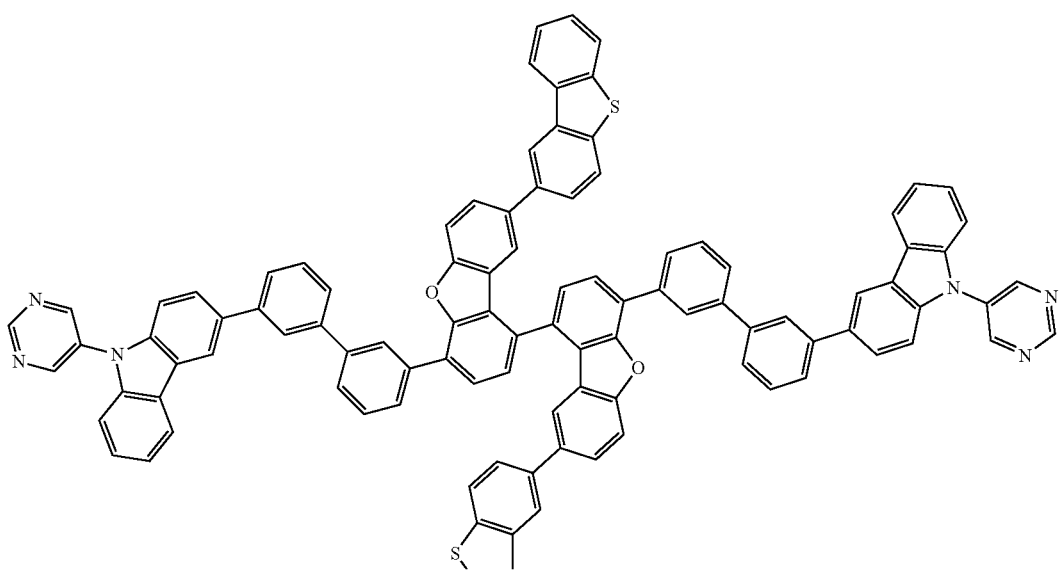

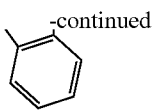

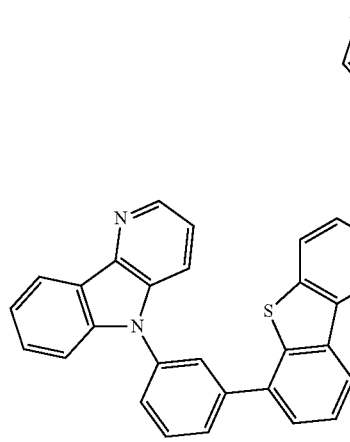

ET-39

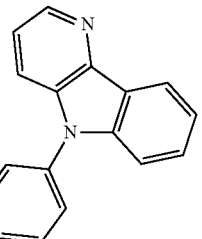

ET-40

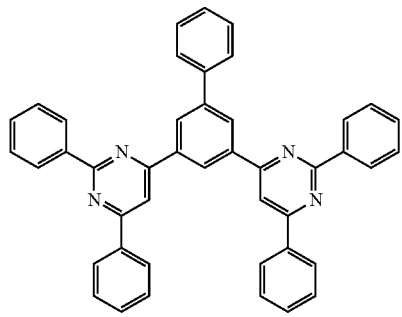

ET-41

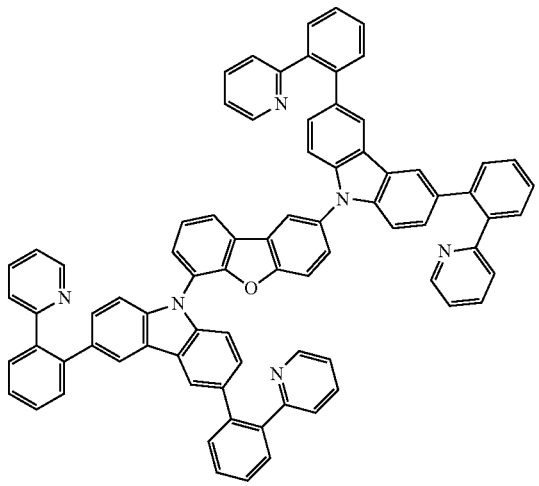

ET-42

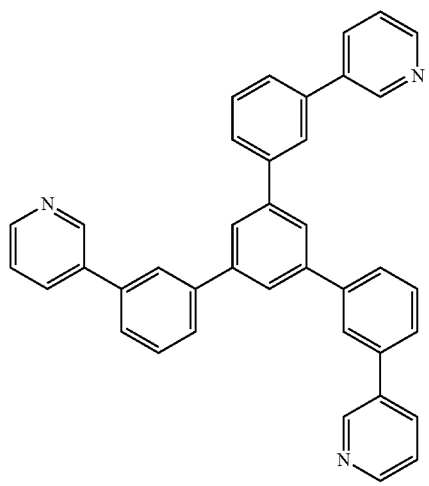

ET-43

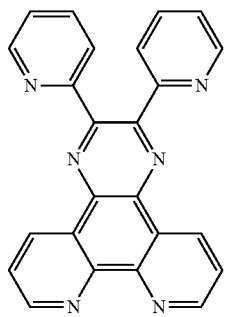

«Anode»

Electrodes prepared by using metals, alloys, electroconductive compounds and mixtures thereof each having large work functions (4 eV or more) as electrode materials are preferably used for an anode in the organic EL device. The specific examples of the above electrode materials include metals such as Au and the like and conductive transparent materials such as CuI, indium tin oxide (ITO), $SnO_2$, ZnO and the like.

Further, materials which are amorphous and by which transparent conductive films can be formed, such as IDIXO (In$_2$O$_3$—ZnO) and the like may be used. The anode may be prepared by forming a thin film from the above electrode materials by a method such as deposition, sputtering and the like, and a pattern having a desired shape may be formed thereon by a photolithographic method, or when a pattern precision is not required so much (about 100 μm or more), a pattern may be formed via a mask having a desired shape in depositing or sputtering the electrode materials described above.

Or, when substances which can be coated as is the case with the organic conductive compounds are used, a wet film-forming method such as a printing method, a coating method and the like can be used as well. When light is emitted from the above anode, a transmittance thereof is preferably larger than 10%, and a sheet resistance of the anode is preferably several hundred Ω/☐ or less. Further, a film thickness thereof is selected, though depending on the materials, in a range of usually 10 to 1000 nm, preferably 10 to 200 nm.

«Cathode»

On the other hand, electrodes prepared by using metals (called electron-injecting metals), alloys, electroconductive compounds and mixtures thereof each having small work functions (4 eV or less) as electrode materials are used for a cathode. The specific examples of the above electrode materials include sodium, sodium-potassium alloys, magnesium, lithium, magnesium/copper mixtures, magnesium/silver mixtures, magnesium/aluminum mixtures, magnesium/indium mixtures, aluminum/aluminum oxide (Al$_2$O$_3$) mixtures, indium, lithium/aluminum mixtures, rare earth metals and the like. Among them, mixtures of electron-injecting metals and secondary metals which are stable metals having a larger value of a work function than those of the above metals, for example, magnesium/silver mixtures, magnesium/aluminum mixtures, magnesium/indium mixtures, aluminum/aluminum oxide (Al$_2$O$_3$) mixtures, lithium/aluminum mixtures, aluminum and the like are suited from the viewpoints of an electron-injecting property and a durability against oxidation and the like.

The cathode can be prepared by forming a thin film from the above electrode materials by a method such as deposition, sputtering and the like. Also, a sheet resistance of the cathode is preferably several hundred Ω/☐ or less, and a film thickness thereof is selected in a range of usually 10 nm to 5 μm, preferably 50 nm to 200 nm.

If either one of the anode and the cathode of the organic EL device is transparent or translucent in order to transmit emitted light, a luminous brightness thereof is favorably enhanced.

The metals described above are used to form a film having a thickness of 1 to 20 nm on the cathode, and then conductive transparent materials listed in the explanations of the anode described later are used to form a film thereon, whereby the transparent or translucent cathode can be prepared, and application thereof makes it possible to prepare the device in which both of an anode and a cathode have a transparency.

«Supporting Substrate»

A supporting substrate (hereinafter referred to as a base substance, a substrate, a base material, a support and the like) shall not specifically be restricted in a kind such as a glass, a plastic and the like, and it may be transparent or opaque. When light is emitted from a supporting substrate side, the supporting substrate is preferably transparent. Glass, quartz and transparent resin films can be listed as the transparent supporting substrate which is preferably used. The particularly preferred supporting substrate is a resin film which can provide the organic EL device with a flexibility.

The resin film includes, for example, films of polyesters such as polyethylene terephthalate (PET), polyethylene naphthalate (PEN) and the like, polyethylene, polypropylene, cellulose esters such as cellophane, cellulose diacetate, cellulose triacetate, cellulose acetate butyrate, cellulose acetate propionate (CAP), cellulose acetate phthalate (TAC), cellulose nitrate and the like or derivatives thereof, polyvinylidene chloride, polyvinyl alcohol, polyethylene vinyl alcohol, syndiotactic polystyrene, polycarbonate, norbornene resins, polymethylpentene, polyether ketone, polyimide, polyether sulfone (PES), polyphenylene sulfide, polysulfones, polyetherimide, polyether ketone imide, polyamide, fluororesins, nylons, polymethyl methacrylate, acryl or polyallylates, cycloolefin base resins such as ARTON (trade name, manufactured by JSR Corporation) and APL (trade name, manufactured by Mitsui Chemicals, Inc.), and the like.

A coating film of an inorganic matter or an organic matter or a hybrid coating film of both may be formed on the surface of the resin film. The resin film is preferably a barrier film having a moisture permeability (25±0.5° C., relative humidity (90±2) % RH) of 0.01 g/(m$^2$·24 h) or less measured by a method according to JIS K 7129-1992, and it is more preferably a high barrier film having an oxygen permeability of 10$^{-3}$ ml/(m$^2$·24 h·atm) or less and a moisture permeability of 10$^{-5}$ g/(m$^2$·24 h) or less each measured by a method according to JIS K 7126-1987.

Materials for forming the barrier film are preferably materials having a function which inhibits matters deteriorating the device, such as moisture, oxygen and the like from being penetrated, and silicon oxide, silicon dioxide, silicon nitride and the like can be used. Further, the above film is more preferably provided with a laminate structure of an inorganic layer of the above materials and a layer comprising an organic material in order to improve a fragility of the film. A lamination order of the inorganic layer and the organic layer shall not specifically be restricted, and both are preferably laminated plural times in an alternate manner.

A forming method of the barrier film shall not specifically be restricted, and capable of being used are, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method and the like. The atmospheric pressure plasma polymerization method described in JP-A 2004-68143 is particularly preferred.

The opaque supporting substrate includes, for example, metal plates of aluminum, stainless steel and the like, films, opaque resin substrates, substrates made of ceramics, and the like.

An outside extraction efficiency of light at room temperature in the organic EL device of the present invention is preferably 1% or more, more preferably 5% or more.

In this regard, an outside extraction quantum efficiency (%) is (the number of photons emitted to the outside of the organic EL device)/(the number of electrons injected into the organic EL device)×100.

Also, a hue-improving filter such as a color filter and the like may be used in combination, and a color conversion filter which converts the color of light emitted from the organic EL device to a multicolor by using a fluorescent substance may be used in combination. When the color conversion filter is used, light emitted from the organic EL device has a λmax of preferably 480 nm or less.

«Sealing»

A sealing means used in the present invention includes, for example, a method in which a sealing member is adhered to an electrode and a supporting substrate by an adhesive.

The sealing member is arranged preferably so that it covers the display region of the organic EL device, and it may be concave or flat. Also, a transparency and an electric insulation property thereof do not specifically matter.

To be specific, it includes a glass plate, a polymer plate•film, a metal plate•film and the like. Particularly soda lime glass, barium•strontium-containing glass, lead glass, aluminosilicate glass, borosilicate glass, barium borosilicate glass, quartz and the like can be listed as the glass plate.

Also, plates formed from polycarbonate, acryl, polyethylene terephthalate, polyether sulfide, polysulfone and the like can be listed as the polymer plate.

The metal plates include plates comprising at least one metal or alloy selected from the group consisting of stainless steal, iron, copper, aluminum, magnesium, nickel, zinc, chromium, titanium, molybdenum, silicon, germanium and tantalum.

In the present invention, the polymer films and the metal films can be preferably used because of the reason that the device can be prepared in a thin film form.

Further, the polymer film has preferably an oxygen permeability of $1 \times 10^{-3}$ ml/(m$^2$·24 h·atm) or less measured by the method according to JIS K 7126-1987 and a moisture permeability (25±0.5° C., relative humidity (90±2) % RH) of $1 \times 10^{-3}$ g/(m$^2$·24 h) or less measured by the method according to JIS K 7129-1992.

The sealing member is processed in a concave form by using sand blast processing, chemical etching processing and the like.

The adhesive includes, to be specific, photo-curing and thermosetting adhesives of acrylic acid base oligomers and methacrylic acid base oligomers having a reactive vinyl group and moisture-curing adhesives of 2-cyanoacrylic acid esters and the like. Further, it includes polyamides, polyesters and polyolefins of a hot melt type. Also, it includes UV-curing epoxy resin adhesives of a cation-curing type.

The organic EL device is deteriorated by heat treatment in a certain case, and therefore the adhesives can be preferably cured at room temperature to 80° C. A drying agent may be dispersed in the adhesive described above. The adhesive may be applied on the sealing part by means of a commercial dispenser or printing in the manner of screen printing.

Further, a layer of an inorganic matter or an organic matter is formed on an outside of the electrode at a side which interposes the organic layer and is opposite to the supporting substrate in a form in which the above layer covers the electrode and the organic layer and is brought into contact with the supporting substrate, and the above layer can suitably be set as a sealing film. In the above case, materials for forming the above film are preferably materials having a function which inhibits matters deteriorating the device, such as moisture, oxygen and the like from being penetrated, and silicon oxide, silicon dioxide, silicon nitride and the like can be used.

Further, the above film is preferably provided with a laminate structure of an inorganic layer of the above materials and a layer comprising an organic material in order to improve a fragility of the above film. A method for forming the above film shall not specifically be restricted, and capable of being used are, for example, a vacuum deposition method, a sputtering method, a reactive sputtering method, a molecular beam epitaxy method, a cluster ion beam method, an ion plating method, a plasma polymerization method, an atmospheric pressure plasma polymerization method, a plasma CVD method, a laser CVD method, a thermal CVD method, a coating method and the like.

In a case of a gas phase and a liquid phase, inert gases such as nitrogen, argon and the like and inert fluids such as fluorinated hydrocarbons, silicone oils and the like are preferably injected into a gap between the sealing member and the display region of the organic EL device. Further, the gap can be put in a vacuum state. Also, a hygroscopic compound can be put as well into an inside of the gap.

The hygroscopic compound includes, for example, metal oxides (for example, sodium oxide, potassium oxide, calcium oxide, barium oxide, magnesium oxide, aluminum oxide and the like), sulfates (for example, sodium sulfate, calcium sulfate, magnesium sulfate, cobalt sulfate and the like), metal halides (for example, calcium chloride, magnesium chloride, cesium fluoride, tantalum fluoride, cerium bromide, magnesium bromide, barium iodide, magnesium iodide and the like), perchlorates (for example, barium perchlorate, magnesium perchlorate and the like) and the like, and in cases of the sulfates, the metal halides and the perchlorates, the anhydrides are suitably used.

«Protective Film and Protective Plate»

A protective film or a protective plate may be provided on an outside of the sealing membrane or the sealing film described above at a side which interposes the organic layer and which is opposite to the supporting substrate in order to enhance a mechanical strength of the device. Particularly when the device is sealed by the sealing membrane described above, a mechanical strength thereof is not necessarily high, and the therefore such the protective film or the protective plate as described above is preferably provided. The same glass plate, polymer plate•film, metal plate•film and the like as used for the sealing described above are preferably used as materials which can be used for the above protective film or protective plate, and the polymer film is preferably used from the viewpoint of a reduction in a weight and a thickness.

«Light Extraction»

It is usually said that in an organic EL device, only 15 to 20% of light which is emitted in an inside of a layer having a higher refractive index (refractive index: 1.7 to 2.1) than that of air and which is generated in a emitting layer is extracted. This is due to that light injected into an interface (interface between a transparent substrate and air) at a larger angle θ than a critical angle is totally reflected and can not be extracted to an outside of the device and that light is totally reflected between the transparent electrode or the light-emitting layer and the transparent substrate and guided through the transparent electrode or the light-emitting layer to result in that light turns away to a side direction of the device.

A method for enhancing an efficiency of extracting light includes, for example, a method in which irregularities are formed on the surface of a transparent substrate to prevent light from being totally reflected on an interface between the transparent substrate and air (U.S. Pat. No. 4,774,435), a method in which a substrate is provided with a light-concentrating property to thereby enhance the efficiency (JP-A 1988-314795), a method in which a reflection face is formed on a side of the device (JP-A 1-220394), a method in which a flat layer having a middle refractive index is introduced between a substrate and a luminous member to form a reflection-preventing film (JP-A 1987-172691), a method in which a flat layer having a lower refractive index than that of a substrate is introduced between the substrate and a luminous member (JP-A 2001-202827), a method in which a diffraction grating is formed between any of a substrate, a transparent electrode layer and a light-emitting layer (including a space between the substrate and the outside) (JP-A 11-283751) and the like.

In the present invention, the above methods can be used by combining with the organic EL device of the present invention, and capable of being suitably used is the method in which a flat layer having a lower refractive index than that of a substrate is introduced into a space between the substrate and a luminous member or the method in which a diffraction grating is formed in a space between any of a substrate, a transparent electrode layer and a light-emitting layer (including a space between the substrate and the outside).

Combination of the above means in the present invention makes it possible to provide the device which has a higher brightness and is more excellent in a durability.

If a medium having a low refractive index is formed between the transparent electrode and the transparent substrate in a longer thickness than a wavelength of light, the lower the refractive index of the medium is, the higher the outside extraction efficiency of light coming out from the transparent electrode is. The low refractive layer includes, for example, layers comprising aerogel, porous silica, magnesium fluoride, fluorine base polymers and the like. The transparent substrate has usually a refractive index of 1.5 to 1.7, and therefore the low refractive index layer has a refractive index of preferably about 1.5 or lower, more preferably 1.35 or lower.

Also, a thickness of the low refractive index medium is preferably as large by two times or more as a wavelength in the medium. This is because when a thickness of the low refractive index medium becomes about a wavelength of light and is provided with such a film thickness that an electromagnetic wave coming out in an evanescent form gets into the substrate, the low refractive index layer is reduced in an effect.

A method in which a diffraction grating is introduced into an interface or any medium causing total reflection is characterized by having a high effect of enhancing a light extraction efficiency. The above method makes use of the property that a direction of light can be turned to a specific direction which is different from that of refraction by so-called Bragg diffraction such as primary diffraction and secondary diffraction and intends to diffract light which can not go out due to total reflection between the layers among lights generated from the light-emitting layer by introducing a diffraction grating into a space between any layers or the medium (an inside of the transparent substrate and an inside of the transparent electrode) and extract the light to the outside.

The diffraction grating introduced has preferably a two-dimensional periodic refractive index. This is because of the reasons that since light emitted in a light-emitting layer is radiated to all directions at random, only light which advances in a specific direction is diffracted in a general one-dimensional diffraction grating having a periodic refractive index distribution only in a certain direction and that an extraction efficiency of light is not enhanced so much.

However, two-dimensionally distributing a refractive index causes light proceeding to all directions to be refracted and enhances an extraction efficiency of light.

A position in which the diffraction grating is introduced may be, as described above, any layers or the medium (an inside of the transparent substrate and an inside of the transparent electrode), and it is preferably the vicinity of the organic light-emitting layer which is a place for generating light. In the above case, a period of the diffraction grating is preferably as large by ½ to 3 times as a wavelength of light in the medium.

The diffraction grating is preferably arranged repeatedly in a two-dimensional manner such as a square lattice form, a triangular lattice form, a honeycomb lattice form and the like.

«Light-Concentrating Sheet»

The organic EL device of the present invention is processed to provide, for example, a structure of a microlens array form in a light extraction side of the substrate, or it is combined with a so-called light-concentrating sheet, whereby light can be concentrated to a specific direction, for example, a front direction toward a light-emitting face of the device to thereby enhance a brightness thereof on a specific direction.

A quadrangular pyramid having a side of 30 µm and a vertical angle of 90 degrees is two-dimensionally arranged as the example of the microlens array at a light extraction side of the substrate. A size of one side is preferably 10 to 100 µm. If it is smaller than the above range, an effect of diffraction is brought about to cause coloration, and if it is too large, a thickness thereof is increased. Accordingly, both are not preferred.

A sheet which is put into practical use, for example, in a LED backlight of a liquid crystal display device can be used as the light-concentrating sheet. For example, a brightness-enhancing film (BEF) manufactured by Sumitomo 3M Limited can be used as the above sheet. The form of the prism sheet may be, for example, a form in which triangular stripes having a vertical angle of 90 degrees and a pitch of 50 µm are formed on a base material, or may be a form in which a vertical angle is rounded, a form in which pitches are changed at random and other forms.

Also, a diffusion plate•film may be used in combination with the light-concentrating sheet in order to control an angle of light emitted from the light emitting device. For example, a diffusion film (light up) manufactured by Kimoto Co., Ltd. can be used.

«Production Process for Organic EL Device»

A production process for a device comprising an anode/hole-injecting layer (anode buffer layer)/hole-transporting layer/light-emitting layer/hole-blocking layer/electron-transporting layer/electron-injecting layer (cathode buffer layer)/cathode shall be explained as one example of the production process for an organic EL device.

First, a thin film comprising a desired electrode substance, for example, a substance for an anode is formed on a suitable substrate in a film thickness of 1 µm or less, preferably 10 to 200 nm to prepare an anode.

Next, formed thereon are thin films containing organic compounds, such as a hole-injecting layer, a hole-transporting layer, a light-emitting layer, a hole-blocking layer, an electron-transporting layer, an electron-injecting layer and the like which are device materials.

The thin films can be formed by a forming method such as, for example, a vacuum deposition method, a wet method (called as well a wet process) and the like.

The wet method includes a spin coating method, a casting method, a die coating method, a blade coating method, a roll coating method, an ink jet method, a printing method, a spray coating method, a curtain coating method, an LB method and the like, and a method having a roll- to roll system aptitude, such as a die coating method, a roll coating method, an ink jet method, a spray coating method and the like are preferred from the viewpoints of enabling to form a precise thin film and enhancing a productivity. Also, different film-forming methods may be applied every layer.

Liquid media for dissolving or dispersing the organic EL materials used in the present invention include, for example, organic solvents including ketones such as methyl ethyl ketone, cyclohexanone and the like, fatty acid esters such as ethyl acetate and the like, halogenated hydrocarbons such as dichlorobenzene and the like, aromatic hydrocarbons such as benzene, toluene, xylene, mesitylene, cyclohexylbenzene and the like, aliphatic hydrocarbons such as cyclohexane, decalin, dodecane and the like, DMF, DMSO and the like.

They can be dispersed by a dispersing method such as a supersonic wave, high shearing for dispersion, media dispersion and the like.

After forming the above layers, a thin film comprising a substance for a cathode is formed thereon in a film thickness falling in a range of 1 µm or less, preferably 50 to 200 nm to provide a cathode, whereby the desired organic EL device is obtained.

Also, the thin films can be prepared in an order of, to reverse the order thereof, a cathode, an electron-injecting layer, an electron-transporting layer, a hole-blocking layer, a light-emitting layer, a hole-transporting layer, a hole-injecting layer and an anode.

The organic EL device of the present invention is prepared preferably by forming a hole-injecting layer up to a cathode in an integrated manner by one vacuuming, and it may be taken out in the middle of preparation and subjected to different film formation. In the above case, the operation is carried out preferably in a dry inert gas atmosphere.

«Uses»

The organic EL device of the present invention can be used as display devices, displays and various emission sources. The emission sources include, for example, lighting equipments (household lighting equipments, car lighting equipments), backlights for watches and liquid crystals, advertising boards, traffic signals, light sources for optical storage media, light sources for electrophotographic copiers, light sources for optical communication processors, light sources for optical sensors and the like, but they shall not be restricted to them. In particular, it can effectively be used for applications in backlights for liquid crystal display devices and light sources for illumination.

In the organic EL device of the present invention, patterning may be carried out, if necessary, in forming the films by metal masking and ink jet printing methods and the like. When carrying out the patterning, only the electrodes may be patterned or the electrodes and the light-emitting layer may be patterned or all the layer of the device may be patterned. In preparing the device, methods which have so far been publicly known can be used. The colors of lights emitted by the organic EL device of the present invention and the compounds according to the present invention are determined by colors obtained when results obtained by measuring by means of a spectral radiance meter CS-1000 (manufactured by Konica Minolta Sensing, Inc.) are applied to a CIE chromaticity coordinate in FIG. 4.16 at page 108 of [New Edition Color Science Handbook] (edited by Color Science Association of Japan, University of Tokyo Press, 1985).

Also, when the organic EL device of the present invention is a white device, a white color means that when a two degree viewing angle front brightness is measured by the method described above, a chromaticity at 1000 cd/m$^2$ in a CIE1931 color system is present in a region of X=0.33±0.07, Y=0.33±0.1.

«Display Device»

The display device of the present invention shall be explained. The display device of the present invention is provided with the organic EL device of the present invention. The display device of the present invention may be either single color or multicolor, and in this case, a multicolor display device shall be explained.

In a case of the multicolor display device, a shadow mask is provided only in forming a light-emitting layer, and a film can be formed on a whole surface by a deposition method, a casting method, a spin coating method, an ink jet method, a printing method and the like.

When patterning is carried out only on the light-emitting layer, a method therefor shall not be restricted, and it is carried out preferably by a deposition method, an ink jet method, a spin coating method or a printing method.

The constitution of the organic EL device provided in the display device is selected, if necessary, from the foregoing constitutional examples of the organic EL device.

A production process for the organic EL device is shown in one embodiment of the organic EL device of the present invention described above.

When a direct current voltage is applied to the multicolor display device thus obtained, a voltage of 2 to 40 V is applied with an anode set to a polarity of + and a cathode set to a polarity of −, and light can be observed to be emitted. Also, if a voltage is applied at a reverse polarity, an electric current does not flow, and light is not emitted at all. Further, when an alternating current voltage is applied, light is emitted only in a state in which an anode is set to + and in which a cathode is set to −. A waveform of an alternating current applied may be optional.

The multicolor display device can be used as display devices, displays and various emission sources. In the display device and the display, three kinds of the organic EL devices of blue, red and green emissions are used, whereby full colors can be displayed.

The display device and the display include TV, personal computers, mobile devices, AV devices, teletext broadcasting display, information display in automobiles and the like. In particular, they may be used as a display device for reproducing still images and dynamic images, and an operating system used when they are used as a display device for reproducing dynamic images may be either of a simple matrix (passive matrix) system and an active matrix system.

The emission sources include household lighting equipments, car lighting equipments, backlights for watches and liquid crystals, advertising boards, traffic signals, light sources for optical storage media, light sources for electrophotographic copiers, light sources for optical communication processors, light sources for optical sensors and the like, but they shall not be restricted to them.

One example of the display device provided with the organic EL device of the present invention shall be explained below based on drawings. FIG. 1 is a schematic drawing showing one example of the display device constituted from the organic EL device. It is a schematic drawing showing a display in which image informations are displayed by emission of an organic EL device, for example, a display of a cellular phone and the like.

A display 1 comprises a display part A having plural pixels, a controlling part B in which images on the display part A are scanned based on image informations, and the like. The controlling part B is electrically connected with the display part A and send scanning signals and image data signals to respective plural pixels based image informations input from the outside, wherein the pixels on every scanning line emit light in order by the scanning signals according to the image data signals and scan the images to display the image informations on the display part A.

Figure 2:
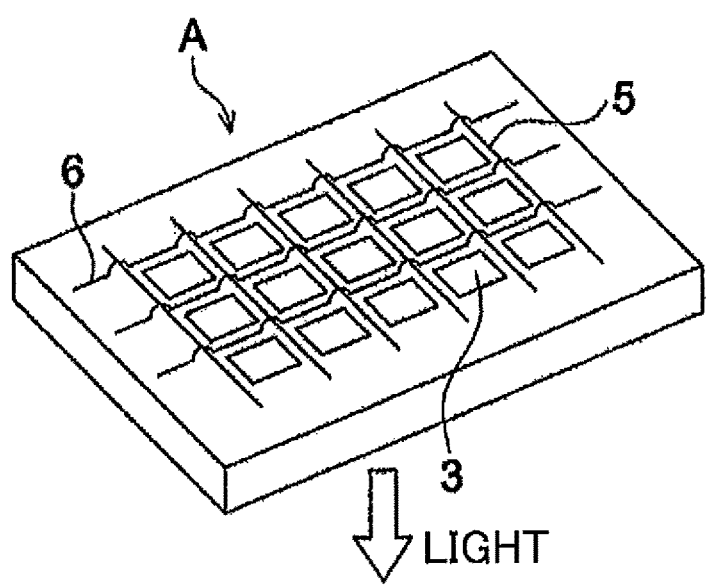
FIG. 2 is a schematic drawing of a display part A in FIG. 1.

FIG. 2 is a schematic drawing of the display part A.

The display part A has a wiring part including plural scanning lines 5 and data lines 6 and plural pixels 3 on a substrate. The principal members of the display part A shall be explained below.

In FIG. 2, a case in which light emitted by the pixel 3 is extracted to a white arrow direction (downward direction) is shown.

The scanning lines 5 and the plural data lines 6 in the wiring part comprise conductive materials respectively and are orthogonal in a lattice form, and they are connected with the pixel 3 in an orthogonal position (details are not illustrated).

When the scanning signals are input from the scanning lines 5, the pixels 3 receive the image data signals from the data lines 6 and emit light according to the image data received. Arranging suitably pixels emitting light of a red color region, pixels emitting light of a green color region and pixels emitting light of a blue color region on the same substrate makes it possible to display images in full colors.

Figure 3:
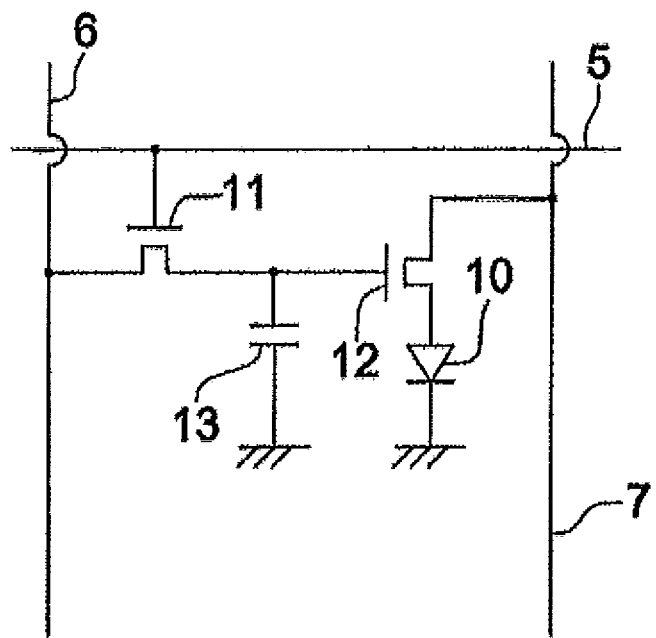
FIG. 3 is a schematic drawing of a pixel.

Next, an emission process of the pixels shall be explained. FIG. 3 is a schematic drawing of a pixel. The pixel is provided with an organic EL device 10, a switching transistor 11, an operating transistor 12, a capacitor 13 and the like. The organic EL devices emitting red light, green light and blue light are used for plural pixels as the organic EL device and arranged on the same substrate, whereby images can be displayed in full colors.

In FIG. 3, the image data signals are input from the controlling part B into a drain of the switching transistor 11 via the data lines 6. When the scanning data are input from the controlling part B into a gate of the switching transistor 11 via the scanning lines 5, the switching transistor 11 is on in operation, and the image data signals input into the drain are transferred to the gates of the capacitor 13 and the operating transistor 12.

The capacitor 13 is charged according to a potential of the image data signals by transferring of the image data signals, and the operating transistor 12 is on in operation. The drain of the operating transistor 12 is connected with a power source line 7, and the source is connected with the electrode of the organic EL device 10, whereby an electric current is supplied from the power source line 7 to the organic EL device 10 according to a potential of the image data signals which is applied to the gate.

When the scanning signal is transferred to the next scanning line 5 by sequential scanning in the controlling part B, the switching transistor 11 is off in operation. However, even after the switching transistor 11 is off in operation, the capacitor 13 maintains a charged potential of the image data signals, and therefore operation of the operating transistor 12 is maintained in an on-state, so that the organic EL device 10 is continued to emit until the next scanning signal is input. When the scanning signals are input next time by sequential scanning, the operating transistor 12 is operated according to a potential of the next image data signals synchronized with the scanning signals, and the organic EL device 10 emits light.

That is, the organic EL devices 10 in the respective plural pixels are provided with the switching transistor 11 which is an active device and the operating transistor 1 to cause the organic EL devices 10 in the respective plural pixels to emit light. The above emission method is called an active matrix system.

In this regard, the organic EL device 10 may be caused to emit light in plural gradations by the image data signals of a multiple value having plural gradational potentials or emit light by on and off of a prescribed luminous amount according to the image data signals of two values. Also, a potential of the capacitor 13 may be continued to be held until the next scanning signals are input or may be discharged immediately before the next scanning signals are input.

In the present invention, the organic EL device may be caused to emit light as well, without being limited to the active matrix system described above, by a passive matrix system in which an organic EL device is caused to emit light according to data signals only when scanning signals are input for scanning.

Figure 4A:
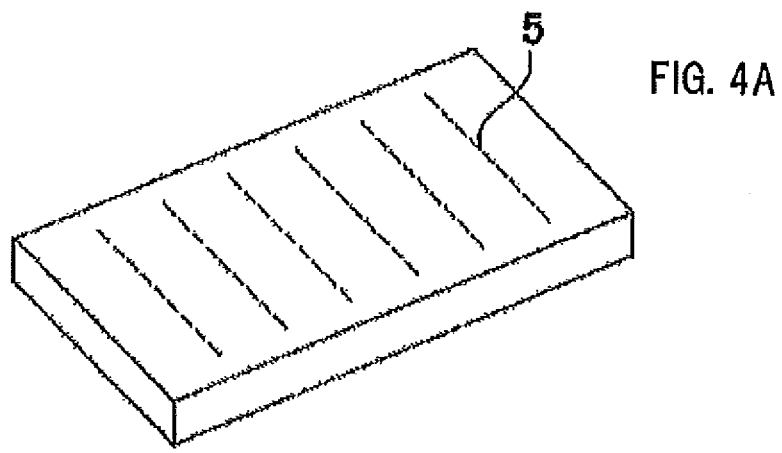
Figure 4B:
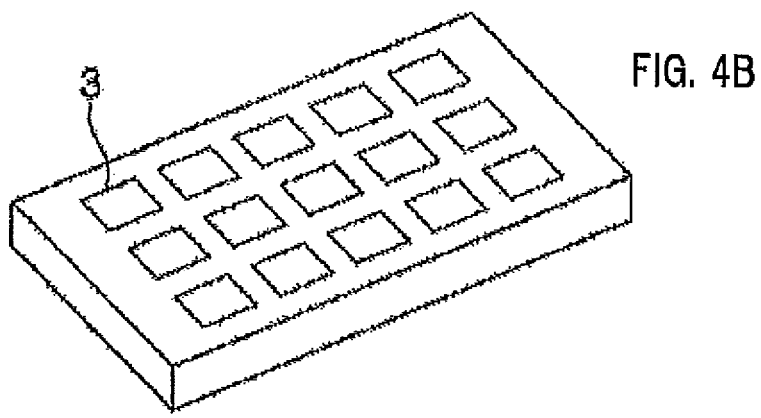
Figure 4C:
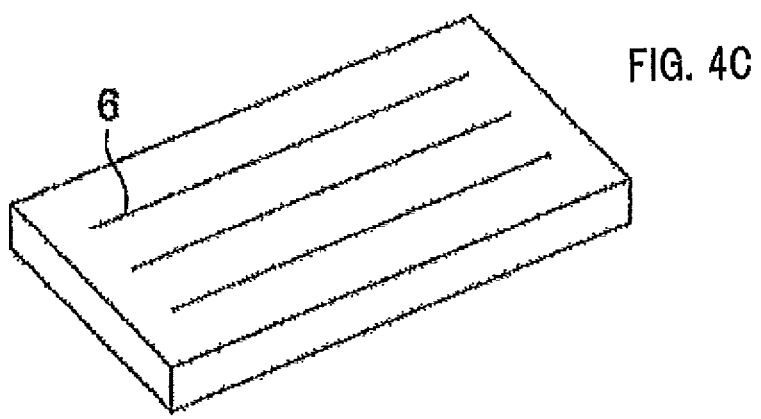

FIG. 4 is a schematic drawing of a display device of a passive matrix system. In FIG. 4, plural scanning lines 5 and plural image data lines 6 are provided oppositely in a lattice form with pixels 3 being interposed therebetween. When the scanning signals of the scanning lines are applied by sequential scanning, the pixels 3 connected with the scanning lines 5 applied emit light according to the image data signals. In the passive matrix system, active devices are not mounted in the pixels 3, and the production process can be reduced.

«Lighting Equipment»

The lighting equipment of the present invention shall be explained. The lighting equipment of the present invention is provided with the organic EL device of the present invention. The organic EL device of the present invention may be used in the form of an organic EL device provided with a resonator structure, and the use purposes of the organic EL device having the above resonator structure includes light sources for optical storage media, light sources for electrophotographic copiers, light sources for optical communication processors, light sources for optical sensors and the like, but they shall not be restricted to them. Also, the organic EL device of the present invention may be used for the applications described above by subjecting it to laser oscillation.

Also, the organic EL device of the present invention may be used as a kind of lamps for lighting sources and exposing sources or may be used as projection devices of a type for projecting images and display devices (displays) of a type for seeing directly static images and dynamic images. An operating system used when they are used as a display device for reproducing dynamic images may be either of a simple matrix (passive matrix) system and an active matrix system. Or, use of two or more kinds of the organic EL devices of the present invention having different luminescent colors makes it possible to prepare a full color display device.

Also, the organic EL material of the present invention can be applied to organic EL devices emitting substantially white light as lighting equipments. Plural luminescent materials are caused to emit plural lights having plural luminescent colors at the same time, and the plural colors are mixed, whereby light having a white color is obtained. The combination of the plural luminescent colors may be a mixture of three emission maximum wavelengths of red, green and blue or a mixture of two emission maximum wavelengths thereof making use of a complementary color relation of blue and yellow, bluish green and orange and the like.

Also, the combination of the luminescent materials for obtaining plural luminescent colors may be any of the combination of plural materials emitting plural phosphorescences or fluorescences and the combination of a luminescent material emitting phosphorescence or fluorescence and a pigment material which emits light emitted coming from the luminescent material in the form of excited light, and in the white organic EL device according to the present invention, plural luminous dopants are merely combined and mixed.

Masks are provided only in forming a light-emitting layer, a hole-transporting layer, an electron-transporting layer and the like, and they are arranged in such a simple manner as applying them separately by the masks. Since the other layers are common, patterning by the masks is unnecessary, and an electrode film can be formed on a whole surface by a deposition method, a casting method, a spin coating method, an ink jet method, a printing method and the like, so that the productivity is enhanced as well. According to the above method, the device itself emits white light unlike the white organic EL device prepared by arranging plural devices each emitting lights of different colors in parallel in an array form. The luminescent materials used for the light-emitting layer shall not specifically be restricted, and in a case of, for example, a backlight for a liquid crystal display device, the metal complexes according to the present invention and those optionally selected from publicly known luminescent materials are combined so that they fit to a wavelength range corresponding to the CF (color filter) characteristics, whereby white color emission is obtained.

«One Embodiment of the Lighting Equipment of the Present Invention»

One embodiment of the lighting equipment of the present invention provided with the organic EL device of the present invention shall be explained.

Figure 5:
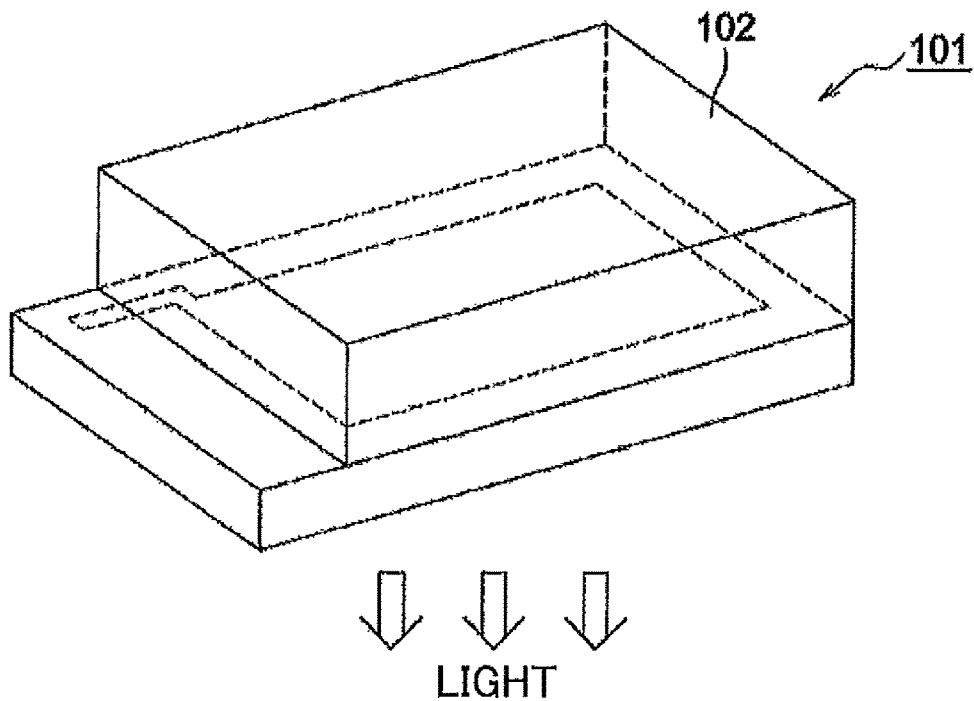
FIG. 5 is an outline drawing of a lighting equipment.
Figure 6:
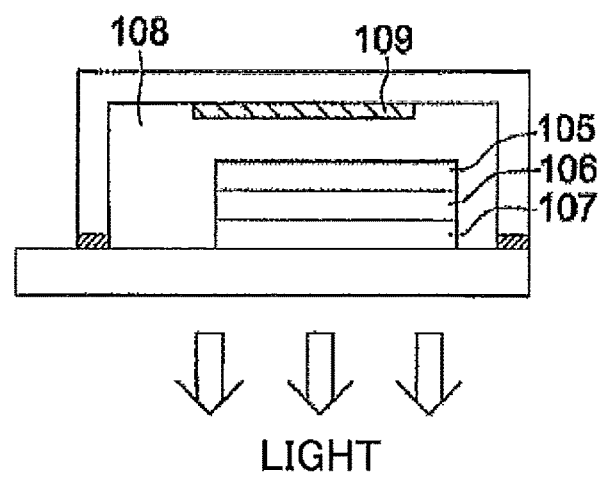
FIG. 6 is a schematic drawing of a lighting equipment.
Figure 7A:
FIGS. 7A-7E are outline constitutional drawings of an organic EL full color display device.
Figure 7B:
Figure 7C:
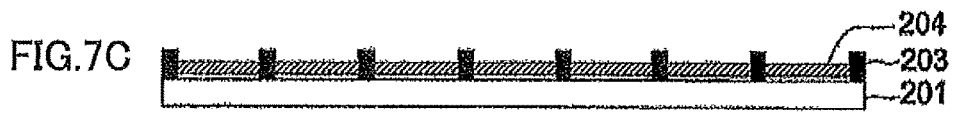
Figure 7D:
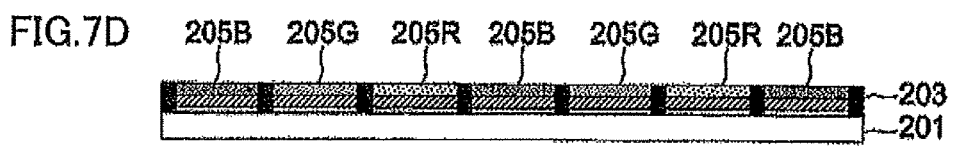
Figure 7E:
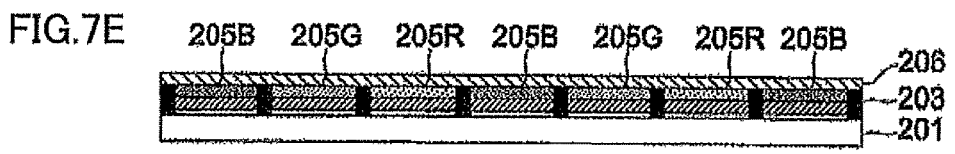

A non-luminescent plane of the organic EL device of the present invention is covered with a glass case, and a glass substrate having a thickness of 300 μm is used as a sealing substrate, wherein an epoxy base photo-curing adhesive (Luxtrack LC0629B, manufactured by Toagosei Co., Ltd.) is applied as a sealant to a periphery thereof; this is superposed on a cathode and tightly adhered to a transparent supporting substrate, and the adhesive is irradiated with a UV ray from a glass substrate side and cured to seal the glass case, whereby a lighting equipment shown in FIG. 5 and FIG. 6 can be prepared.

FIG. 5 shows an outline drawing of the lighting equipment, and the organic EL device 101 of the present invention is covered with a glass cover 102 (an operation for sealing with the glass cover was carried out in a glove box (under the atmosphere of nitrogen having a high purity of 99.999% or more) under nitrogen atmosphere without exposing the organic EL device 101 to the air.

FIG. 6 shows a cross-sectional drawing of the lighting equipment, wherein in FIG. 6, 104 shows a cathode; 106 shows an organic EL layer; and 107 shows a glass substrate equipped with a transparent electrode. An inside of the glass cover 102 (refer to FIG. 5) is filled with a nitrogen gas 108, and a moisture scavenger 109 is provided therein.

EXAMPLES

The present invention shall be explained in detail with reference to examples, but the present invention shall not be restricted to them. The structures of compounds used in the examples explained below are shown below.

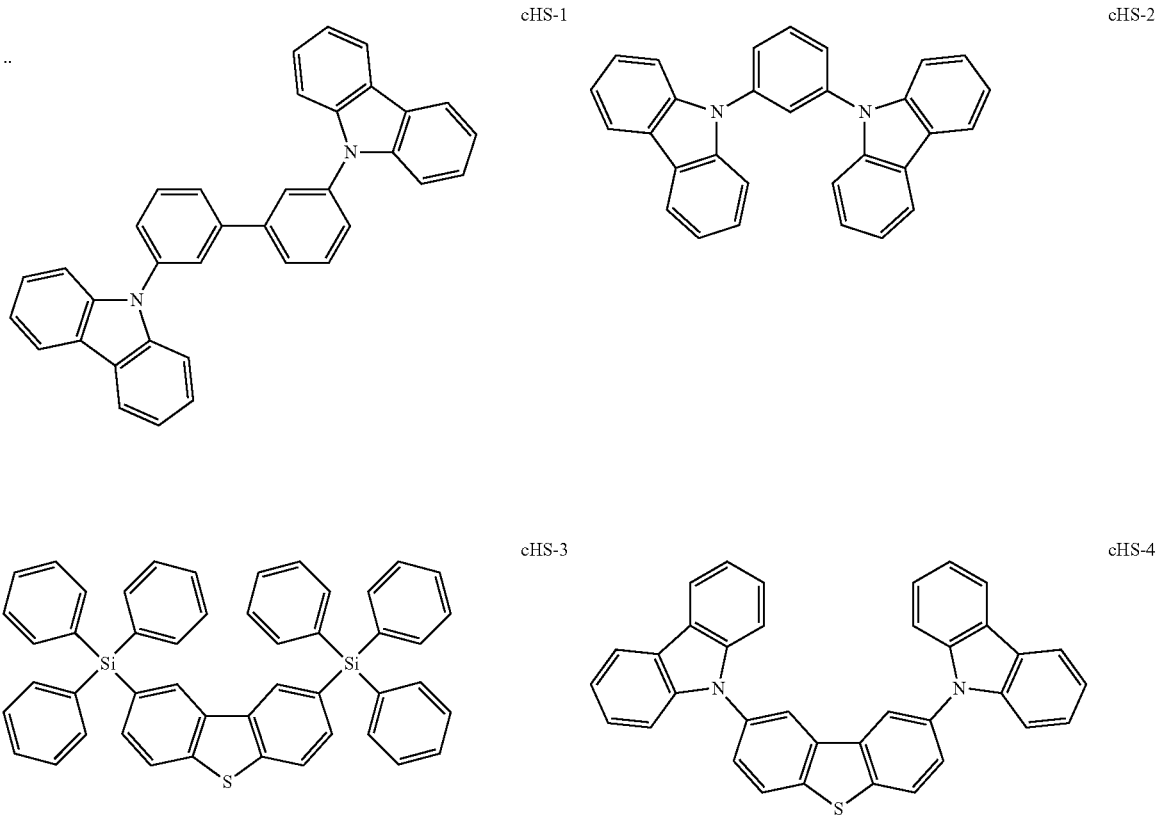

-continued cHS-5
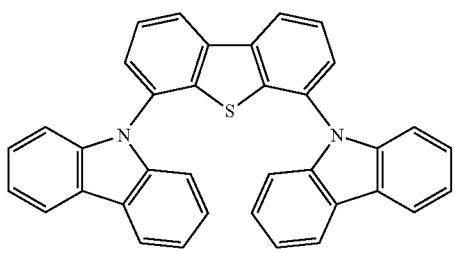

cHS-6
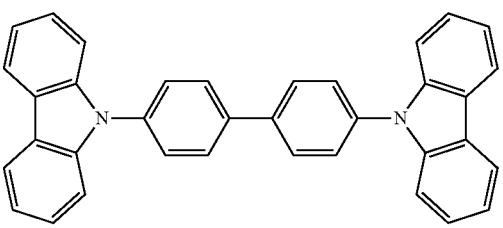

cDP-1
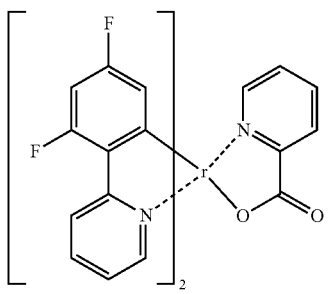

cDP-2
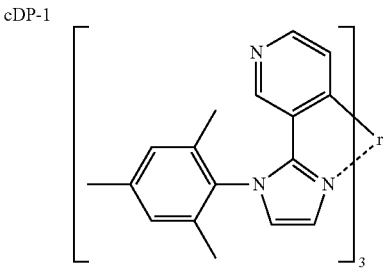

cDP-3
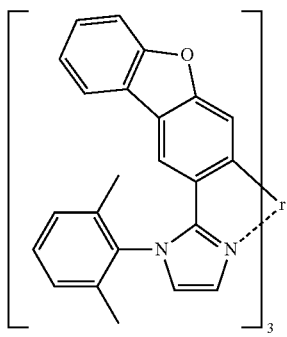

cDP-4
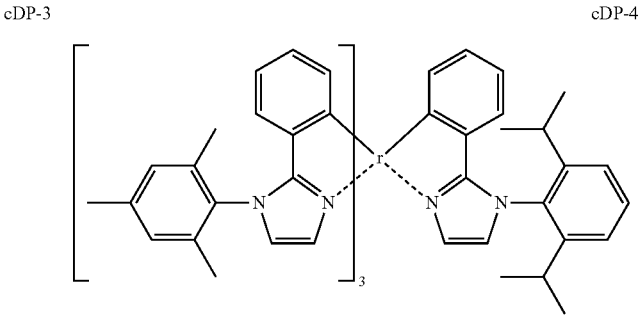

cDP-5
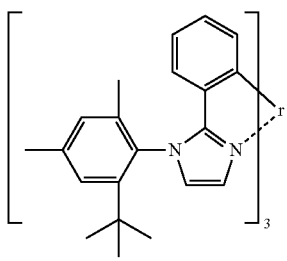

ADS-254
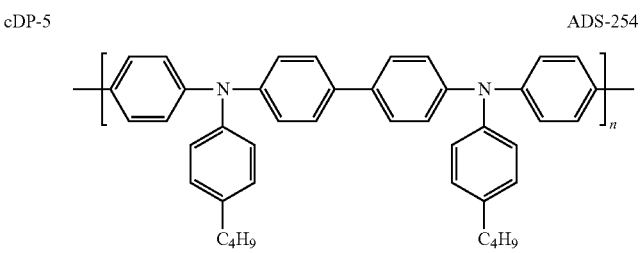

Example 1

«Preparation of Organic EL Device 1-1»

A substrate (NA45 manufactured by AvanStrate Inc.) on which ITO (indium tin oxide) was deposited in a thickness of 100 nm on a glass substrate of 100 mm×100 mm×1.1 mm to form a film as an anode was subjected to patterning, and then the above transparent supporting substrate provided with an ITO transparent electrode was subjected to ultrasonic cleaning in isopropyl alcohol, dried with a dry nitrogen gas and subjected to UV ozone cleaning for 5 minutes.

The above transparent supporting substrate was fixed on a substrate holder of a commercial vacuum evaporation equipment. On the other hand, 200 mg of HT-30, 200 mg of HT-2, 200 mg of cHS-1, 200 mg of cDP-1, 200 mg of ET-8 and 200 mg of ET-7 were put separately in molybdenum-made resistance heating boats, and they were mounted in the vacuum evaporation equipment.

Next, a vacuum chamber was reduced in a pressure down to $4\times10^{-4}$ Pa, and then the foregoing heating boat containing HT-30 was heated by causing an electric current to pass, whereby HT-30 was deposited on the transparent supporting substrate at a deposition rate of 0.1 nm/second to form a hole-injecting layer having a thickness of 10 nm.

Further, the foregoing heating boat containing HT-2 was heated by causing an electric current to pass, whereby HT-2 was deposited on the hole-injecting layer described above at a deposition rate of 0.1 nm/second to form a hole-transporting layer having a thickness of 30 nm.

Further, the foregoing heating boats containing cHS-1 and cDP-1 were heated by causing an electric current to pass, whereby cHS-1 and cDP-1 were co-deposited on the hole-transporting layer described above at the deposition rates of 0.1 nm/second and 0.010 nm/second respectively to form a light-emitting layer having a thickness of 40 nm.

Further, the foregoing heating boat containing ET-8 was heated by causing an electric current to pass, whereby ET-8 was deposited on the light-emitting layer described above at a deposition rate of 0.1 nm/second to form a hole-blocking layer having a thickness of 10 nm.

Further, the foregoing heating boat containing ET-7 was heated by causing an electric current to pass, whereby HT-2 was deposited on the hole-blocking layer described above at a deposition rate of 0.1 nm/second to form an electron-transporting layer having a thickness of 30 nm.

Continuously, lithium fluoride was deposited thereon as an electron-injecting layer (cathode buffer layer) in a thickness of 0.5 nm, and aluminum was further deposited thereon in a thickness of 110 nm to form a cathode, whereby an organic EL device 1-1 was prepared.

《Preparation of Organic EL Devices 1-2 to 1-14》

Organic EL devices 1-2 to 1-14 were prepared in the same manner, except that in preparing the organic EL device 1-1, the dopant compound and the host compound were changed to compounds described in Table 1.

《Evaluation of Organic EL Devices 1-1 to 1-14》

In evaluating the organic EL devices 1-1 to 1-14 thus obtained, a non-luminescent plane of each organic EL device after prepared was covered with a glass case, and a glass substrate having a thickness of 300 μm was used as a sealing substrate. An epoxy base photo-curing adhesive (Luxtrack LC0629B, manufactured by Toagosei Co., Ltd.) was applied as a sealant to a periphery thereof, and this was superposed on the cathode and tightly adhered to the transparent supporting substrate described above. The device was irradiated with a UV ray from a glass substrate side to cure the adhesive and seal the glass case, whereby a lighting equipment shown in FIG. 5 and FIG. 6 was prepared and evaluated.

The respective samples thus prepared were used to evaluate the following items. The results obtained are shown in Table 1.

(1) Outside Extraction Quantum Efficiency (Called Merely as an Efficiency):

The organic EL device was lighted at room temperature (about 23 to 25° C.) on a constant current condition of 2.5 mA/cm$^2$ to measure a luminous brightness (L) [cd/m$^2$] immediately after starting lighting, whereby the outside extraction quantum efficiency (η) was calculated.

In this regard, the luminous brightness was measured by means of CS-1000 (manufactured by Konica Minolta Sensing, Inc.), and the outside extraction quantum efficiency was shown by a relative value, wherein the value of the organic EL device 1-1 was set to 100.

(2) Half Life:

The half life was evaluated according to a measuring method shown below. The respective organic EL devices were subjected to constant current operation at an electric current providing an initial brightness of 1000 cd/m$^2$ to determine time at which the brightness was reduced to ½ (500 cd/m$^2$) of the initial brightness, and this was set to a scale of the half life. The half life was shown by a relative value, wherein the value of the organic EL device 1-1 was set to 100.

(3) Operating Voltage:

The organic EL devices were operated at room temperature (about 23 to 25° C.) on a constant current condition of 2.5 mA/cm$^2$ to measure the voltages thereof respectively, and the evaluation results each were shown by a relative value as shown below, wherein the value of the organic EL device 1-1 was set to 100.

Voltage=(operating voltage of each device)/(operating voltage of organic EL device 1-1)×100

It is shown that the lower the value is, the lower the operating voltage is on a basis of the comparison.

(4) Rise in Voltage in Operating:

The organic EL devices were operated at room temperature (about 23 to 25° C.) on a constant current condition of 2.5 mA/cm$^2$ to measure the voltages thereof respectively, and the results of the voltages measured above were introduced into a calculation formula shown below to calculate a rise in the voltage in operation. The results obtained are shown in Table 1.

They were shown by a relative value, wherein the value of the organic EL device 1-1 was set to 100.

Rise in voltage in operation (relative value)=(operating voltage in reduction of brightness by half)−(initial operating voltage)

It is shown that the lower the value is, the lower the rise in the voltage in operation is on a basis of the comparison.

(5) Ageing Stability:

The organic EL devices were stored for one month on the conditions of 60° C. and 70% RH, and then the respective power efficiencies before and after stored were determined. The respective power efficiency ratios were determined according the following formula, and this was set to a scale of the ageing stability.

Ageing stability (%)=(power efficiency after stored)/(power efficiency before stored)×100

A front brightness and a brightness angle dependency of the respective organic EL devices were measured by means of a spectral radiance meter CS-1000 (manufactured by Konica Minolta Sensing, Inc.), and the value determined at a front brightness of 1000 cd/m$^2$ was used as the power efficiency.

TABLE 1

| Device No. | Dopant | Host | Outside extraction quantum efficiency | Half life | Operating voltage | Rise in voltage in operation | Ageing stability | Remarks |
| --- | --- | --- | --- | --- | --- | --- | --- | --- |
| 1-1 | cDP-1 | cHS-1 | 100 | 100 | 100 | 100 | 44 | Comparative Example |
| 1-2 | DP-6 | cHS-1 | 103 | 238 | 93 | 90 | 46 | Comparative Example |
| 1-3 | DP-58 | cHS-1 | 112 | 268 | 92 | 79 | 47 | Comparative Example |
| 1-4 | cDP-1 | H-2 | 116 | 289 | 89 | 70 | 47 | Comparative Example |

TABLE 1-continued

| Device No. | Dopant | Host | Outside extraction quantum efficiency | Half life | Operating voltage | Rise in voltage in operation | Ageing stability | Remarks |
|---|---|---|---|---|---|---|---|---|
| 1-5 | DP-6 | H-2 | 121 | 356 | 76 | 55 | 64 | Example |
| 1-6 | DP-58 | H-2 | 122 | 378 | 75 | 53 | 66 | Example |
| 1-7 | DP-58 | H-8 | 123 | 403 | 75 | 50 | 67 | Example |
| 1-8 | DP-58 | H-12 | 126 | 436 | 73 | 46 | 69 | Example |
| 1-9 | DP-58 | H-16 | 129 | 489 | 71 | 43 | 73 | Example |
| 1-10 | DP-58 | H-18 | 133 | 545 | 69 | 39 | 75 | Example |
| 1-11 | DP-58 | H-21 | 134 | 598 | 68 | 32 | 77 | Example |
| 1-12 | DP-58 | H-25 | 140 | 634 | 67 | 27 | 80 | Example |
| 1-13 | DP-6 | H-19 | 136 | 640 | 67 | 27 | 80 | Example |
| 1-14 | DP-58 | H-19 | 137 | 653 | 66 | 29 | 78 | Example |

As apparent from the results shown in Table 1, it is clear that the organic EL devices prepared by using the dopant compounds and the host compounds in combination according to the present invention are excellent in a luminous efficiency and an emission life and are operated at a low voltage as compared with the comparative organic EL devices, and it has been found that they are inhibited from a rise in voltage in operation. Further, it has been found as well that they are excellent in an ageing stability.

《Preparation of Organic EL Device 2-1》

A substrate (NA45 manufactured by AvanStrate Inc.) prepared by depositing ITO (indium tin oxide) in a thickness of 100 nm on a glass substrate of 100 mm×100 mm×1.1 mm to form a film as an anode was subjected to patterning, and then the above transparent supporting substrate provided thereon with an ITO transparent electrode was subjected to ultrasonic cleaning in isopropyl alcohol, dried with a dry nitrogen gas and subjected to UV ozone cleaning for 5 minutes.

A solution prepared by diluting poly(3,4-ethylenedioxythiophene)-polystyrene sulfonate (PEDOT/PSS, manufactured by H.C. Starck Gmbh, CLEVIO P VPAI 4083) to 70% by water was used to form a thin film on the above transparent supporting substrate by a spin coating method on the conditions of 3000 rpm and 30 seconds, and then the film was dried at 200° C. for one hour to form a first hole-transporting layer having a film thickness of 20 nm.

The above transparent supporting substrate was fixed on a substrate holder of a commercial vacuum evaporation equipment. On the other hand, 200 mg of HT-2 as a hole-transporting material, 200 mg of cHS-2 as a host compound, 200 mg of ET-8 as an electron-transporting material and 100 mg of cDP-2 as a dopant compound were put separately in molybdenum-made resistance heating boats, and they were mounted in the vacuum evaporation equipment.

Next, the vacuum chamber was reduced in a pressure down to $4 \times 10^{-4}$ Pa, and then the foregoing heating boat containing HT-2 was heated by causing an electric current to pass, whereby HT-2 was deposited on the transparent supporting substrate at a deposition rate of 0.1 nm/second to form a second hole-transporting layer having a thickness of 20 nm.

Further, the foregoing heating boats containing cHS-2 as the host compound and cDP-2 as the dopant compound were heated by causing an electric current to pass, whereby cHS-2 and cDP-2 were co-deposited on the second hole-transporting layer described above at the deposition rates of 0.1 nm/second and 0.006 nm/second respectively to form a light-emitting layer having a thickness of 40 nm.

Further, the foregoing heating boat containing ET-8 was heated by causing an electric current to pass, whereby ET-8 was deposited on the light-emitting layer described above at a deposition rate of 0.1 nm/second to form an electron-transporting layer having a thickness of 30 nm. The substrate temperature in deposition was room temperature.

Continuously, lithium fluoride was deposited thereon to form an electron-injecting layer having a film thickness of 0.5 nm, and aluminum was further deposited thereon to form a cathode having a film thickness of 110 nm, whereby an organic EL device 2-1 was prepared.

《Preparation of Organic EL Devices 2-2 to 2-15》

Organic EL devices 2-2 to 2-15 were prepared respectively in the same manner, except that in preparing the organic EL device 2-1, the host compound and the dopant compound used in forming the light-emitting layer were changed to compounds described in Table 2.

《Evaluation of Organic EL Devices 2-1 to 2-15》

In evaluating the organic EL devices thus obtained, they were sealed in the same manner as in the organic EL devices 1-1 to 1-14 prepared in Example 1, and lighting equipments shown in FIG. 5 and FIG. 6 were prepared and evaluated.

The respective samples thus prepared were used to evaluate an outside extraction quantum efficiency, a half life, an operating voltage, a rise in voltage in operation and an ageing stability in the same manner as in Example 1. The evaluation results thereof are shown in Table 2. The measured results of the outside extraction quantum efficiency, the half life, the operating voltage, a rise in the voltage in operation and the ageing stability each shown in Table 2 were shown by relative values, wherein the measured value of the organic EL device 2-1 was set to 100.

TABLE 2

| Device No. | Dopant | Host | Outside extraction quantum efficiency | Half life | Operating voltage | Rise in voltage in operation | Ageing stability | Remarks |
|---|---|---|---|---|---|---|---|---|
| 2-1 | cDP-2 | cHS-2 | 100 | 100 | 100 | 100 | 53 | Comparative Example |
| 2-2 | DP-10 | cHS-2 | 109 | 152 | 98 | 90 | 57 | Comparative Example |

TABLE 2-continued

| Device No. | Dopant | Host | Outside extraction quantum efficiency | Half life | Operating voltage | Rise in voltage in operation | Ageing stability | Remarks |
|---|---|---|---|---|---|---|---|---|
| 2-3 | DP-57 | cHS-2 | 110 | 212 | 94 | 88 | 59 | Comparative Example |
| 2-4 | cDP-2 | H-4 | 113 | 183 | 93 | 80 | 60 | Comparative Example |
| 2-5 | DP-10 | H-4 | 120 | 312 | 80 | 69 | 75 | Example |
| 2-6 | DP-10 | H-6 | 120 | 355 | 79 | 65 | 76 | Example |
| 2-7 | DP-10 | H-11 | 121 | 399 | 77 | 59 | 77 | Example |
| 2-8 | DP-5 | H-11 | 122 | 419 | 76 | 56 | 77 | Example |
| 2-9 | DP-57 | H-11 | 126 | 456 | 76 | 52 | 78 | Example |
| 2-10 | DP-57 | H-15 | 128 | 476 | 75 | 49 | 78 | Example |
| 2-11 | DP-57 | H-36 | 131 | 534 | 73 | 44 | 79 | Example |
| 2-12 | DP-57 | H-35 | 135 | 589 | 65 | 33 | 82 | Example |
| 2-13 | DP-57 | H-30 | 141 | 645 | 70 | 41 | 81 | Example |
| 2-14 | DP-5 | H-32 | 135 | 651 | 70 | 41 | 81 | Example |
| 2-15 | DP-57 | H-32 | 137 | 667 | 68 | 37 | 83 | Example |

As apparent from the results shown in Table 2, it is clear that the organic EL devices prepared by using the dopant compounds and the host compounds in combination according to the present invention are excellent in a luminous efficiency and an emission life and are operated at a low voltage as compared with the comparative organic EL devices, and it has been found that they are inhibited from a rise in voltage in operation. Further, it has been found as well that they are excellent in an ageing stability.

Example 3

«Preparation of Organic EL Device 3-1»

A substrate (NA45 manufactured by AvanStrate Inc.) prepared by depositing ITO (indium tin oxide) in a thickness of 100 nm on a glass substrate of 100 mm×100 mm×1.1 mm to form a film as an anode was subjected to patterning, and then the above transparent supporting substrate provided thereon with an ITO transparent electrode was subjected to ultrasonic cleaning in isopropyl alcohol, dried with a dry nitrogen gas and subjected to UV ozone cleaning for 5 minutes.

A solution prepared by diluting poly(3,4-ethylenedioxy-thiophene)-polystyrene sulfonate (PEDOT/PSS, manufactured by Bayer AG, Baytron P AI4083) to 70% by purified water was used to form a thin film on the above transparent supporting substrate by a spin coating method, and then the film was dried at 200° C. for one hour to form a first hole-transporting layer having a film thickness of 30 nm.

A chlorobenzene solution of a hole-transporting material poly(N,N'-bis(4-butylphenyl)-N,N'-bis(phenyl))benzidiene (ADS-254, manufactured by American Dye Source Inc.) was used to form a thin film on the above first hole-transporting layer by a spin coating method. The film was dried at 150° C. for one hour to provide a second hole-transporting layer having a film thickness of 40 nm. A butyl acetate solution of cHS-3 as a host compound and cDP-3 as a dopant compound was used to form a thin film on the above second hole-transporting layer by a spin coating method, and then the film was dried at 120° C. for one hour to form a light-emitting layer having a film thickness of 30 nm.

A 1-butanol solution of ET-11 as an electron-transporting material was used to form a thin film on the above light-emitting layer by a spin coating method, whereby an electron-transporting layer having a film thickness of 20 nm was provided thereon.

The above substrate was mounted in a vacuum evaporation equipment, and the vacuum chamber was reduced in a pressure down to $4 \times 10^{-4}$ Pa. Then, lithium fluoride was deposited thereon to form an electron-injecting layer having a film thickness of 1.0 nm, and aluminum was deposited thereon to form a cathode having a film thickness of 110 nm, whereby an organic EL device 3-1 was prepared.

«Preparation of Organic EL Devices 3-2 to 3-12»

Organic EL devices 3-2 to 3-12 were prepared respectively in the same manner, except that in preparing the organic EL device 3-1, the host compound and the dopant compound used in forming the light-emitting layer were changed to compounds described in Table 3.

«Evaluation of Organic EL Devices 3-1 to 3-12»

In evaluating the organic EL devices thus obtained, they were sealed in the same manner as in the organic EL devices 1-1 to 1-14 prepared in Example 1, and lighting equipments shown in FIG. 5 and FIG. 6 were prepared and evaluated.

The respective samples thus prepared were used to evaluate an outside extraction quantum efficiency, a half life, an operating voltage, a rise in voltage in operation and an ageing stability in the same manner as in Example 1. The evaluation results thereof are shown in Table 3. The measured results of the outside extraction quantum efficiency, the half life, the operating voltage, a rise in the voltage in operation and the ageing stability each shown in Table 3 were shown by relative values, wherein the measured value of the organic EL device 3-1 was set to 100.

TABLE 3

| Device No. | Dopant | Host | Outside extraction quantum efficiency | Half life | Operating voltage | Rise in voltage in operation | Ageing stability | Remarks |
|---|---|---|---|---|---|---|---|---|
| 3-1 | cDP-3 | cHS-3 | 100 | 100 | 100 | 100 | 57 | Comparative Example |
| 3-2 | DP-28 | cHS-3 | 112 | 156 | 95 | 92 | 61 | Comparative Example |

TABLE 3-continued

| Device No. | Dopant | Host | Outside extraction quantum efficiency | Half life | Operating voltage | Rise in voltage in operation | Ageing stability | Remarks |
|---|---|---|---|---|---|---|---|---|
| 3-3 | DP-1 | cHS-3 | 123 | 212 | 93 | 89 | 62 | Comparative Example |
| 3-4 | cDP-3 | H-1 | 128 | 234 | 92 | 80 | 64 | Comparative Example |
| 3-5 | DP-28 | H-1 | 136 | 312 | 82 | 67 | 77 | Example |
| 3-6 | DP-28 | H-5 | 137 | 345 | 80 | 64 | 78 | Example |
| 3-7 | DP-1 | H-5 | 138 | 400 | 79 | 62 | 79 | Example |
| 3-8 | DP-1 | H-9 | 140 | 435 | 78 | 58 | 80 | Example |
| 3-9 | DP-1 | H-17 | 143 | 478 | 76 | 56 | 82 | Example |
| 3-10 | DP-1 | H-23 | 146 | 523 | 74 | 52 | 83 | Example |
| 3-11 | DP-1 | H-27 | 149 | 544 | 66 | 49 | 84 | Example |
| 3-12 | DP-1 | H-31 | 146 | 612 | 69 | 41 | 86 | Example |

As apparent from the results shown in Table 3, it is clear that the organic EL devices prepared by using the dopant compounds and the host compounds in combination according to the present invention are excellent in a luminous efficiency and an emission life and are operated at a low voltage as compared with the comparative organic EL devices, and it has been found that they are inhibited from a rise in voltage in operation. Further, it has been found as well that they are excellent in an ageing stability.

Example 4

A substrate (NA45 manufactured by AvanStrate Inc.) prepared by depositing ITO (indium tin oxide) in a thickness of 100 nm on a glass substrate of 100 mm×100 mm×1.1 mm to form a film as an anode was subjected to patterning, and then the above transparent supporting substrate provided thereon with an ITO transparent electrode was subjected to ultrasonic cleaning in isopropyl alcohol, dried with a dry nitrogen gas and subjected to UV ozone cleaning for 5 minutes.

The above transparent supporting substrate was fixed on a substrate holder of a commercial vacuum evaporation equipment. On the other hand, 200 mg of HT-31, 200 mg of HT-1, 200 mg of cHS-4, 200 mg of cDP-4, 200 mg of D-1, 200 mg of cDP-6 and 200 mg of ET-2 were put separately in molybdenum-made resistance heating boats, and they were mounted in the vacuum evaporation equipment.

Next, the vacuum chamber was reduced in a pressure down to $4 \times 10^{-4}$ Pa, and then the foregoing heating boat containing HT-31 was heated by causing an electric current to pass, whereby HT-31 was deposited on the transparent supporting substrate at a deposition rate of 0.1 nm/second to form a hole-injecting layer having a thickness of 10 nm.

Further, the foregoing heating boat containing HT-1 was heated by causing an electric current to pass, whereby HT-1 was deposited on the hole-injecting layer described above at a deposition rate of 0.1 nm/second to form a hole-transporting layer having a thickness of 20 nm.

Further, the foregoing heating boats containing cHS-4, cDP-4, D-1 and D-6 were heated by causing an electric current to pass, whereby cHS-4, cDP-4, D-1 and D-6 were co-deposited on the hole-transporting layer described above at the deposition rates of 0.1 nm/second, 0.025 nm/second, 0.0007 nm/second and 0.0002 nm/second respectively to form a light-emitting layer having a thickness of 60 nm.

Further, the foregoing heating boat containing ET-2 was heated by causing an electric current to pass, whereby ET-2 was deposited on the light-emitting layer described above at a deposition rate of 0.1 nm/second to form an electron-transporting layer having a thickness of 20 nm.

Continuously, potassium fluoride was deposited thereon as an electron-injecting layer in a thickness of 0.5 nm, and aluminum was further deposited thereon in a thickness of 110 nm to form a cathode, whereby an organic EL device 4-1 was prepared.

«Preparation of Organic EL Devices 4-2 to 4-12»

Organic EL devices 4-2 to 4-12 were prepared respectively in the same manner, except that in preparing the organic EL device 4-1, cHS-4 and cDP-4 were changed to compounds described in Table 4.

«Evaluation of Organic EL Devices 4-1 to 4-12»

In evaluating the organic EL devices thus obtained, they were sealed in the same manner as in the organic EL devices 1-1 to 1-14 prepared in Example 1, and lighting equipments shown in FIG. 5 and FIG. 6 were prepared and evaluated.

The respective samples thus prepared were used to evaluate an outside extraction quantum efficiency, a half life, an operating voltage, a rise in voltage in operating and an ageing stability in the same manner as in Example 1. The evaluation results thereof are shown in Table 4. The measured results of the outside extraction quantum efficiency, the half life, the operating voltage, a rise in the voltage in operation and the ageing stability each shown in Table 4 were shown by relative values, wherein the measured value of the organic EL device 4-1 was set to 100.

TABLE 4

| Device No. | Dopant | Host | Outside extraction quantum efficiency | Half life | Operating voltage | Rise in voltage in operation | Ageing stability | Remarks |
|---|---|---|---|---|---|---|---|---|
| 4-1 | cDP-4 | cHS-4 | 100 | 100 | 100 | 100 | 61 | Comparative Example |
| 4-2 | DP-66 | cHS-4 | 109 | 156 | 98 | 93 | 72 | Comparative Example |
| 4-3 | DP-55 | cHS-4 | 112 | 198 | 95 | 92 | 74 | Comparative Example |

TABLE 4-continued

| Device No. | Dopant | Host | Outside extraction quantum efficiency | Half life | Operating voltage | Rise in voltage in operation | Ageing stability | Remarks |
|---|---|---|---|---|---|---|---|---|
| 4-4 | cDP-4 | H-3 | 119 | 191 | 94 | 90 | 75 | Comparative Example |
| 4-5 | DP-66 | H-3 | 129 | 265 | 85 | 78 | 81 | Example |
| 4-6 | DP-55 | H-3 | 131 | 284 | 84 | 77 | 82 | Example |
| 4-7 | DP-66 | H-7 | 132 | 289 | 83 | 77 | 82 | Example |
| 4-8 | DP-55 | H-10 | 138 | 367 | 81 | 76 | 84 | Example |
| 4-9 | DP-55 | H-22 | 141 | 456 | 80 | 74 | 86 | Example |
| 4-10 | DP-55 | H-34 | 146 | 433 | 78 | 72 | 87 | Example |
| 4-11 | DP-55 | H-24 | 146 | 489 | 76 | 70 | 89 | Example |
| 4-12 | DP-55 | H-28 | 153 | 461 | 74 | 68 | 91 | Example |

As apparent from the results shown in Table 4, it is clear that the organic EL devices prepared by using the dopant compounds and the host compounds in combination according to the present invention are excellent in a luminous efficiency and an emission life and are operated at a low voltage as compared with the comparative organic EL devices, and it has been found that they are inhibited from a rise in voltage in operation. Further, it has been found as well that they are excellent in an ageing stability.

Example 5

A substrate (NA45 manufactured by AvanStrate Inc.) prepared by depositing ITO (indium tin oxide) in a thickness of 100 nm on a glass substrate of 100 mm×100 mm×1.1 mm to form a film as an anode was subjected to patterning, and then the above transparent supporting substrate provided thereon with an ITO transparent electrode was subjected to ultrasonic cleaning in isopropyl alcohol, dried with a dry nitrogen gas and subjected to UV ozone cleaning for 5 minutes.

A solution prepared by diluting poly(3,4-ethylenedioxythiophene)-polystyrene sulfonate (PEDOT/PSS, manufactured by Bayer AG, Baytron P A1 4083) to 70% by purified water was used to form a thin film on the above transparent supporting substrate by a spin coating method on the conditions of 3000 rpm and 30 seconds, and then the film was dried at 200° C. for one hour to form a first hole-transporting layer having a film thickness of 20 nm.

The above substrate was put in nitrogen atmosphere, and a solution prepared by dissolving 47 mg of HT-44 and 3 mg of HT-45 in 10 ml of toluene was used to form a thin film on the first hole-transporting layer described above by a spin coating method on the conditions of 1500 rpm and 30 seconds. The thin film was irradiated with a UV ray at 120° C. for 90 seconds and subjected to photopolymerization and cross-linking, and it was further dried under vacuum at 60° C. for one hour to form a second hole-transporting layer having a film thickness of about 20 nm.

A solution prepared by dissolving 100 mg of cHS-5, 20 mg of cPD-5, 0.5 mg of D-4 and 0.2 mg of D-10 in 10 ml of butyl acetate was used to form a thin film on the above second hole-transporting layer by a spin coating method on the conditions of 600 rpm and 30 seconds. The thin film was further dried at 60° C. for one hour under vacuum to form a light-emitting layer having a film thickness of about 70 nm.

Next, a solution prepared by dissolving 50 mg of ET-13 in 10 ml of hexafluoroisopropanol (HFIP) was used to form a thin film on the above light-emitting layer by a spin coating method on the conditions of 1500 rpm and 30 seconds. The thin film was further dried at 60° C. for one hour under vacuum to form an electron-transporting layer having a film thickness of about 20 nm.

Subsequently, the above substrate was fixed on a substrate holder of a vacuum evaporation equipment, and the vacuum chamber was reduced in a pressure down to $4\times10^{-4}$ Pa. Then, potassium fluoride was deposited thereon as an electron-injecting layer in a thickness of 0.4 nm, and aluminum was further deposited thereon in a thickness of 110 nm to form a cathode, whereby an organic EL device 5-1 was prepared.

《Preparation of Organic EL Devices 5-2 to 5-13》

Organic EL devices 5-2 to 5-13 were prepared respectively in the same manner, except that in preparing the organic EL device 5-1, cHS-5 and cDP-5 were changed to compounds described in Table 5.

《Evaluation of Organic EL Devices 5-1 to 5-13》

In evaluating the organic EL devices thus obtained, they were sealed in the same manner as in the organic EL devices 1-1 to 1-14 prepared in Example 1, and lighting equipments shown in FIG. 5 and FIG. 6 were prepared and evaluated.

The respective samples thus prepared were used to evaluate an outside extraction quantum efficiency, a half life, an operating voltage, a rise in voltage in operating and an ageing stability in the same manner as in Example 1. The evaluation results thereof are shown in Table 5. The measured results of the outside extraction quantum efficiency, the half life, the operating voltage, a rise in the voltage in operation and the ageing stability each shown in Table 5 were shown by relative values, wherein the measured value of the organic EL device 5-1 was set to 100.

TABLE 5

| Device No. | Dopant | Host | Outside extraction quantum efficiency | Half life | Operating voltage | Rise in voltage in operation | Ageing stability | Remarks |
|---|---|---|---|---|---|---|---|---|
| 5-1 | cDP-5 | cHS-5 | 100 | 100 | 100 | 100 | 55 | Comparative Example |
| 5-2 | DP-42 | cHS-5 | 110 | 162 | 93 | 95 | 61 | Comparative Example |

TABLE 5-continued

| Device No. | Dopant | Host | Outside extraction quantum efficiency | Half life | Operating voltage | Rise in voltage in operation | Ageing stability | Remarks |
|---|---|---|---|---|---|---|---|---|
| 5-3 | DP-83 | cHS-5 | 113 | 202 | 91 | 92 | 63 | Comparative Example |
| 5-4 | cDP-5 | H-8 | 117 | 198 | 90 | 90 | 64 | Comparative Example |
| 5-5 | DP-42 | H-8 | 125 | 278 | 84 | 82 | 77 | Example |
| 5-6 | DP-83 | H-8 | 129 | 346 | 83 | 80 | 79 | Example |
| 5-7 | DP-42 | H-13 | 127 | 322 | 83 | 80 | 78 | Example |
| 5-8 | DP-42 | H-14 | 130 | 344 | 82 | 79 | 80 | Example |
| 5-9 | DP-83 | H-14 | 134 | 402 | 81 | 77 | 83 | Example |
| 5-10 | DP-83 | H-20 | 138 | 489 | 76 | 76 | 84 | Example |
| 5-11 | DP-83 | H-33 | 144 | 432 | 74 | 74 | 86 | Example |
| 5-12 | DP-83 | H-26 | 145 | 556 | 72 | 72 | 89 | Example |
| 5-13 | DP-83 | H-29 | 152 | 498 | 69 | 68 | 91 | Example |

As apparent from the results shown in Table 5, it is clear that the organic EL devices prepared by using the dopant compounds and the host compounds in combination according to the present invention are excellent in a luminous efficiency and an emission life and are operated at a low voltage as compared with the comparative organic EL devices, and it has been found that they are inhibited from a rise in voltage in operation. Further, it has been found as well that they are excellent in an ageing stability.

Example 6

A substrate (NA45 manufactured by AvanStrate Inc.) prepared by depositing ITO (indium tin oxide) in a thickness of 100 nm on a glass substrate of 100 mm×100 mm×1.1 mm to form a film as an anode was subjected to patterning, and then the above transparent supporting substrate provided thereon with an ITO transparent electrode was subjected to ultrasonic cleaning in isopropyl alcohol, dried with a dry nitrogen gas and subjected to UV ozone cleaning for 5 minutes.

The above transparent supporting substrate was fixed on a substrate holder of a commercial vacuum evaporation equipment. On the other hand, 200 mg of HT-30, 200 mg of HT-36, 200 mg of H-29, 200 mg of DP-55, 200 mg of cHS-6, 200 mg of D-1, 200 mg of D-6 and 200 mg of ET-11 were put separately in molybdenum-made resistance heating boats, and they were mounted in the vacuum evaporation equipment.

Next, the vacuum chamber was reduced in a pressure down to $4\times10^{-4}$ Pa, and then the foregoing heating boat containing HT-30 was heated by causing an electric current to pass, whereby HT-30 was deposited on the transparent supporting substrate at a deposition rate of 0.1 nm/second to form a hole-injecting layer having a thickness of 10 nm.

Further, the foregoing heating boat containing HT-36 was heated by causing an electric current to pass, whereby HT-36 was deposited on the hole-injecting layer described above at a deposition rate of 0.1 nm/second to form a hole-transporting layer having a thickness of 20 nm.

Further, the foregoing heating boats containing H-29 and DP-55 were heated by causing an electric current to pass, whereby H-29 and DP-55 each were co-deposited on the hole-transporting layer described above at the deposition rates of 0.1 nm/second and 0.012 nm/second respectively to form a first light-emitting layer having a thickness of 60 nm.

Further, the foregoing heating boats containing cHS-6, D-1 and D-6 were heated by causing an electric current to pass, whereby cHS-6, D-1 and D-6 were co-deposited on the first light-emitting layer described above at the deposition rates of 0.1 nm/second, 0.012 nm/second and 0.002 nm/second respectively to form a second light-emitting layer having a thickness of 60 nm.

Further, the foregoing heating boat containing ET-11 was heated by causing an electric current to pass, whereby ET-11 was deposited on the second light-emitting layer described above at a deposition rate of 0.1 nm/second to form an electron-transporting layer having a thickness of 125 nm.

Continuously, potassium fluoride was deposited as an electron-injecting layer in a thickness of 0.5 nm, and aluminum was further deposited thereon in a thickness of 110 nm to form a cathode, whereby an organic EL device was prepared. The organic EL device thus prepared was used to emit a white light by applying a voltage to the respective electrodes thereof, and it was found that the above device could be used as a lighting equipment. It was found that lighting equipments prepared by replacing the above compounds by other compounds shown as the examples emitted as well a white light.

Example 7

«Preparation of Organic EL Full Color Display Device»

FIG. 7 is a schematic drawing of an organic EL full color display device.

A substrate (NA45 manufactured by AvanStrate Inc.) prepared by forming an ITO transparent electrode 202 as an anode in the form of a film having a thickness of 100 nm on a glass substrate 201 was subjected to patterning at a pitch of 100 μm (refer to FIG. 7 (a)), and then bulkheads 203 (width: 20 μm, thickness: 2.0 μm) of non-light-sensitive polyimide were formed between the ITO transparent electrodes 202 on the above glass substrate 201 by photolithography (refer to FIG. 7 (b)).

A hole-injecting layer composition having the following composition was discharged and injected between the bulkheads 203 on the ITO electrode by means of an ink jet head (MJ800C, manufactured by Seiko Epson Corp.), and the composition was irradiated with a UV ray for 20 seconds and subjected to drying treatment at 60° C. for 10 minutes to thereby provide a hole-injecting layer 204 having a thickness of 40 nm (refer to FIG. 7 (c)).

A blue light-emitting layer composition, a green light-emitting layer composition and a red light-emitting layer composition each having the following composition were discharged and injected respectively on the above hole-injecting layer 204 in the same manner by means of an ink jet head, and the compositions were subjected to drying treatment at 60° C. for 10 minutes to thereby provide light-emitting layers 205B, 205G and 205R of the respective colors (refer to FIG. 7 (d)).

Next, an electron-transporting material was deposited so that the respective light-emitting layers 205B, 205G and 205R were covered to thereby provide an electron-transporting layer having a film thickness of 20 nm (abbreviated to illustrate). Further, lithium fluoride was deposited to provide an electron-injecting layer having a film thickness of 0.6 nm (abbreviated to illustrate), and Al was deposited to provide a cathode 206 having a film thickness of 130 nm, whereby an organic EL device was prepared (refer to FIG. 7 (e)).

The organic EL device thus prepared emitted lights of a blue color, a green color and a red color by applying a voltage to the respective electrodes thereof, and it was found that they could be used as a full color display device.

Hole-Injecting Layer Composition:
  HT-44: 20 parts by mass
  Cyclohexylbenzene: 50 parts by mass
  Isopropylbiphenyl: 50 parts by mass
Blue Light-Emitting Layer Composition:
  H-24: 0.7 part by mass
  DP-55: 0.04 part by mass
  Cyclohexylbenzene: 50 parts by mass
  Isopropylbiphenyl: 50 parts by mass
Green Light-Emitting Layer Composition:
  H-24: 0.7 part by mass
  D-1: 0.04 part by mass
  Cyclohexylbenzene: 50 parts by mass
  Isopropylbiphenyl: 50 parts by mass
Red Light-Emitting Layer Composition:
  H-24: 0.7 part by mass
  D-10: 0.04 part by mass
  Cyclohexylbenzene: 50 parts by mass
  Isopropylbiphenyl: 50 parts by mass As described above, according to the present invention, capable of being provided are an organic electroluminescence device which has a high luminous efficiency, a low operating voltage and a long life and which is low in a voltage rise in operation and excellent in an ageing stability, and a lighting equipment and a display device which are prepared by using the same.

Also, an organic electroluminescence device having the effects described above can be produced by a wet process.

What is claimed is:

1. An organic electroluminescence device in which organic layers including at least a light-emitting layer are interposed between an anode and a cathode, wherein at least one layer of the organic layers contains a blue phosphorescent organic metal complex having a structure represented by the following Formula (1) and a compound represented by the following Formula (H1):

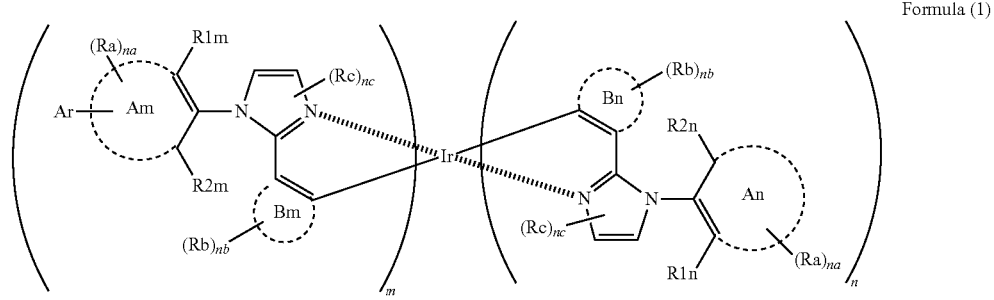

Formula (1)

wherein m represents an integer of 1 to 2, and n represents an integer of 1 to 2; and m+n is 3; a ring Am, a ring An, a ring Bm and a ring Bn represent a five-membered or six-membered aromatic hydrocarbon ring or aromatic heterocycle; Ar represents an aromatic hydrocarbon ring or an aromatic heterocycle; R1m, R2m, R1n and R2n each represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4; and

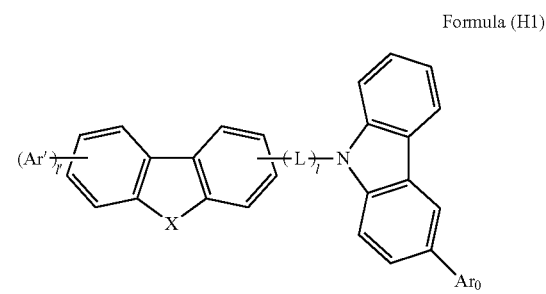

Formula (H1)

wherein X represents an oxygen atom or a sulfur atom; L represents a single bond or a linkage group derived from an aromatic hydrocarbon ring or an aromatic heterocycle; Ar0 and Ar' each represent independently an aromatic hydrocarbon ring or an aromatic heterocycle; l represents an integer of 0 to 3, and l' represents an integer of 0 to 4, wherein in Formula (H1), l is 0, wherein Formula (H1) is represented by the following Formula (H2):

Formula (H2)

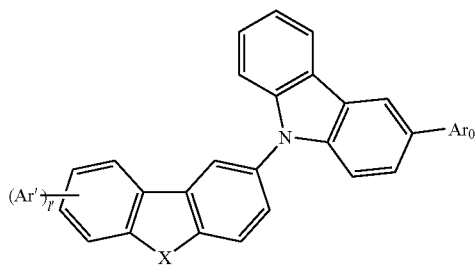

wherein X represents an oxygen atom or a sulfur atom; Aro and Ar' each represent independently an aromatic hydrocarbon ring or an aromatic heterocycle; and l' represents an integer of 0 to 4,
wherein in Formula (H2), l' is 1,
wherein Formula (H2) is represented by the following Formula (H3):

Formula (H3)

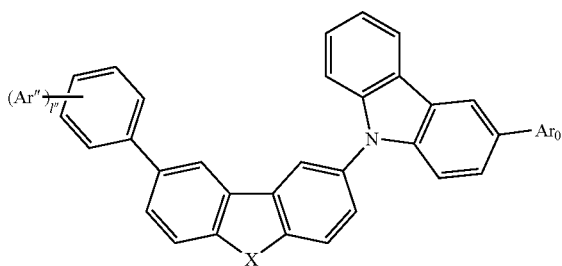

wherein X represents an oxygen atom or a sulfur atom; Aro and Ar" each represent independently an aromatic hydrocarbon ring or an aromatic heterocycle; and l" represents an integer of 0 to 5.

2. The organic electroluminescence device as described in claim 1, wherein all of R1m, R2m, R1n and 2n are an alkyl group or a cycloalkyl group having 2 or more carbon atoms.

3. The organic electroluminescence device as described in claim 1, wherein all of R1m, R2m, R1n and 2n are a branched alkyl group having 3 or more carbon atoms.

4. The organic electroluminescence device as described in claim 1, wherein in Formula (1), m is 2, and n is 1.

5. The organic electroluminescence device as described in claim 1, wherein the ring Bm and the ring Bn in Formula (1) are a benzene ring.

6. The organic electroluminescence device as described claim 1, wherein Ar in Formula (1) is a benzene ring.

7. The organic electroluminescence device as described in claim 1, wherein Formula (1) is represented by the following Formula (2):

Formula (2)

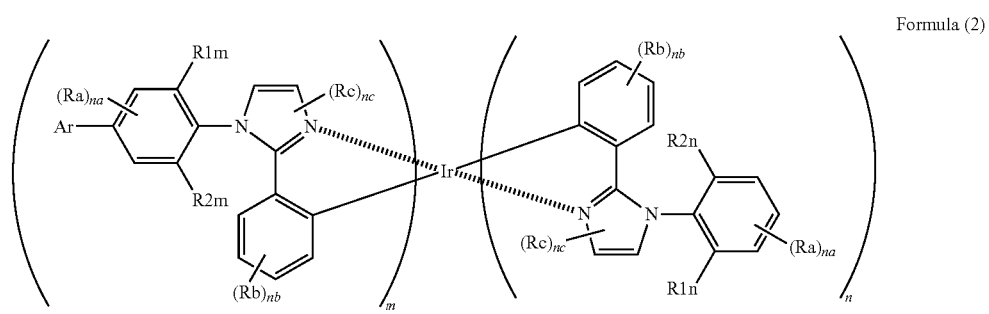

wherein m represents an integer of 1 to 2, and n represents an integer of 1 to 2; and m+n is 3; Ar represents an aromatic hydrocarbon ring or an aromatic heterocycle; R1m, R2m, R1n and R2n each represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represent independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4.

8. The organic electroluminescence device as described in claim 1, wherein a luminescent color is white.

9. A lighting equipment comprising the organic electroluminescence device as described in claim 1.

10. A display device comprising the organic electroluminescence device as described in claim 1.

11. The organic electroluminescence device as described in claim 1, wherein in Formula (1), Ar represents an aromatic hydrocarbon ring or an aromatic heterocycle selected from a benzene ring, a biphenyl ring, a naphthalene ring, an azulene ring, an anthracene ring, a phenanthrene ring, a chrysene ring, a naphthacene ring, a triphenylene ring, an o-terphenyl ring, a m-terphenyl ring, a p-terphenyl ring, an acenaphthene ring, a coronene ring, a fluorene ring, a fluoranthrene ring, a naphthacene ring, a pentacene ring, a perylene ring, a pentaphene ring, a picene ring, a pyrene ring, a pyranthrene ring, an anthranthrene ring, a silole ring, a furan ring, a thiophene ring, an oxazole ring, a pyrrole ring, a pyridine ring, a pyridazine ring, a pyrimidine ring, a pyrazine ring, a triazine ring, an oxadiazole ring, a triazole ring, an imidazole ring, a pyrazole ring, a thiazole ring, an indole ring, a benzimidazole ring, a benzthiazole ring, a benzoxazole ring, a quinoxaline ring, a quinazoline ring, a phthalazine ring, a thienothiophene ring, a carbazole ring, an azacarbazole ring (represents a ring obtained by substituting at least one of optional carbon atoms constituting a carbazole ring with a nitrogen atom), a dibenzosilole ring, a dibenzofuran ring, a dibenzothiophene ring, rings obtained by substituting at least one of optional carbon atoms constituting a benzothiophene ring and a benzofuran ring with a nitrogen atom, a benzodifuran ring, a benzodithiophene ring, an acridine ring, a benzoquinoline ring, a phenazine ring, a phenanzhridine ring, a phenanthroline ring, a cyclazine ring, a quindoline ring, a tepenidine ring, a quinindoline ring, a triphenodithiazine ring, a triphenodioxazine ring, a phenanthrazine ring, an anthrazine ring, a perimidine ring, a naphthofuran ring, a naphthothiophene ring, a naphthodifuran ring, a naphthodithiophene ring, an anthrafuran ring, an anthradifuran ring, an anthrathiophene ring, an anthradithiophene ring, a thianthrene ring, a phenoxatiin ring, a dibenzocarbazole ring, an indolocarbazole ring, a dithienobenzene ring, or an indoloindole ring.

12. The organic electroluminescence device as described in claim 1, wherein in Formula (H1), Aro represents an aromatic hydrocarbon ring or an aromatic heterocycle selected from a benzene ring, a carbazole ring, a dibenzofuran ring, a dibenzothiophene ring, a pyridine ring, a pyrazine ring, or a triazine ring.

13. The organic electroluminescence device as described in claim 1, wherein in Formula (H1), Aro represents an aromatic hydrocarbon ring or an aromatic heterocycle selected from a benzene ring, a carbazole ring, a dibenzofuran ring, or a dibenzothiophene ring.

14. An organic electroluminescence device in which organic layers including at least a light-emitting layer are interposed between an anode and a cathode, wherein at least one layer of the organic layers contains a blue phosphorescent organic metal complex having a structure represented by the following Formula (1-1) and a compound represented by the following Formula (H1-1):

wherein m represents an integer of 3, and n represents an integer of 0; a ring Am and a ring Bm each represents a five-membered or six-membered aromatic hydrocarbon ring or an aromatic heterocycle; Ar represents an aromatic hydrocarbon ring or an aromatic heterocycle; R1m and R2m represent independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represents independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4; and Formula (H1-1)

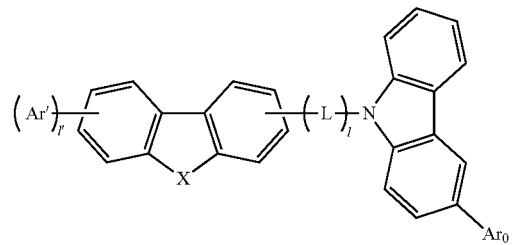

wherein X represents an oxygen atom or a sulfur atom; L represents a single bond or a linkage group derived from an aromatic hydrocarbon ring or an aromatic heterocycle; Aro represents an aromatic hydrocarbon ring or an aromatic heterocycle; Ar' represents an aromatic hydrocarbon ring; l represents an integer of 0 or 1, and l' represents an integer of 0 to 4, wherein in Formula (H1-1), l is 0, wherein Formula (H1-1) is represented by the following Formula (H2-1):

Formula (1-1)

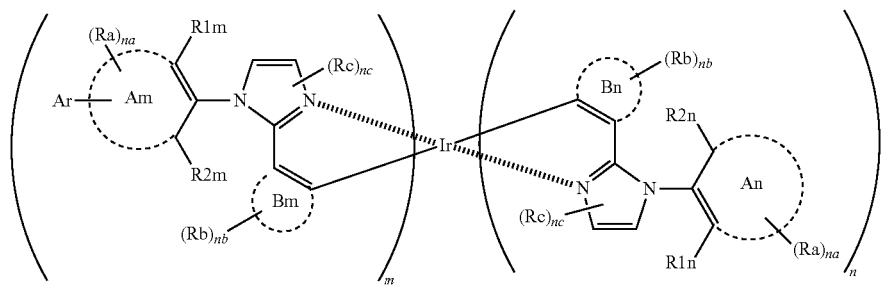

Formula (H2-1)

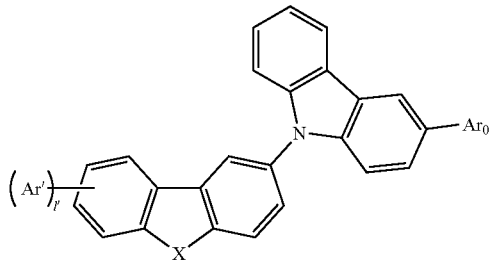

wherein X represents an oxygen atom or a sulfur atom; Aro represents an aromatic hydrocarbon ring or an aromatic heterocycle; Ar' represents an aromatic hydrocarbon ring; and l' represents an integer of 0 to 4, wherein in Formula (H2-1), l' is 1,
wherein Formula (H2-1) is represented by the following Formula (H3-1):

Formula (H3-1)

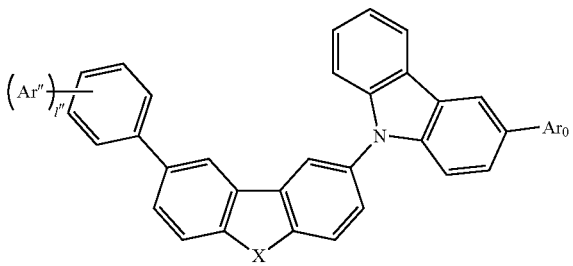

wherein X represents an oxygen atom or a sulfur atom; Aro and Ar" each represents independently an aromatic hydrocarbon ring or an aromatic heterocycle; and l" represents an integer of 0 to 5.

15. The organic electroluminescence device as described in claim 14, wherein R1m and R2m are an alkyl group or a cycloalkyl group having 2 or more carbon atoms.

16. The organic electroluminescence device as described in claim 14, wherein R1m and R2m are a branched alkyl group having 3 or more carbon atoms.

17. The organic electroluminescence device as described in claim 14, wherein the ring Bm in Formula (1-1) is a benzene ring.

18. The organic electroluminescence device as described claim 14, wherein Ar in Formula (1-1) is a benzene ring.

19. The organic electroluminescence device as described in claim 14, wherein Formula (1-1) is represented by the following Formula (2-1):

Formula (2-1)

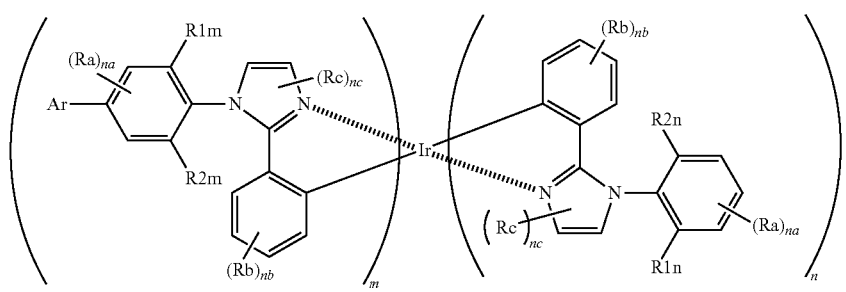

wherein m represents an integer of 3, and n represents an integer of 0; Ar represents an aromatic hydrocarbon ring, or an aromatic heterocycle; R1m and R2m each represents independently an alkyl group having 2 or more carbon atoms, an aromatic hydrocarbon ring group, an aromatic heterocyclic group, a non-aromatic hydrocarbon ring group or a non-aromatic heterocyclic group, and they may have substituents; Ra, Rb and Rc each represents independently a hydrogen atom, a halogen atom, a cyano group, an alkyl group, an alkenyl group, an alkynyl group, an alkoxy group, an amino group, a silyl group, an arylalkyl group, an aryl group, a heteroaryl group, a non-aromatic hydrocarbon ring group or a non-aromatic heterocyclic group, and they may have substituents; Ra may form a ring with Ar; na and nc represent 1 or 2, and nb represents an integer of 1 to 4.

20. The organic electroluminescence device as described in claim 14, wherein in Formula (H1-1), Aro represents an aromatic hydrocarbon ring or an aromatic heterocycle selected from a benzene ring, a carbazole ring, a dibenzofuran ring, a dibenzothiophene ring, a pyridine ring, a pyrazine ring, or a triazine ring.

21. The organic electroluminescence device as described in claim 14, wherein in Formula (H1-1), Aro represents an aromatic hydrocarbon ring or an aromatic heterocycle selected from a benzene ring, a carbazole ring, a dibenzofuran ring, a dibenzothiophene ring.

22. The organic electroluminescence device as described in claim 1, wherein in Formula (1), m is 1, and n is 2.

23. The organic electroluminescence device as described in claim 1, wherein in Formula (H3), l" represents an integer of 1 to 5.

24. The organic electroluminescence device as described in claim 1, wherein in Formula (1), R1m, R2m, R1n and R2n each represents independently a non-aromatic hydrocarbon ring or a non-aromatic heterocycle and may have substituents.

25. The organic electroluminescence device as described in claim 14, wherein in Formula (H3-1), l" represents an integer of 1 to 5.

26. The organic electroluminescence device as described in claim 14, wherein in Formula (1-1), R1m and R2m each represents independently a non-aromatic hydrocarbon ring or a non-aromatic heterocycle and may have substituents.

* * * * *